(12) United States Patent
Kando

(10) Patent No.: US 7,355,319 B2
(45) Date of Patent: Apr. 8, 2008

(54) BOUNDARY ACOUSTIC WAVE DEVICE

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/597,115

(22) PCT Filed: Dec. 27, 2004

(86) PCT No.: PCT/JP2004/019551

§ 371 (c)(1),
(2), (4) Date: Jul. 12, 2006

(87) PCT Pub. No.: WO2005/069485

PCT Pub. Date: Jul. 28, 2005

(65) Prior Publication Data

US 2007/0007852 A1    Jan. 11, 2007

(30) Foreign Application Priority Data

Jan. 13, 2004    (JP) .............................. 2004-005976

(51) Int. Cl.
*H03H 9/25* (2006.01)
(52) U.S. Cl. .............................................. 310/313 A
(58) Field of Classification Search ............ 310/313 R, 310/313 A; 333/187, 193–195
See application file for complete search history.

(56) References Cited

U.S. PATENT DOCUMENTS 5,854,527 A * 12/1998 Shimizu et al. ......... 310/313 A
6,163,099 A * 12/2000 Kadota et al. .......... 310/313 A
6,833,774 B2 * 12/2004 Abbott et al. ............. 333/193
2004/0130239 A1 * 7/2004 Kando et al. ........... 310/313 R
2007/0085629 A1 * 4/2007 Kando ..................... 333/167
2007/0096592 A1 * 5/2007 Kadota et al. .......... 310/313 A

FOREIGN PATENT DOCUMENTS

| JP | 58175315 A | * 10/1983 |
| JP | 8316781 | * 11/1996 |
| JP | 09-107264 A | 4/1997 |
| JP | WO-973368 A1 | * 9/1997 |
| JP | 10-233647 A | 9/1998 |
| JP | 10-247835 A | 9/1998 |
| JP | 2003-114592 A1 | 4/2003 |
| JP | 2007-036344 | * 2/2007 |
| WO | 98/51011 A1 | 11/1998 |
| WO | 2004/095699 A1 | 11/2004 |

OTHER PUBLICATIONS

International Search Report issued in the corresponding International Application No. PCT/JP2004/019551, mailed on May 17, 2005.

(Continued)

*Primary Examiner*—Thomas M. Dougherty
(74) *Attorney, Agent, or Firm*—Keating & Bennett, LLP

(57) ABSTRACT

A dielectric substance is laminated on one surface of a piezoelectric substance, and an IDT and reflectors are disposed as electrodes at a boundary between the piezoelectric substance and the dielectric substance, and the thickness of the electrodes is determined so that the acoustic velocity of the Stoneley wave is decreased less than that of a slow transverse wave propagating through the dielectric substance and that of a slow transverse wave propagating through the piezoelectric substance, thereby forming a boundary acoustic wave device.

4 Claims, 123 Drawing Sheets

OTHER PUBLICATIONS

Chujo et al., "Piezoelectric Boundary Wave in a Substrate with a Layered Structure," Research Institute of Electrical Communication, 1980, pp. 21-28.

Shimizu, "SAW Propagation Characteristics on LiTaO3 With Arbitrary Cut," Tokyo Institute of Technology, Tokyo, 1980, pp. 140-145, vol. 36, No. 3.

Shibayama, "Acoustic Wave Device Technology Handbook," The 150th Committee on Acoustic Wave Device Technology, Japan Society for the Promotion of Science, Nov. 30, 1991, p. 549.

Campbell et al., "A Method for Estimating Optimal Crystal Cuts and Propagation Directions for Excitation of Piezoelectric Surface Waves," IEEE Transactions on Sonics and Ultrasonics, Oct. 1968, pp. 209-217, vol. SU-15, No. 4.

Yamanouchi et al., "Piezoelectric Acoustic Boundary Waves Propagating Along the Interface Between SiO2 and LiTaO3," IEEE Transactions on Sonics and Ultrasonics, Nov. 1978, pp. 384-389, vol. SU-25, No. 6.

Shibayama, "Engineering of Surface Acoustic Wave," Institute of Electronics and Communication Engineers of Japan, Nov. 15, 1983, pp. 56-58.

* cited by examiner

BOUNDARY ACOUSTIC WAVE DEVICE

BACKGROUND OF THE INVENTION

1. Field of the Invention

The present invention relates to a boundary acoustic wave device using a Stoneley wave, and more particularly, to a boundary acoustic wave device using a Stoneley wave and including electrodes that are disposed at a boundary between a piezoelectric substance and a dielectric substance.

2. Description of the Related Art

Heretofore, various surface acoustic wave devices have been used for RF and IF filters in mobile phones, resonators in VCOs, VIF filters in televisions, and other devices. Surface acoustic wave devices use a surface acoustic wave, such as a Rayleigh wave or a first leaky wave, which propagates along a surface of a medium.

Since the acoustic wave propagating along a surface of a medium, a surface acoustic wave is sensitive to changes in the surface condition of the medium. Accordingly, in order to protect a surface of a medium along which a surface acoustic wave propagates, a surface acoustic wave element is often hermetically sealed in a package in which a cavity portion is provided so as to face the wave-propagating surface. Since the package having a cavity portion as described above is used, the cost of the surface acoustic wave device is increased. In addition, since the size of the package is much larger than that of the surface acoustic wave element, the size of the surface acoustic wave device is increased.

On the other hand, among acoustic waves, in addition to the above-described surface acoustic waves, a boundary acoustic wave propagates along a boundary between solid substances.

For example, in "Piezoelectric Acoustic Boundary Waves Propagating Along the Interface Between $SiO_2$ and $LiTaO_3$" IEEE Trans. Sonics and Ultrasonics, VOL. SU-25, No. 6, 1978 IEEE (non-patent document 1), a boundary acoustic wave device is disclosed in which an IDT is disposed on a 126° rotated Y plate X-propagation $LiTaO_3$ substrate and a $SiO_2$ film having a predetermined thickness is disposed on the $LiTaO_3$ substrate and the IDT. In non-patent document 1, an SV+P type boundary acoustic wave, which is a so-called Stoneley wave, is propagated. In non-patent document 1, when the thickness of the above $SiO_2$ film is set to $1.0\lambda$ ($\lambda$ indicates the wavelength of a boundary acoustic wave), an electromechanical coefficient of 2% is obtained.

The boundary acoustic wave propagates in the state in which energy is concentrated on a boundary portion between solid substrates. Hence, since energy is not substantially present on the bottom surface of the above $LiTaO_3$ substrate and the surface of the $SiO_2$ film, the properties are not changed by changes in surface conditions of the substrate and the thin film.

Accordingly, a package having a cavity portion is not required, and hence the size of the boundary acoustic wave device is reduced.

In addition, in "Piezoelectric Boundary Wave in a Substrate with a Layered Structure" authored by Chujo, Yamanouchi, and Shibayama, Research Institute of Electrical Communication, US80-4, 1980 (non-patent document 2), a boundary acoustic wave called a Stoneley wave is disclosed which propagates in the structure in which a $SiO_2$ film is disposed on a 128° rotated Y plate X-propagation $LiNbO_3$ substrate. According to the analysis of the non-patent document 2, it is shown that when the $SiO_2$ is in its natural state, since the displacement is not concentrated on the boundary between the $SiO_2$ layer and the $LiNbO_3$ substrate, a boundary acoustic wave is not generated, and that when the Lame constant indicating the elasticity of $SiO_2$ is changed from an inherent value of $0.3119\times10^{11}$ $N/m^2$ to $0.4679\times10^{11}$ $N/m^2$, the displacement is concentrated on the boundary, such that a boundary acoustic wave is generated. In addition, according to the experimental result of the non-patent document 2, it has also been disclosed that even when conditions for forming the $SiO_2$ layer are changed, a $SiO_2$ film cannot be formed in which a boundary acoustic wave propagates.

In a boundary acoustic wave device, a large electromechanical coefficient, a small propagation loss, a small power flow angle, and a small temperature coefficient of frequency have been required. The loss caused by the propagation of a boundary acoustic wave, that is, the propagation loss, may degrade the insertion loss of a boundary acoustic wave filter or may also degrade the resonant resistance or the impedance ratio of a boundary acoustic wave resonator, the impedance ratio being a ratio between the impedance at a resonant frequency and that at an antiresonant frequency. Hence, the propagation loss is preferably decreased to as small as possible.

The power flow angle is an angle indicating the difference between the direction of the phase velocity of a boundary acoustic wave and the direction of the group velocity of energy thereof. When the power flow angle is large, it is necessary to obliquely dispose an IDT in conformity with the power flow angle. Hence, the design of the electrodes is complicated. In addition, a loss caused by a deviation in the angle is likely to be generated.

Furthermore, when an operating frequency of a boundary acoustic wave device is changed by the temperature, practical pass band and stop band are decreased in a boundary acoustic wave filter. With a resonator, when an oscillation circuit is formed, the above-described change in operating frequency caused by the temperature results in abnormal oscillation. Hence, the change in frequency per degree centigrade, which is TCF, is preferably decreased to as small as possible.

For example, when reflectors are disposed along a propagation direction and outside a region in which a transmitting IDT and a receiving IDT are provided, which transmits and receives a boundary acoustic wave, respectively, a low-loss resonator type filter can be formed. The band width of this resonator type filter depends on the electromechanical coefficient of a boundary acoustic wave. When the electromechanical coefficient $k^2$ is large, a broadband filter is obtained, and when the electromechanical coefficient $k^2$ is small, a narrowband filter is obtained. Thus, the electromechanical coefficient $k^2$ of a boundary acoustic wave used for a boundary acoustic wave device must be appropriately determined in accordance with its application. When an RF filter for mobile phones is formed, the electromechanical coefficient $k^2$ is required to be at least 5%.

However, in the boundary acoustic wave device using a Stoneley wave, which is disclosed in non-patent document 1, the electromechanical coefficient $k^2$ is small, such as 2%.

In addition, in the $SiO_2/LiNbO_3$ structure disclosed in the non-patent document 2, a $LiNbO_3$ substrate having large piezoelectric properties is used. Hence, compared to the boundary acoustic wave device described in the non-patent document 1, a larger electromechanical coefficient $k^2$ can be obtained. However, it is difficult to form a $SiO_2$ film such that a boundary acoustic wave propagates, and the non-patent document 2 discloses no measurement results of a Stoneley wave after actually forming the $SiO_2$ film.

SUMMARY OF THE INVENTION

To overcome the problems described above, preferred embodiments of the present invention provide a boundary acoustic wave device using a Stoneley wave which has a sufficiently large electromechanical coefficient, small propagation loss, small power flow angle, and a small temperature coefficient of frequency, and which can be manufactured by a simple method.

In accordance with a first preferred embodiment of the present invention, a boundary acoustic wave device using a Stoneley wave includes a piezoelectric substance, a dielectric substance laminated on one surface of the piezoelectric substance, and electrodes provided at a boundary between the piezoelectric substance and the dielectric substance. In the boundary acoustic wave device according to this preferred embodiment, the thickness of the electrodes is determined such that the acoustic velocity of the Stoneley wave is less than that of a slow transverse wave propagating through the dielectric substance and that of a slow transverse wave propagating through the piezoelectric substance.

In accordance with a second preferred embodiment of the present invention, a boundary acoustic wave device using a Stoneley wave includes a piezoelectric substance, a dielectric substance laminated on one surface of the piezoelectric substance, and electrodes provided at a boundary between the piezoelectric substance and the dielectric substance. In the boundary acoustic wave device according to this preferred embodiment, the duty ratio of strips defining the electrodes is determined such that the acoustic velocity of the Stoneley wave is less than that of a slow transverse wave propagating through the dielectric substance and that of a slow transverse wave propagating through the piezoelectric substance.

In accordance with a third preferred embodiment of the present invention, a boundary acoustic wave device using a Stoneley wave includes a piezoelectric substance primarily including $LiNbO_3$, a dielectric substance laminated on one surface of the piezoelectric substance, and electrodes provided at a boundary between the piezoelectric substance and the dielectric substance. In the boundary acoustic wave device according to this preferred embodiment, Euler angles ($\phi$, $\theta$, $\psi$) of the piezoelectric substance primarily including $LiNbO_3$ are in the respective ranges shown in the following Table 1, and a Stoneley wave having an acoustic velocity of 3,757 m/sec or less is used.

TABLE 1

| $\phi$ (°) | $\theta$ (°) | $\psi$ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |

TABLE 1-continued

| $\phi$ (°) | $\theta$ (°) | $\psi$ (°) |
|---|---|---|
| 330 | 90 | 135 |
| 330 | 90 | 315 |
| 330 | 270 | 45 |
| 330 | 270 | 225 |

In the second and the third preferred embodiments of the present invention, the thickness of the electrodes is preferably determined such that the acoustic velocity of the Stoneley wave is less than that of the slow transverse wave propagating through the dielectric substance and that of the slow transverse wave propagating through the piezoelectric substance.

In the boundary acoustic wave device according to the third preferred embodiment of the present Invention, the duty ratio of strips forming the electrodes is preferably determined such that the acoustic velocity of the Stoneley wave is less than that of a slow transverse wave propagating through the dielectric substance and that of a slow transverse wave propagating through the piezoelectric substance.

In accordance with a fourth preferred embodiment of the present invention, a boundary acoustic wave device using a Stoneley wave includes a piezoelectric substance primarily including $LiNbO_3$, a dielectric substance laminated on one surface of the piezoelectric substance, and electrodes provided at a boundary between the piezoelectric substance and the dielectric substance. In the boundary acoustic wave device described above, when the density of the electrodes, the thickness thereof, and the wavelength of the Stoneley wave are represented by $\rho$ (kg/m$^3$), H ($\lambda$) and $\lambda$, respectively, $H>1/[1/(3\times10^7\times\rho^{-2.22}+0.017)-0.4]$ is maintained.

In the fourth preferred embodiment of the present invention, the density $\rho$ of the electrodes is preferably set to 4,711 kg/m$^3$ or more.

In accordance with a fifth preferred embodiment of the present invention, a boundary acoustic wave device using a Stoneley wave includes a piezoelectric substance primarily including $LiNbO_3$, a dielectric substance laminated on one surface of the piezoelectric substance, and electrodes provided at a boundary between the piezoelectric substance and the dielectric substance. In the boundary acoustic wave device described above, when the density of the electrodes, the thickness thereof, and the wavelength of the Stoneley wave are represented by $\rho$ (kg/m$^3$), H ($\lambda$), and $\lambda$, respectively, $H>0.03\lambda$ and $\rho>2,699$ kg/m$^3$ is maintained.

In the boundary acoustic wave device according to one of the first to the fifth preferred embodiments of the present invention, preferably the electrodes primarily include an electrode layer including at least one material selected from the group consisting of Ag, Au, Cu, Fe, Mo, Ni, Ta, W, Ti, and Pt.

The boundary acoustic wave device according to the first preferred embodiment of the present invention includes a piezoelectric substance, a dielectric substance laminated on one surface of the piezoelectric substance, and electrodes disposed at a boundary between the piezoelectric substance and the dielectric substance, and in the above-described boundary acoustic wave device, the thickness of the electrodes is preferably determined such that the acoustic velocity of a Stoneley wave is less than that of a slow transverse wave propagating through the dielectric substance and that of a slow transverse wave propagating through the piezoelectric substance.

In addition, the boundary acoustic wave device according to the second preferred embodiment of the present invention includes a piezoelectric substance, a dielectric substance laminated on one surface of the piezoelectric substance, and electrodes disposed at a boundary between the piezoelectric substance and the dielectric substance, and in the above-described boundary acoustic wave device, the duty ratio of strips forming the electrodes is determined such that the acoustic velocity of a Stoneley wave is less than that of a slow transverse wave propagating through the dielectric substance and that of a slow transverse wave propagating through the piezoelectric substance.

Hence, according to the first or second preferred of the present invention, since the thickness of the electrodes or the duty ratio of the strips thereof is determined as described above, a boundary acoustic wave device is provided in which the Stoneley wave propagates through the dielectric substance and the piezoelectric substance.

The boundary acoustic wave device according to the third preferred of the present invention includes a piezoelectric substance primarily including $LiNbO_3$, a dielectric substance laminated on one surface of the piezoelectric substance, and electrodes disposed at a boundary between the piezoelectric substance and the dielectric substance, and in the above-described boundary acoustic wave device, Euler angles ($\phi$, $\theta$, $\psi$) of the piezoelectric substance are in the respective ranges shown in Table 1, and a Stoneley wave having an acoustic velocity of about 3,757 m/sec or less is preferably used. Accordingly, as apparent from examples to be described later, spurious responses are effectively suppressed, and the electromechanical coefficient $k^2$ of the Stoneley wave is increased.

In the boundary acoustic wave device according to the second or the third preferred embodiment of the present invention, when the thickness of the electrodes or the duty ratio is determined such that the acoustic velocity of the Stoneley wave is less than that of the slow transverse wave propagating through the dielectric substance and that of the slow transverse wave propagating through the piezoelectric substance, a boundary acoustic wave device is provided in which the Stoneley wave reliably propagates along the boundary between the dielectric substance and the piezoelectric substance.

The boundary acoustic wave device according to the fourth preferred embodiment of the present invention includes a piezoelectric substance primarily including $LiNbO_3$, a dielectric substance laminated on one surface of the piezoelectric substance, and electrodes provided at a boundary between the piezoelectric substance and the dielectric substance, and when the density of the electrodes, the thickness thereof, and the wavelength of the Stoneley wave are represented by $\rho$ (kg/m$^3$), H ($\lambda$), and $\lambda$, respectively, $H>1/[1/(3\times10^7\times\rho^{-2.22}+0.017)-0.4]$ is maintained. Thus, a boundary acoustic wave device is provided which uses a Stoneley wave having an appropriate electromechanical coefficient $k^2$. In particular, when the density $\rho$ of the electrodes is 4,711 kg/m$^3$ or more, the thickness of the electrodes at a propagation loss of 0 is decreased, and thus, the electrodes are easily formed.

The boundary acoustic wave device according to the fifth preferred embodiment of the present invention includes a piezoelectric substance primarily including $LiNbO_3$, a dielectric substance laminated on one surface of the piezoelectric substance, and electrodes provided at a boundary between the piezoelectric substance and the dielectric substance, and when the density of the electrodes, the thickness thereof, and the wavelength of the Stoneley wave are represented by $\rho$ (kg/m$^3$), H ($\lambda$), and $\lambda$, respectively, $H>0.03\lambda$ and $\rho>2,699$ kg/m$^3$ is maintained. Thus, a boundary acoustic wave device is provided which uses electrodes made of a material that is heavier than Al and in which the Stoneley wave propagates.

In various preferred embodiments of the present invention, when the electrodes are each primarily made of an electrode layer including at least one material selected from the group consisting of Ag, Au, Cu, Fe, Mo, Ni, Ta, W, Ti, and Pt, in accordance with the present invention, a boundary acoustic wave device using a Stoneley wave is provided. In addition, when at least one second electrode layer including a metal other than that forming the above-described electrode layer is further provided, by selecting a metal material forming the second electrode layer, the adhesion of the electrode with the dielectric substance or the piezoelectric substance is increased, or the electric power resistance is enhanced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 120 is a graph showing the relationship between the electromechanical coefficient $k^2$ and an Euler angle φ in a boundary acoustic wave device formed in Example 4 in which Au electrodes and a $SiO_2$ film are formed on a $LiNbO_3$ substrate of Euler angles (φ, 30°, 0°).

FIG. 121 is a graph showing the relationship between the power flow angle PFA and an Euler angle φ in a boundary acoustic wave device formed in Example 4 in which Au electrodes and a $SiO_2$ film are formed on a $LiNbO_3$ substrate of Euler angles (φ, 30°, 0°).

FIG. 122 is a graph showing the relationship between the propagation loss α and an Euler angle φ in a boundary acoustic wave device formed in Example 4 in which Au electrodes and a $SiO_2$ film are formed on a $LiNbO_3$ substrate of Euler angles (φ, 30°, 0°).

FIG. 123 is a graph showing the relationship between the acoustic velocity and an Euler angle ψ in a boundary acoustic wave device formed in Example 4 in which Au electrodes and a $SiO_2$ film are formed on a $LiNbO_3$ substrate of Euler angles (0°, 30°, ψ).

FIG. 124 is a graph showing the relationship between the temperature coefficient of frequency TCF and an Euler angle v in a boundary acoustic wave device formed in Example 4 in which Au electrodes and a $SiO_2$ film are formed on a $LiNbO_3$ substrate of Euler angles (0°, 30°, ψ).

FIG. 125 is a graph showing the relationship between the electromechanical coefficient $k^2$ and an Euler angle ψ in a boundary acoustic wave device formed in Example 4 in which Au electrodes and a $SiO_2$ film are formed on a $LiNbO_3$ substrate of Euler angles (0°, 30°, ψ).

FIG. 126 is a graph showing the relationship between the power flow angle PFA and an Euler angle ψ in a boundary acoustic wave device formed in Example 4 in which Au electrodes and a $SiO_2$ film are formed on a $LiNbO_3$ substrate of Euler angles (0°, 30°, ψ).

FIG. 127 is a graph showing the relationship between the propagation loss α and an Euler angle ψ in a boundary acoustic wave device formed in Example 4 in which Au electrodes and a $SiO_2$ film are formed on a $LiNbO_3$ substrate of Euler angles (0°, 30°, ψ).

DETAILED DESCRIPTION OF PREFERRED EMBODIMENTS

Figure 1:
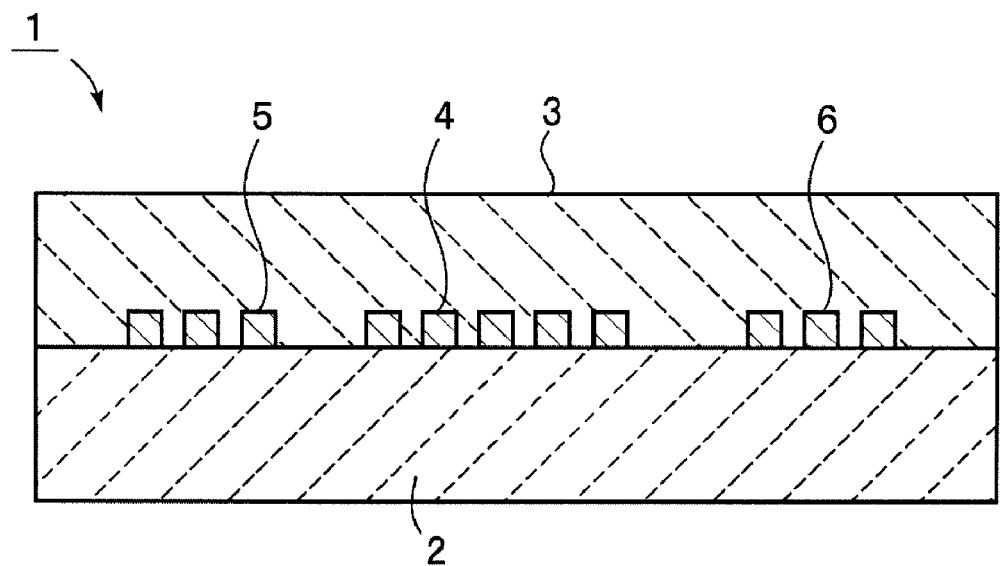
FIG. 1 is a front cross-sectional view showing a boundary acoustic wave device according to a preferred embodiment of the present invention.

Hereinafter, with reference to the figures, particular examples of preferred embodiments of the present invention will be described so as to facilitate understanding of the present invention.

In order to enable a boundary acoustic wave to propagate between two solid layers, energy of the boundary acoustic wave must be concentrated between the solid layers.

In general, when a high acoustic velocity region and a low acoustic velocity region are present, a wave is concentrated on the low acoustic velocity region and propagates therein.

Accordingly, the inventor of the present invention discovered that the condition in which energy is concentrated between two solid layers can be satisfied when the acoustic velocity of a boundary acoustic wave propagating between the solid layers is decreased by increasing the thickness of electrodes made of a metal material, such as Au or Cu, which has a high density and a low acoustic velocity as an electrode material provided between the two solid layers, and as a result, the present invention was developed.

Heretofore, it has been known that three types of bulk waves, that is, a longitudinal wave, a fast transverse wave, and a slow transverse wave are present, and that they are called a P wave, an SH wave, and an SV wave, respectively. Whether the SH wave or the SV wave becomes a slow transverse wave is determined by the anisotropic properties of a base material. Among the above three types of bulk waves, a bulk wave having the lowest acoustic velocity is a slow transverse wave. When the solid substance is an isotropic substance such as $SiO_2$, since only one type of transverse wave propagates therethrough, this transverse wave is a slow transverse wave.

On the other hand, in a boundary acoustic wave propagating through an anisotropic base material, such as a piezoelectric substrate, in most cases, three displacement components of the P wave, SH wave, and SV wave propagate while being coupled with each other, and the type of boundary acoustic wave is determined by the primary component. For example, the above Stoneley wave is a boundary acoustic wave primarily composed of the P wave and the SV wave, and the SH type boundary acoustic wave is a boundary acoustic wave primarily composed of the SH component. In addition, depending on the conditions, the SH wave component and the P wave or the SV wave component may propagate in some cases without being coupled with each other.

In the boundary acoustic wave, since the three displacement components described above propagate while being coupled with each other, for example, in a boundary acoustic wave having an acoustic velocity greater than that of the SH wave, the SH component and the SV component leak, and in a boundary acoustic wave having an acoustic velocity greater than that of the SV wave, the SV component leaks. This leaky-wave component causes propagation loss of the boundary acoustic wave.

Accordingly, when the acoustic velocity of the Stoneley wave is decreased to less than the acoustic velocities of two slow transverse waves of the above two solid layers, energy of the Stoneley wave is concentrated around electrodes disposed between the two solid layers, and a Stoneley wave having a large electromechanical coefficient $k^2$ is propagated, such that conditions are obtained in which the propagation loss is zero. Since an electrode material having a large density has a slow acoustic velocity, when the acoustic velocity of the Stoneley wave is decreased, an electrode material having a large density is preferably used. The present invention was made based on this understanding.

In addition, when at least one of the solid layers is made of a piezoelectric substance, and a dielectric substance including a piezoelectric substance is used as the other solid layer, the Stoneley wave is excited by the electrodes disposed between the solid layers. The electrodes may include comb electrodes or interdigital electrodes (interdigital transducer, IDT) as disclosed by Mikio SHIBAYAMA in "Engineering of Surface Acoustic Wave" Nov. 15, 1983, pp. 56 to 58, published by The Institute of Electronics and Communication Engineers.

Figure 2:
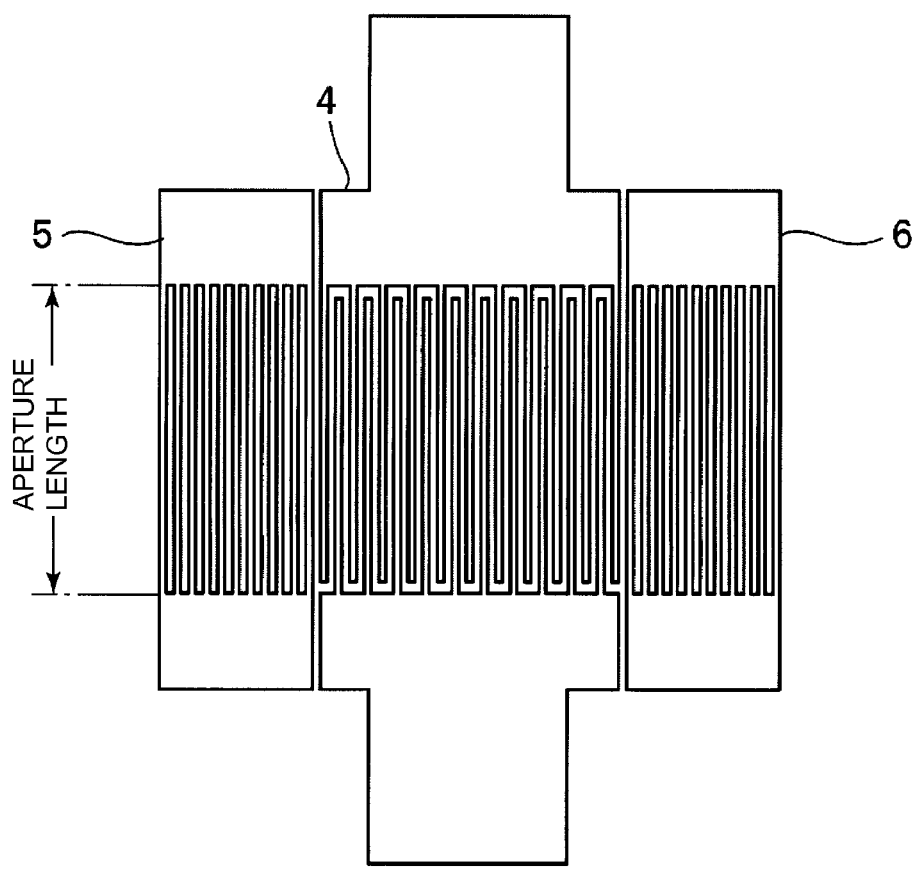
FIG. 2 is a schematic plan view showing an IDT and reflectors, which are defined by electrodes, of a boundary acoustic wave device of a preferred embodiment according to the present invention.
Figure 3:
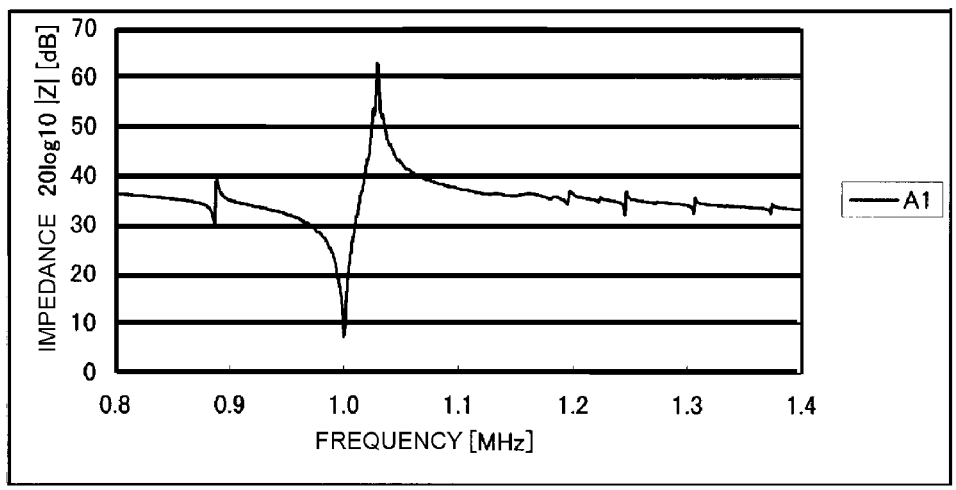
FIG. 3 is a graph showing impedance-frequency characteristics of a boundary acoustic wave device A1 shown in Table 1 formed in Example 1.
Figure 4:
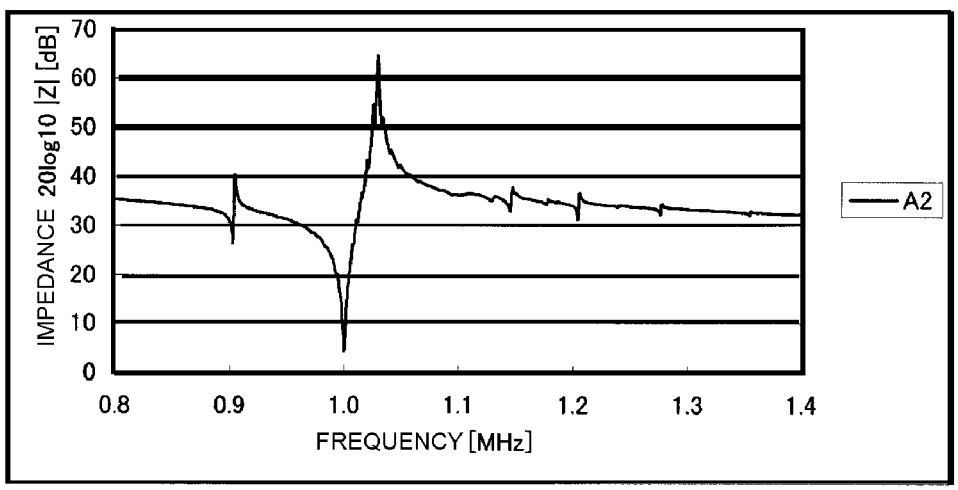
FIG. 4 is a graph showing impedance-frequency characteristics of a boundary acoustic wave device A2 shown in Table 1 formed in Example 1.
Figure 5:
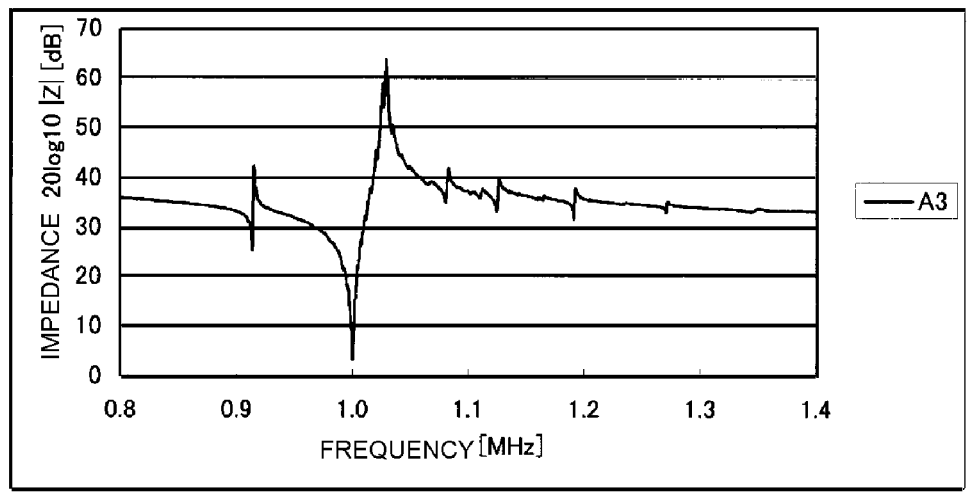
FIG. 5 is a graph showing impedance-frequency characteristics of a boundary acoustic wave device A3 shown in Table 1 formed in Example 1.
Figure 6:
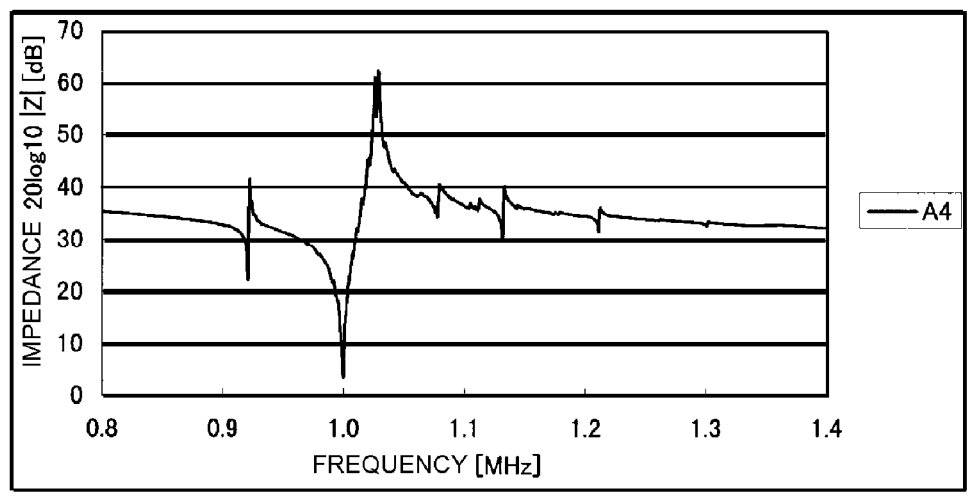
FIG. 6 is a graph showing impedance-frequency characteristics of a boundary acoustic wave device A4 shown in Table 1 formed in Example 1.
Figure 7:
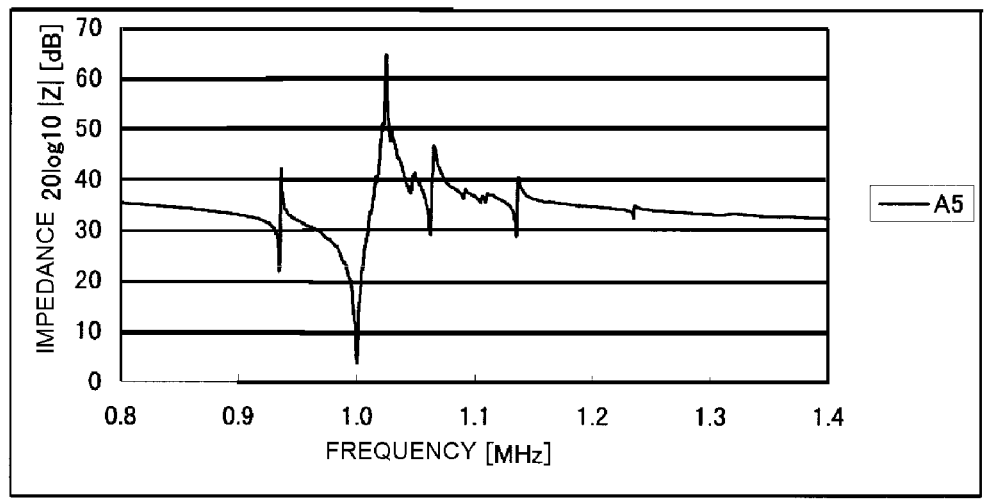
FIG. 7 is a graph showing impedance-frequency characteristics of a boundary acoustic wave device A5 shown in Table 1 formed in Example 1.
Figure 8:
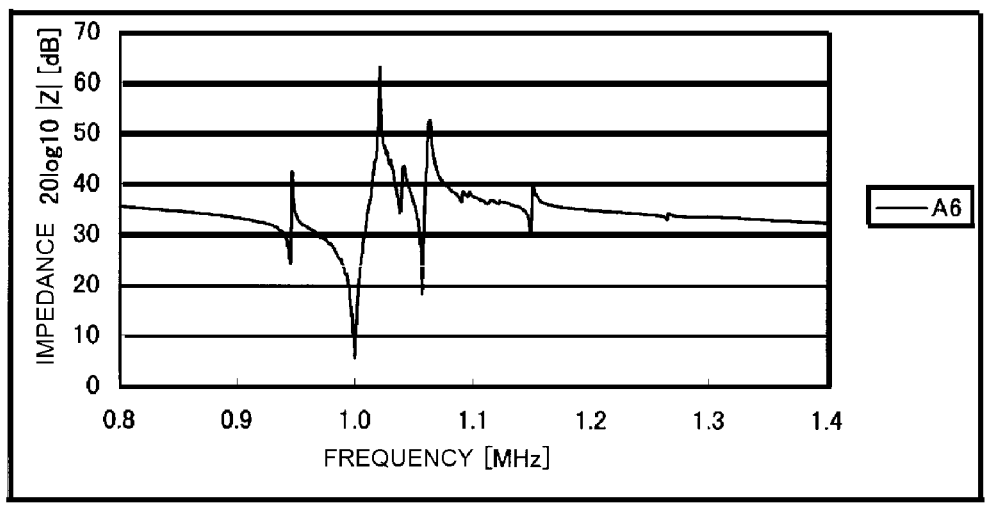
FIG. 8 is a graph showing impedance-frequency characteristics of a boundary acoustic wave device A6 shown in Table 1 formed in Example 1.
Figure 9:
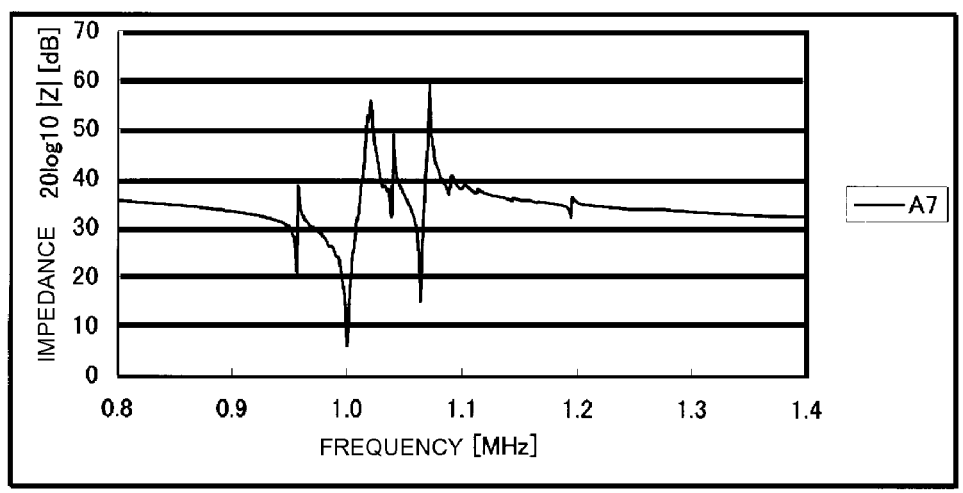
FIG. 9 is a graph showing impedance-frequency characteristics of a boundary acoustic wave device A7 shown in Table 1 formed in Example 1.

FIG. 1 is a schematic front cross-sectional view of a boundary acoustic wave device of one preferred embodiment according to the present invention, and FIG. 2 is a plan view of an electrode structure of the boundary acoustic wave device. In a boundary acoustic wave device 1, a dielectric substance 3 is laminated on a plate-shaped piezoelectric substance 2. At a boundary between the piezoelectric substance 2 and the dielectric substance 3, electrodes defining an IDT 4 and reflectors 5 and 6 are provided. The reflectors 5 and 6 are disposed on both sides of the IDT 4 in the propagation direction of a surface acoustic wave, and thus, in this preferred embodiment, a boundary acoustic wave resonator is formed.

One of the unique features of the boundary acoustic wave device of this preferred embodiment is that the IDT 4 and the reflectors 5 and 6 have a large thickness such that the acoustic velocity of a Stoneley wave is decreased to less than that of a slow transverse wave propagating through the dielectric substance 3 and that of a slow transverse wave propagating through the piezoelectric substance 2.

In this preferred embodiment, the thickness of the electrode is increased so as to decrease the acoustic velocity of the Stoneley wave to less than that of each of the slow transverse waves propagating through the piezoelectric substance 2 and the dielectric substance 3. Thus, the energy of the Stoneley wave is concentrated on the boundary between the piezoelectric substance 2 and the dielectric substance 3. Accordingly, a Stoneley wave having a large electromechanical coefficient $k^2$ is propagated with a low propagation loss.

In addition to the increase in thickness of the electrodes so as to enable the Stoneley wave to propagate, in the present invention, when the acoustic velocity of the Stoneley wave is decreased to less than that of each of the slow transverse waves propagating through the piezoelectric substance 2 and the dielectric substance 3 by controlling the duty ratio of strips defining the electrodes as described later, the Stoneley wave is concentrated on the boundary between the two substances described above and is then be propagated.

Incidentally, the duty ratio of strips is a value represented by L/P where L is the width of the strip and P is a distance from the center of a space between adjacent strips to the center of a next space adjacent to the above space.

The structure shown in FIG. 1 is a simple structure in which the IDT 4 and the reflectors 5 and 6 are disposed as the electrodes between the piezoelectric substance 2 and the dielectric substance 3. With the structure described above, boundary acoustic wave devices using a Stoneley wave can be formed using a great number of materials. For example, in the structure disclosed in the non-patent document 2, which is composed of $SiO_2$/IDT electrode/128° rotated Y plate X-propagation $LiNbO_3$, the Stoneley wave was not confirmed. However, although the Stoneley wave may not be formed when the electrode thickness is small, the Stoneley wave may be allowed to exist when the electrode thickness is increased. Hereinafter, with reference to particular examples, the present invention will be described in detail.

EXAMPLE 1

A 128° rotated Y plate X-propagation $LiNbO_3$ substrate, that is, having Euler angles (0°, 38°, 0°) was prepared as the piezoelectric substance 2. On this $LiNbO_3$ substrate, as an adhesion layer, a NiCr film was formed by an evaporation method. Next, on this adhesion layer, a Au film was formed by an evaporation method, followed by patterning using a lift-off method, such that the IDT 4 and the reflectors 5 and 6 were formed. In addition, a SiO$_2$ film was formed by an RF magnetron sputtering method at a film-forming temperature of 200° C. so as to cover the IDT 4 and the reflectors 5 and 6.

The number of electrode finger pairs of the IDT 4 and the number of electrode fingers of each reflector were set to 50.5 and 51, respectively.

In addition, the crossing width of the electrode fingers of the IDT 4 was set to 30 λ. On the other hand, an aperture length A (see FIG. 2) of the reflectors 5 and 6 was set to 30.5 λ. In this example, λ was a placement period of the electrode fingers of the IDT 4 and the reflectors 5 and 6. In addition, the duty ratios of the IDT 4 and the reflectors 5 and 6 were each set to 0.5.

As described above, while the NiCr film, the Au film and the SiO$_2$ film were variously formed as shown in the following Table 2, one-port boundary acoustic wave devices 1 were formed.

TABLE 2

| 図番 | Au (λ) | SiO$_2$ (λ) | NiCr (λ) |
|---|---|---|---|
| A1 | 0.075 | 4.5 | 0.005 |
| A2 | 0.060 | 3.6 | 0.004 |
| A3 | 0.056 | 3.3 | 0.004 |
| A4 | 0.050 | 3.0 | 0.003 |
| A5 | 0.043 | 2.6 | 0.003 |
| A6 | 0.038 | 2.3 | 0.003 |
| A7 | 0.030 | 1.8 | 0.002 |

The impedance-frequency characteristics of each of the boundary acoustic wave devices A1 to A7 shown in Table 2, which were formed as described above, were measured. The results are shown in FIGS. 3 to 9. The impedance on the vertical axis of FIGS. 3 to 9 is the value represented by $$20 \times \log_{10}|Z|[dB] \quad \text{(Equation 1)}$$

In addition, in FIGS. 3 to 9, the horizontal axis represents the frequency normalized by a resonant frequency of a response of the Stoneley wave.

As shown in FIGS. 3 to 9, in the boundary acoustic wave devices A1 to A7 shown in the above Table 2, a ratio Za/Zr between an impedance Za at an antiresonant point and an impedance Zr at a resonant point is in the range of about 50 dB to about 60 dB, and thus, superior resonant characteristics are obtained.

On the other hand, when a boundary acoustic wave device was formed in a manner similar to that for the above-described boundary acoustic wave devices except that Al was used as the electrode material, a response of a high order spurious mode was only confirmed, and no response of the Stoneley wave could be confirmed. This result coincides with the experimental result of the above-described non-patent document 2. In this example, in order to confirm the response of the Stoneley wave, a damping material was adhered to a chip surface, and the presence of attenuation was measured.

As is apparent from the experimental results, when electrodes primarily composed of Au, which is heavier than Al, are used, and the thickness of the electrodes is set to at least about 0.03 λ, the response of the Stoneley wave in the SiO$_2$/LiNbO$_3$ substrate is confirmed, which could not be realized in the past, and superior resonant characteristics are obtained.

In addition, where a rotated Y plate X-propagation LiTaO$_3$ substrate or a quartz substrate was used as the piezoelectric substance 2, when the thickness of the Au film was set to at least about 0.03 λ, it was confirmed that the Stoneley wave can be propagated. Furthermore, with other piezoelectric substrates, when the thickness of the Au film was set to at least about 0.03 λ, it was confirmed that the Stoneley wave can be propagated as is the case described above.

In FIGS. 3 to 9, the normalized resonant frequency of the response of the Stoneley wave is about 1.0. The response at a lower frequency side than that of the Stoneley wave was a spurious response caused by the SH boundary acoustic wave, and a response at a higher frequency side than that of the Stoneley wave was a response by the high order spurious mode.

The response of the high order spurious mode is suppressed by a method, for example, described in Japanese Patent Application No. 2003-114592.

EXAMPLE 2

In Example 1, the spurious response was generated by the SH type boundary acoustic wave at a lower frequency side than that of the response by the Stoneley wave. In Example 2, this spurious response was intended to be suppressed.

That is, in order to suppress the spurious response by the SH boundary acoustic wave, the relationships of the Euler angle of a LiNbO$_3$ substrate with the acoustic velocity V, the electromechanical coefficient k$^2$, the propagation loss α, the temperature coefficient of frequency TCF, and the power flow angle (PFA) of the Stoneley wave and the SH type boundary acoustic wave were obtained. The calculation was performed based on a method disclosed in "A Method For Estimating Optimal Cuts and Propagation Directions for Excitation and Propagation Directions for Excitation of Piezoelectric Surface Waves" (J. J. Campbell and W. R. Jones, IEEE Trans. Sonics and Ultrasonics, Vol. SU-15, No. 4 (October 1968) pp. 209 to 217). In the case of a free boundary, the acoustic velocity and the propagation loss were obtained based on the assumption that the displacements, the potentials, the normal line components of an electric flux density, and the stresses in the up and down direction at respective boundaries between SiO$_2$ and Au and between Au and LiNbO$_3$ were continuous, the thickness of SiO$_2$ and that of LiNbO$_3$ were infinite, and the relative dielectric constant of Au was 1. In addition, in the case of a short-circuit boundary, the potentials at the respective boundaries between SiO$_2$ and Au and between Au and LiNbO$_3$ were assumed to be zero. In addition, the electromechanical coefficient k$^2$ was obtained by the following equation [1]. In this equation, Vf indicates the acoustic velocity of the free boundary.

$$k^2 = 2 \times |Vf - V|/Vf \quad [1]$$

The temperature coefficient of frequency TCF was obtained from phase velocities V at 20° C., 25° C., and 30° C. using the following equation [2].

$$TCF = V^{-1} (25° C.) \times [(V(30° C.) - V(20° C.))/10° C.] - dS \quad [2]$$

In the above equation, dS indicates the coefficient of linear thermal expansion of the LiNbO$_3$ substrate in the propagation direction of the boundary acoustic wave.

In addition, the power flow angle PFA at optional Euler angles (φ, θ, ψ) was obtained from phase velocities V at angles of ψ−0.5°, ψ, and ψ+0.5° using the following equation [3].

$$PFA = \tan^{-1}[V^{-1}(\psi) \times (V(\psi+0.5°) - V(\psi-0.5°))] \quad [3]$$

The structure used in this example was a structure in which Au electrodes were formed on a LiNbO$_3$ substrate and a SiO$_2$ film was then formed thereon. The thickness of the Au electrodes was set to 0.07 λ, the Euler angles were (0°, 0°, ψ), (0°, 90°, ψ), (90°, 0°, ψ), (90°, 90°, ψ), (0°, θ, 0°) (0°, θ, 90°), (90°, θ, 0°(90°, θ, 90°), (φ, 0°, 0°), (φ, 0°, 90°), (φ, 90°, 0°), and (φ, 90°, 90°), and φ, θ, ψ were each within 0° to 180°.

Figure 10:
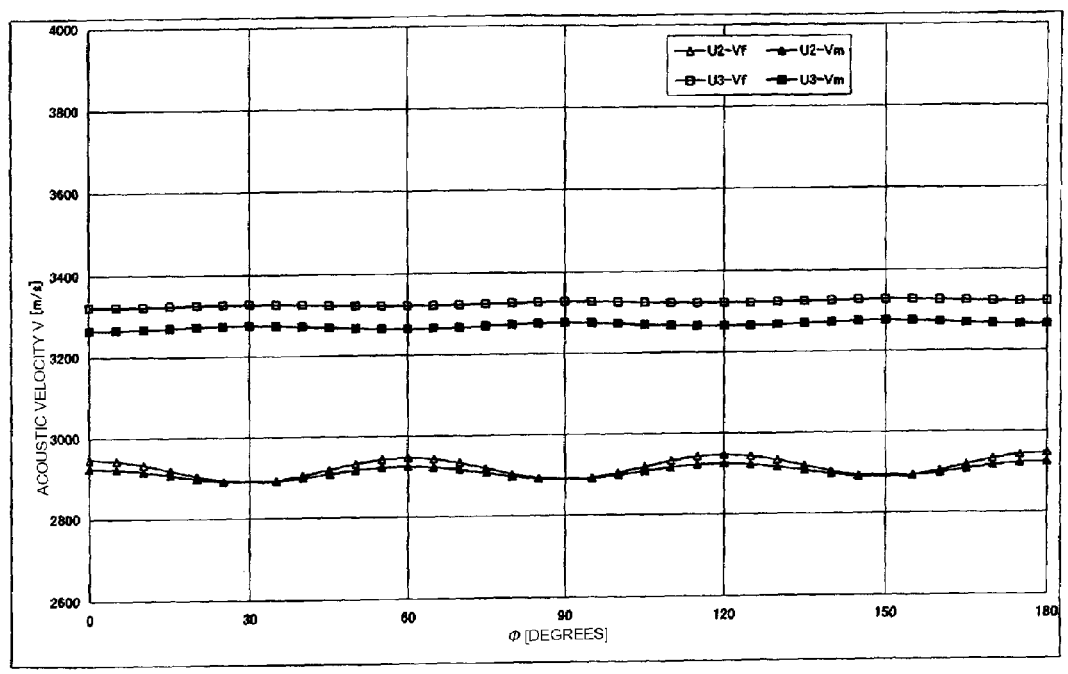
FIG. 10 is a graph showing the relationship between an Euler angle $\phi$ and the acoustic velocity V in the structure in which Au electrodes are formed on a $LiNbO_3$ substrate of ($\phi$, 0°, 0°), and a $SiO_2$ film is then formed thereon.
Figure 11:
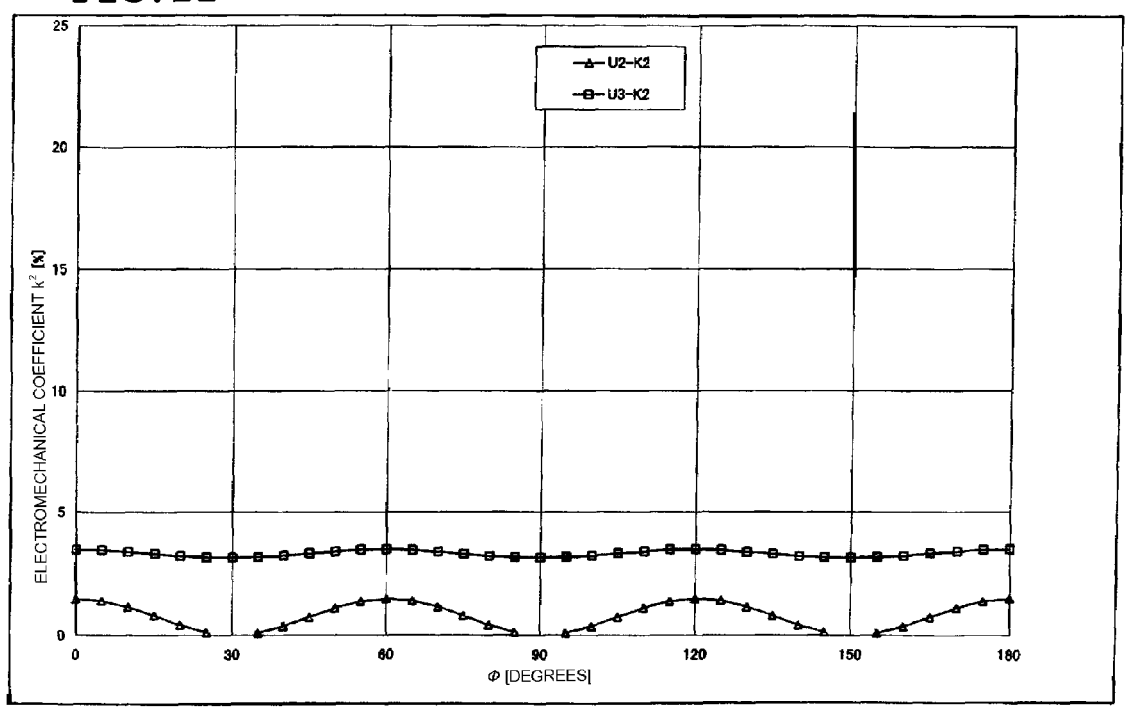
FIG. 11 is a graph showing the relationship between an Euler angle $\phi$ and the electromechanical coefficient $k^2$ in the structure in which Au electrodes are formed on a $LiNbO_3$ substrate of ($\phi$, 0°, 0°), and a $SiO_2$ film is then formed thereon.
Figure 12:
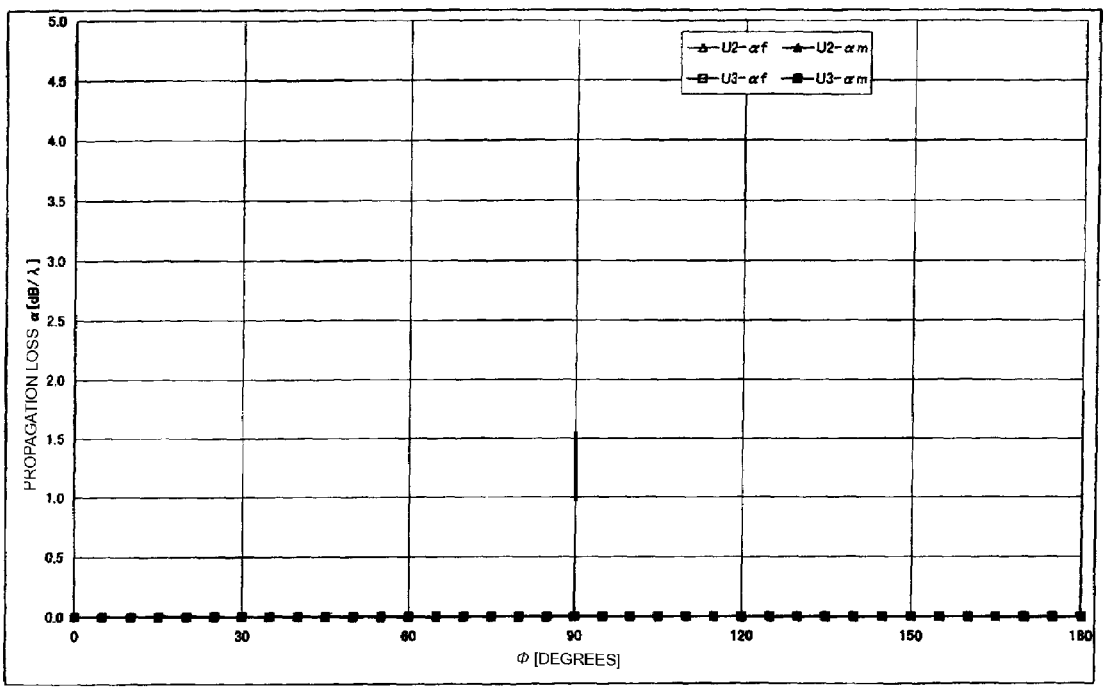
FIG. 12 is a graph showing the relationship between an Euler angle $\phi$ and the propagation loss $\alpha$ in the structure in which Au electrodes are formed on a $LiNbO_3$ substrate of ($\phi$, 0°, 0°), and a $SiO_2$ film is then formed thereon.
Figure 13:
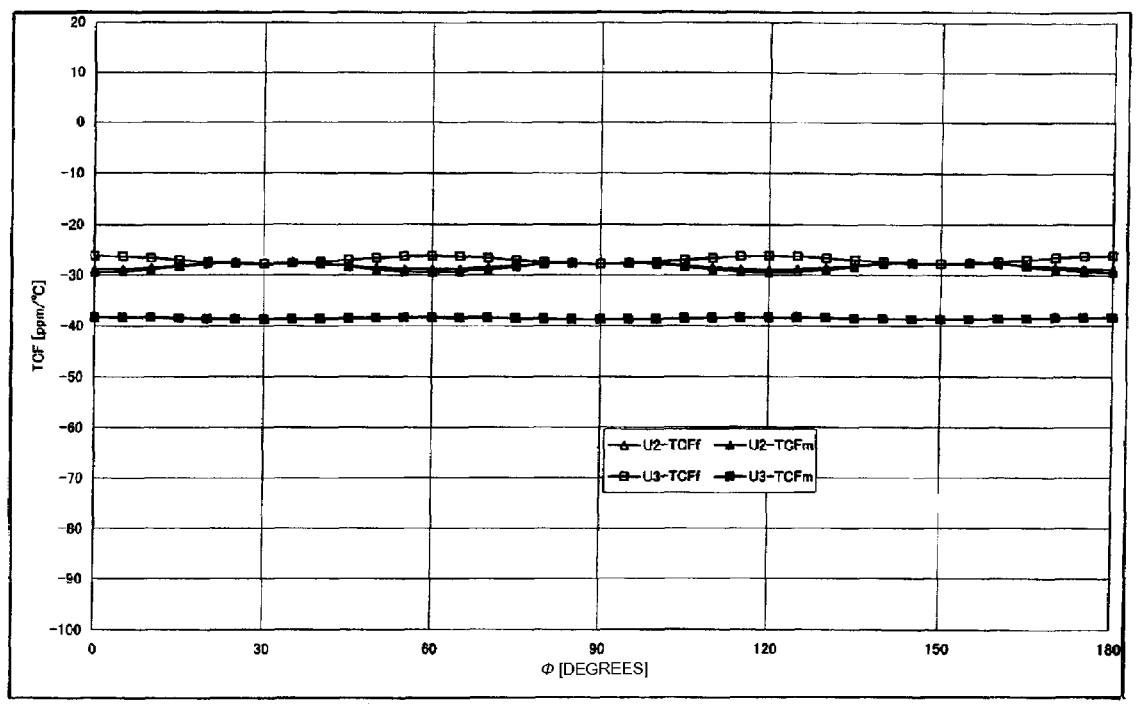
FIG. 13 is a graph showing the relationship between an Euler angle φ and the temperature coefficient of frequency TCF in the structure in which Au electrodes are formed on a LiNbO$_3$ substrate of (φ, 0°, 0°), and a SiO$_2$ film is then formed thereon.
Figure 14:
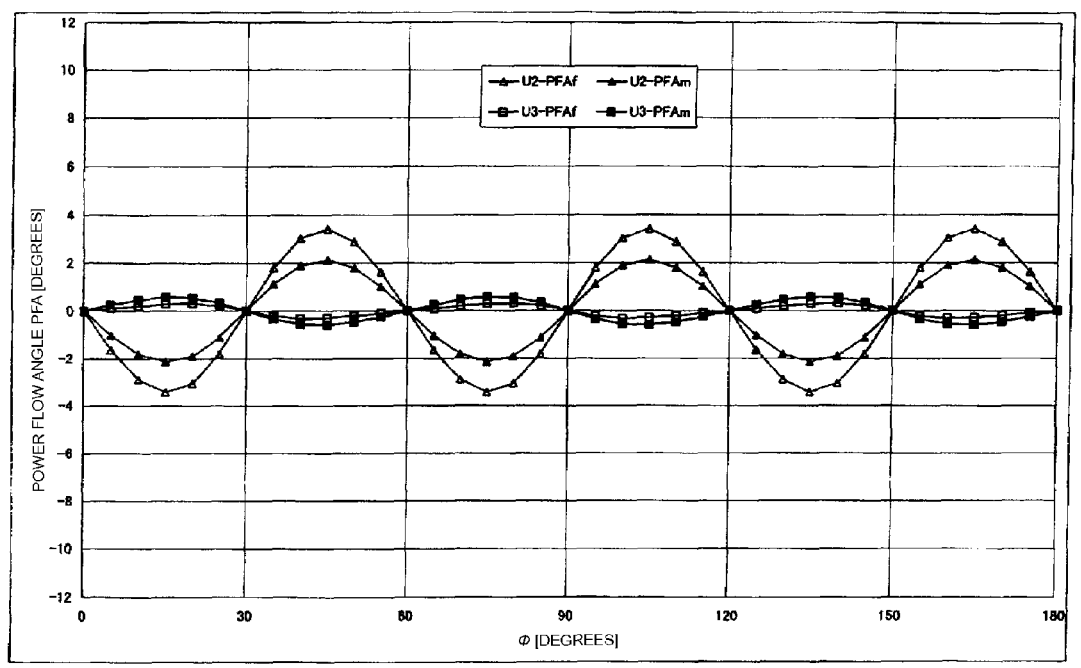
FIG. 14 is a graph showing the relationship between an Euler angle φ and the power flow angle PFA in the structure in which Au electrodes are formed on a LiNbO$_3$ substrate of (φ, 0°, 0°), and a SiO$_2$ film is then formed thereon.
Figure 15:
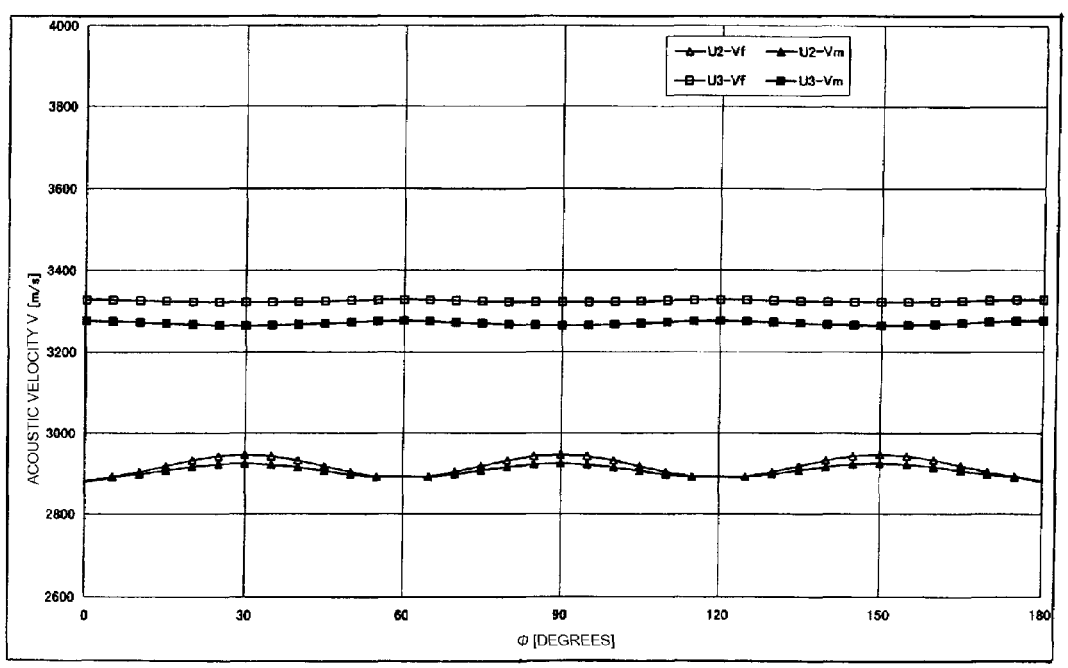
FIG. 15 is a graph showing the relationship between an Euler angle φ and the acoustic velocity V in the structure in which Au electrodes are formed on a LiNbO$_3$ substrate of (φ, 0°, 90°), and a SiO$_2$ film is then formed thereon.
Figure 16:
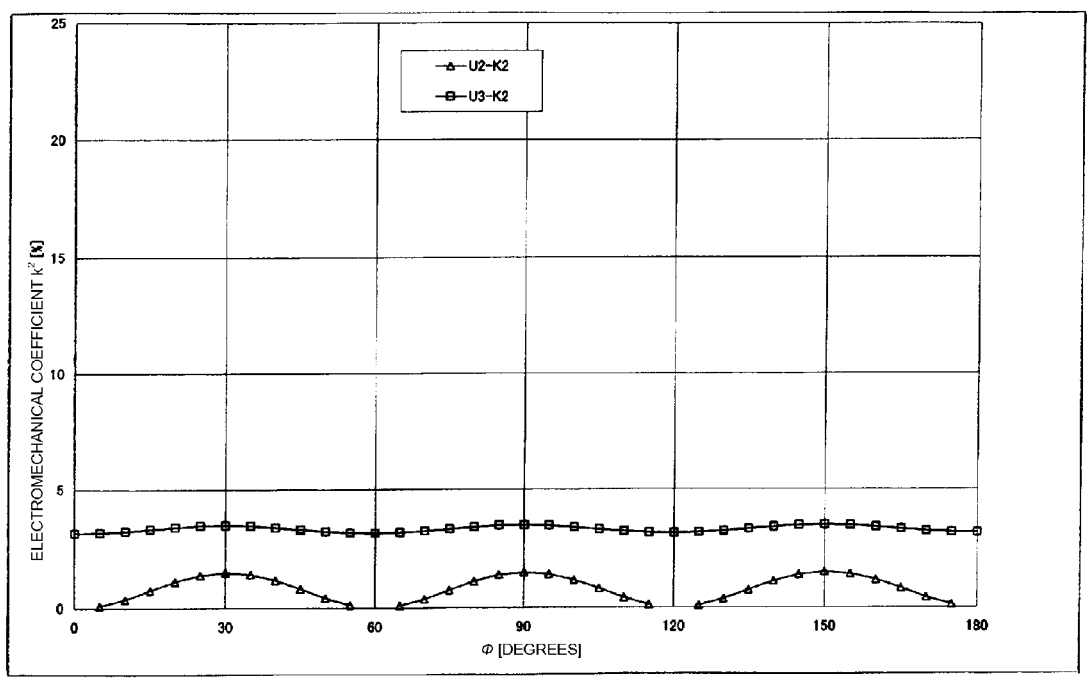
FIG. 16 is a graph showing the relationship between an Euler angle φ and the electromechanical coefficient k$^2$ in the structure in which Au electrodes are formed on a LiNbO$_3$ substrate of (φ, 0°, 90°), and a SiO$_2$ film is then formed thereon.
Figure 17:
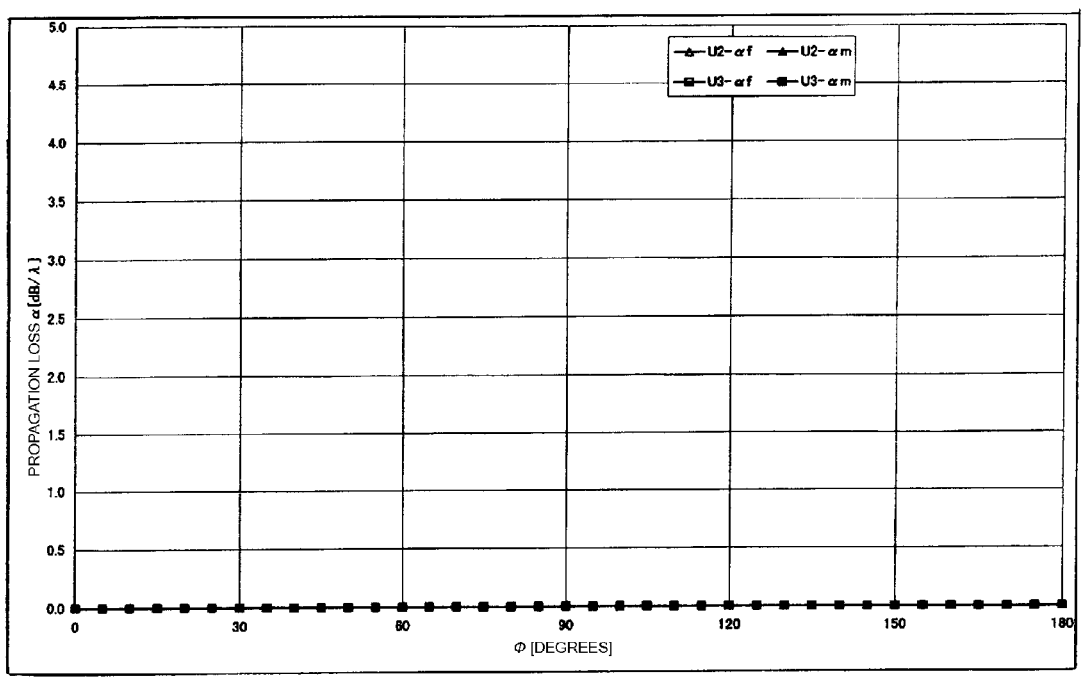
FIG. 17 is a graph showing the relationship between an Euler angle φ and the propagation loss α in the structure in which Au electrodes are formed on a LiNbO$_3$ substrate of (φ, 0°, 90°), and a SiO$_2$ film is then formed thereon.
Figure 18:
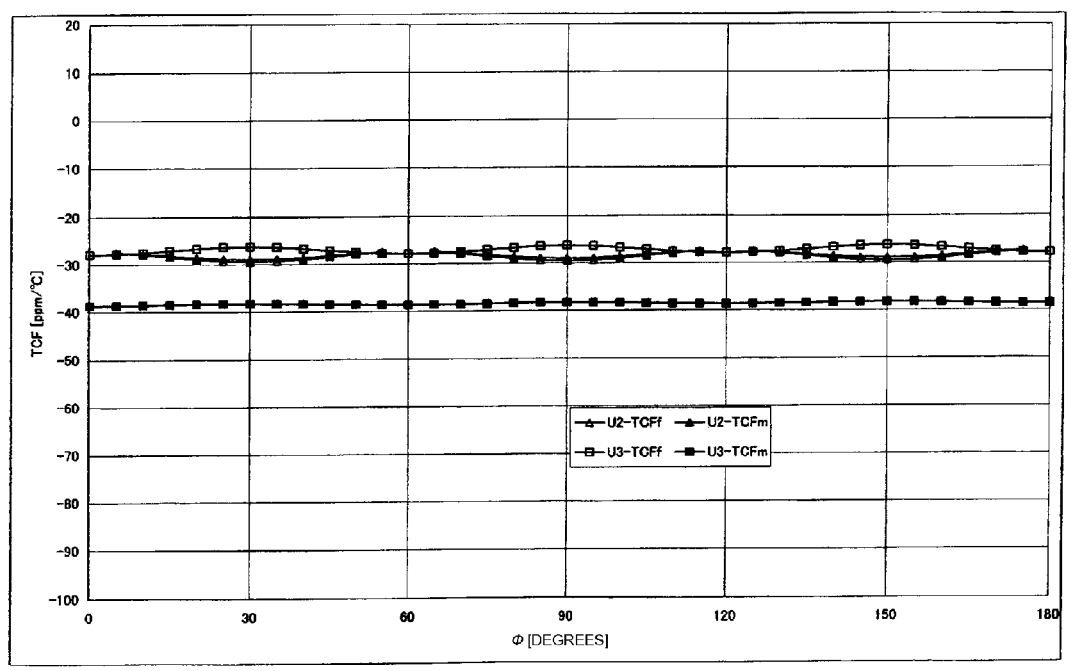
FIG. 18 is a graph showing the relationship between an Euler angle φ and the temperature coefficient of frequency TCF in the structure in which Au electrodes are formed on a LiNbO$_3$ substrate of (φ, 0°, 90°), and a SiO$_2$ film is then formed thereon.
Figure 19:
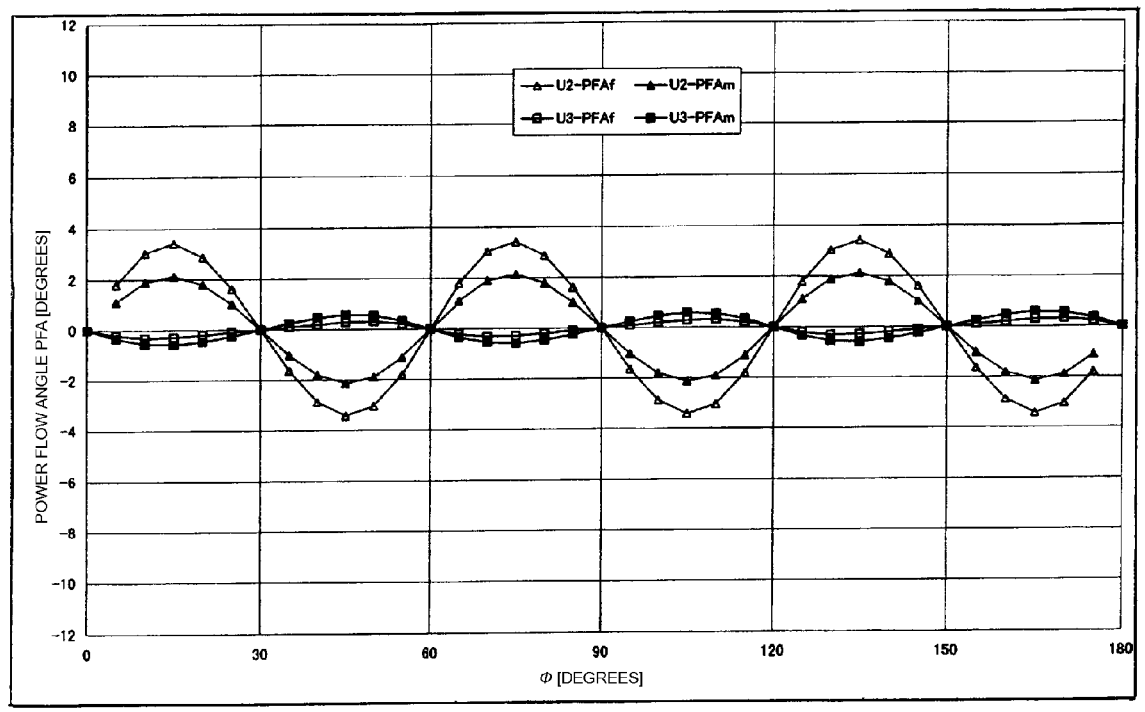
FIG. 19 is a graph showing the relationship between an Euler angle φ and the power flow angle PFA in the structure in which Au electrodes are formed on a LiNbO$_3$ substrate of (φ, 0°, 90°), and a SiO$_2$ film is then formed thereon.
Figure 20:
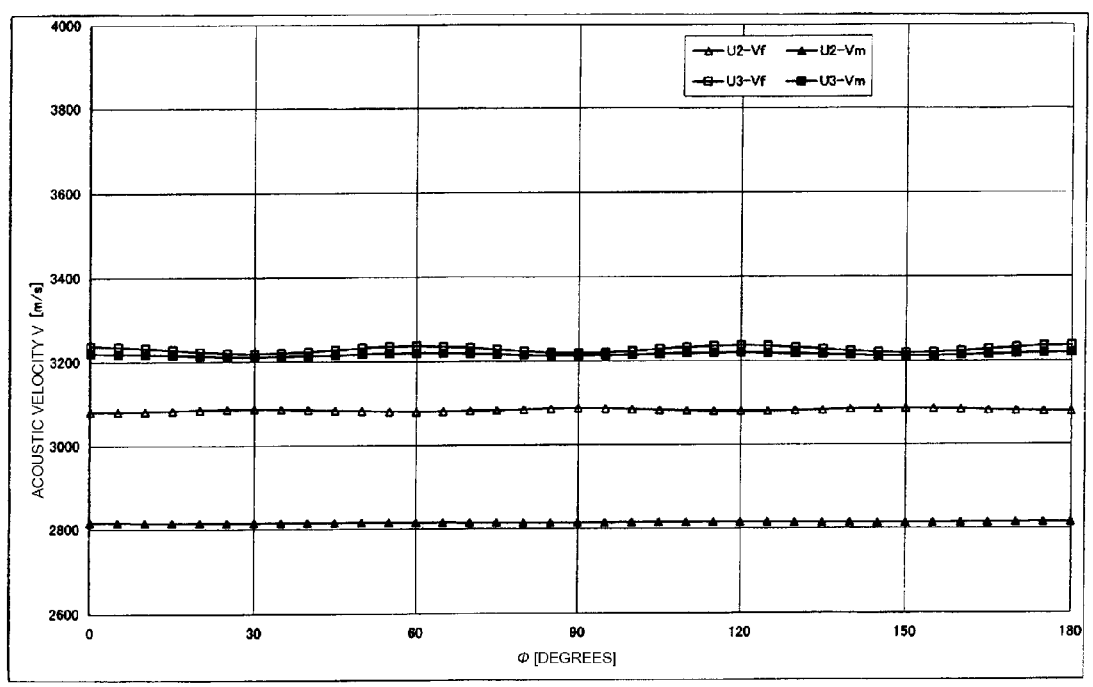
FIG. 20 is a graph showing the relationship between an Euler angle φ and the acoustic velocity V in the structure in which Au electrodes are formed on a LiNbO$_3$ substrate of (φ, 90°, 0°), and a SiO$_2$ film is then formed thereon.
Figure 21:
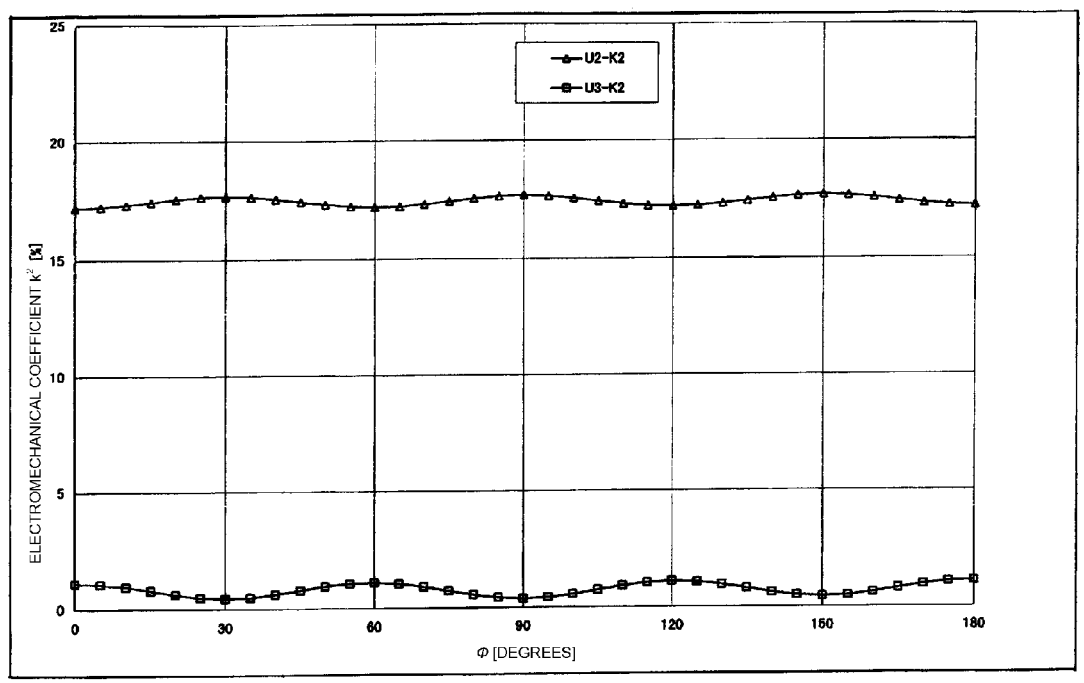
FIG. 21 is a graph showing the relationship between an Euler angle φ and the electromechanical coefficient k$^2$ in the structure in which Au electrodes are formed on a LiNbO$_3$ substrate of (φ, 90°, 0°), and a SiO$_2$ film is then formed thereon.
Figure 22:
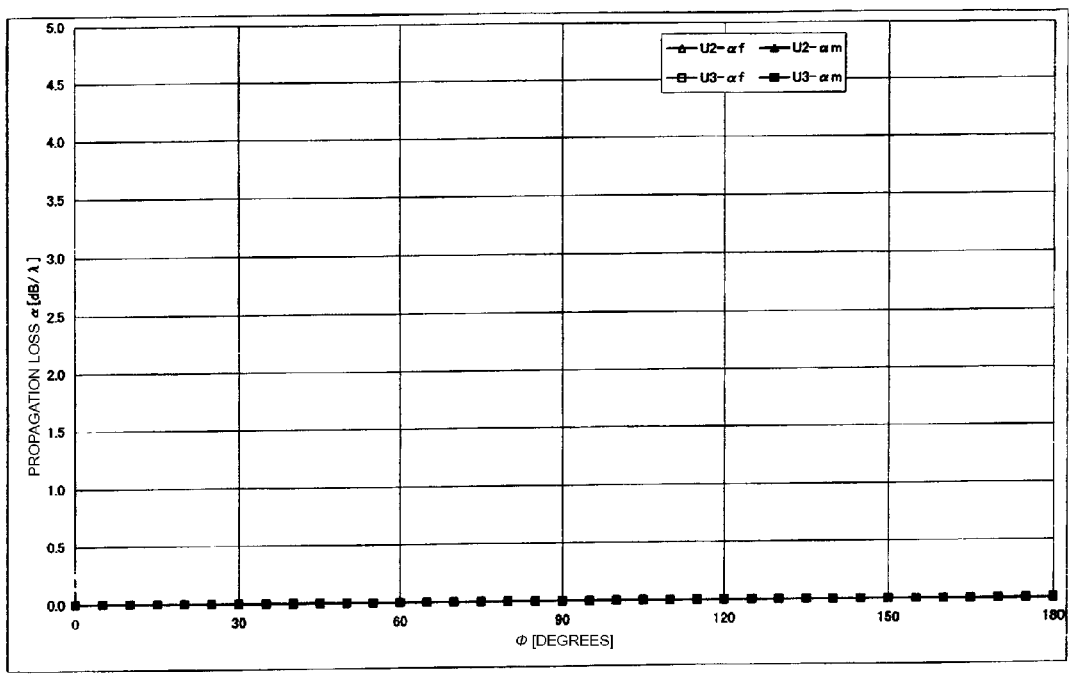
FIG. 22 is a graph showing the relationship between an Euler angle φ and the propagation loss α in the structure in which Au electrodes are formed on a LiNbO$_3$ substrate of (φ, 90°, 0°), and a SiO$_2$ film is then formed thereon.
Figure 23:
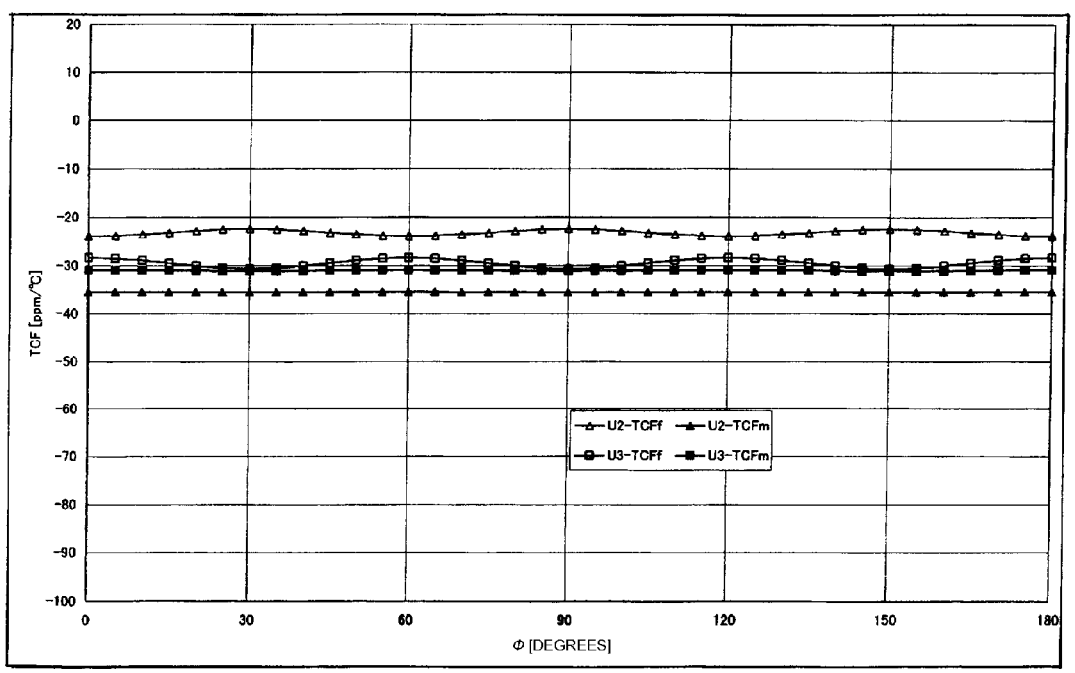
FIG. 23 is a graph showing the relationship between an Euler angle φ and the temperature coefficient of frequency TCF in the structure in which Au electrodes are formed on a LiNbO$_3$ substrate of (φ, 90°, 0°), and a SiO$_2$ film is then formed thereon.
Figure 24:
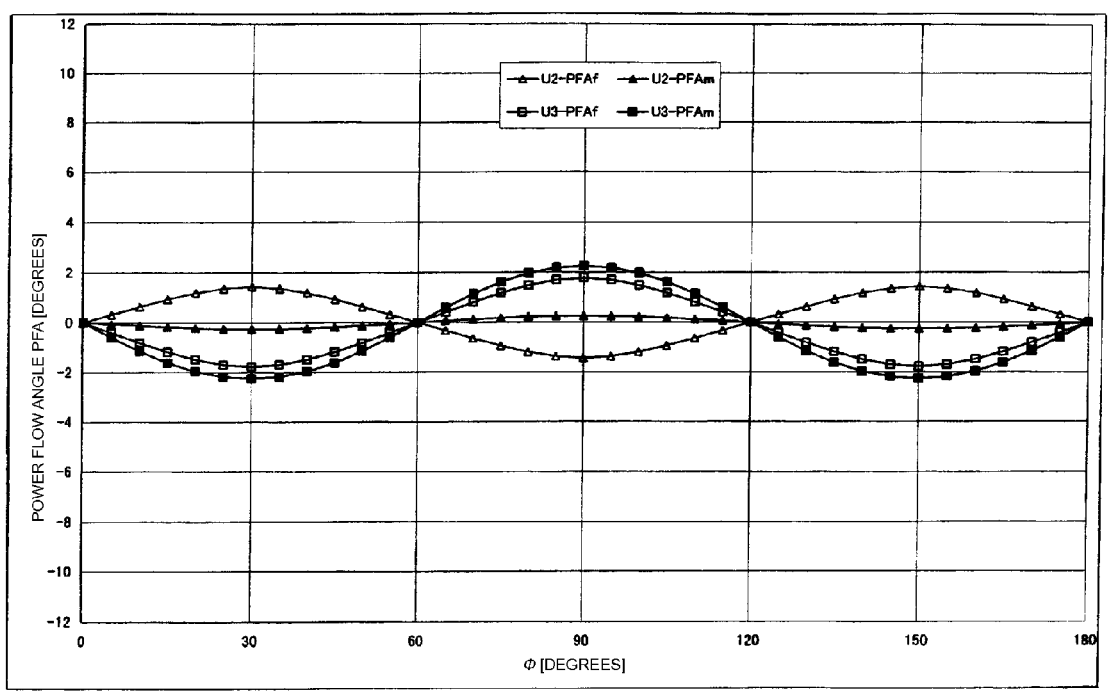
FIG. 24 is a graph showing the relationship between an Euler angle φ and the power flow angle PFA in the structure in which Au electrodes are formed on a LiNbO$_3$ substrate of (φ, 90°, 0°), and a SiO$_2$ film is then formed thereon.
Figure 25:
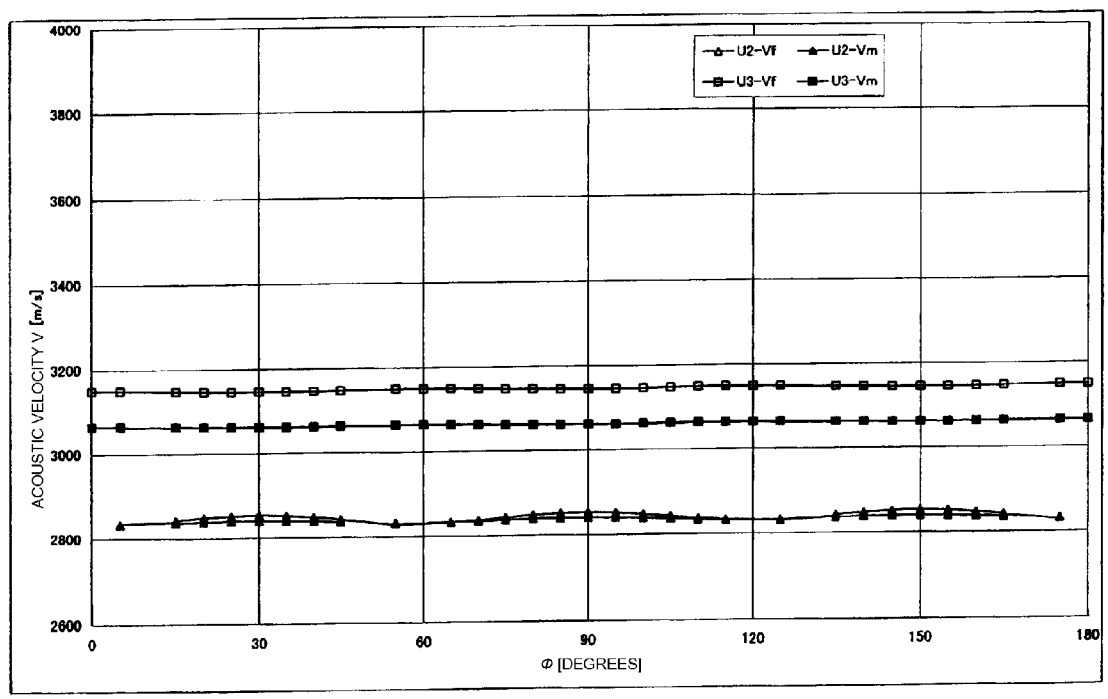
FIG. 25 is a graph showing the relationship between an Euler angle φ and the acoustic velocity V in the structure in which Au electrodes are formed on a LiNbO$_3$ substrate of (φ, 90°, 90°), and a SiO$_2$ film is then formed thereon.
Figure 26:
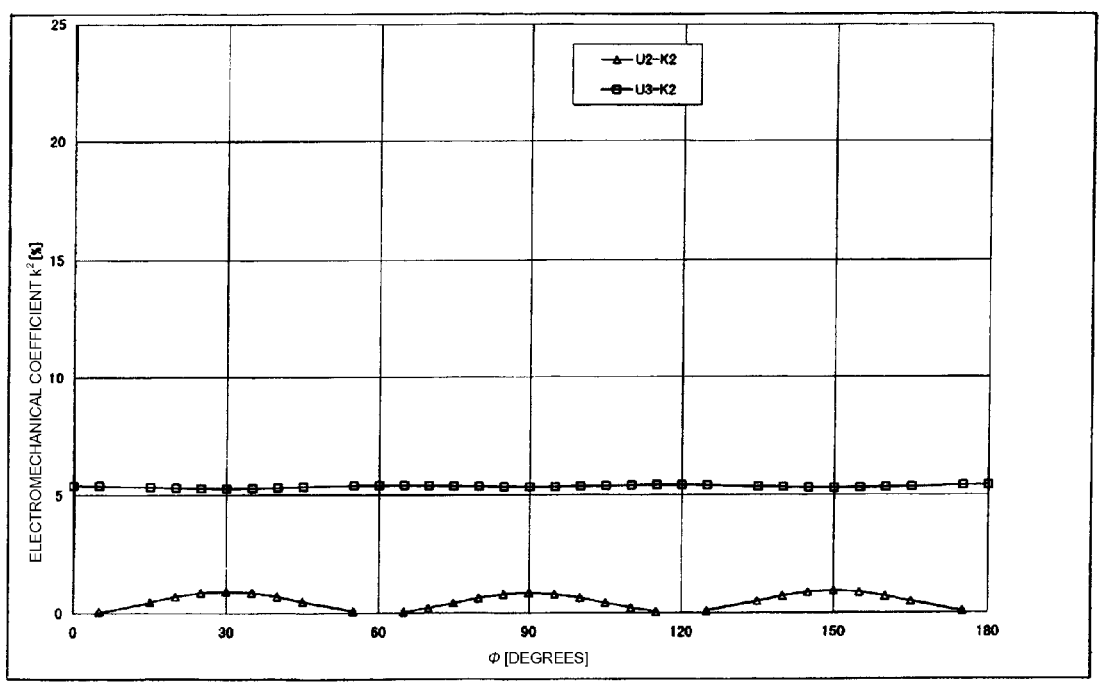
FIG. 26 is a graph showing the relationship between an Euler angle φ and the electromechanical coefficient k$^2$ in the structure in which Au electrodes are formed on a LiNbO$_3$ substrate of (φ, 90°, 90°), and a SiO$_2$ film is then formed thereon.
Figure 27:
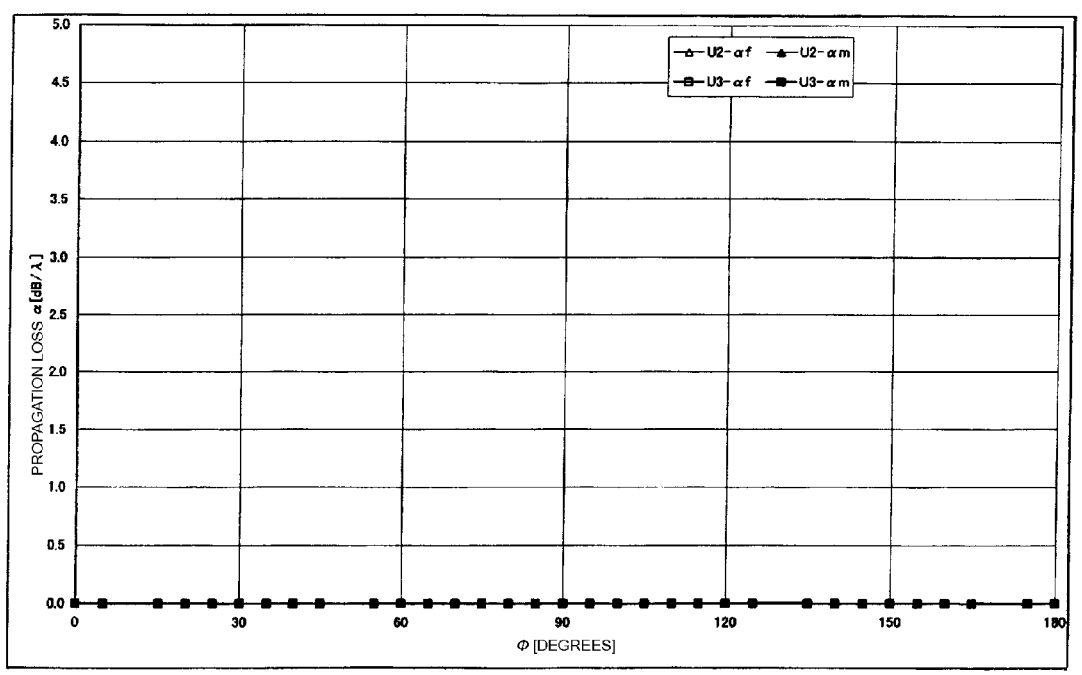
FIG. 27 is a graph showing the relationship between an Euler angle φ and the propagation loss α in the structure in which Au electrodes are formed on a LiNbO$_3$ substrate of (φ, 90°, 90°), and a SiO$_2$ film is then formed thereon.
Figure 28:
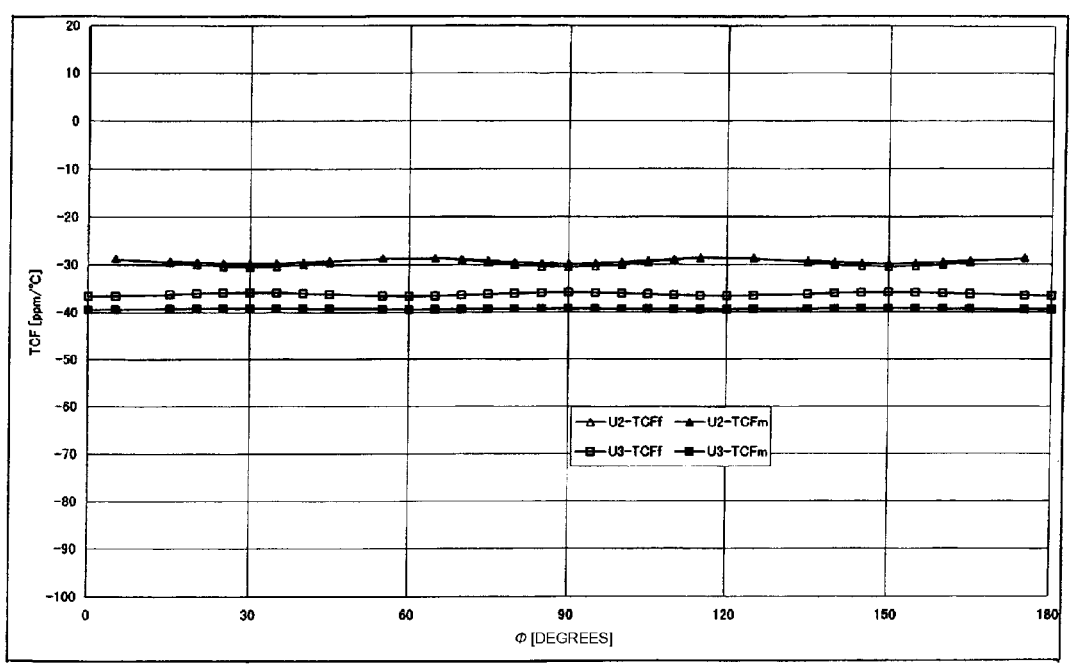
FIG. 28 is a graph showing the relationship between an Euler angle φ and the temperature coefficient of frequency TCF in the structure in which Au electrodes are formed on a LiNbO$_3$ substrate of (φ, 90°, 90°), and a SiO$_2$ film is then formed thereon.
Figure 29:
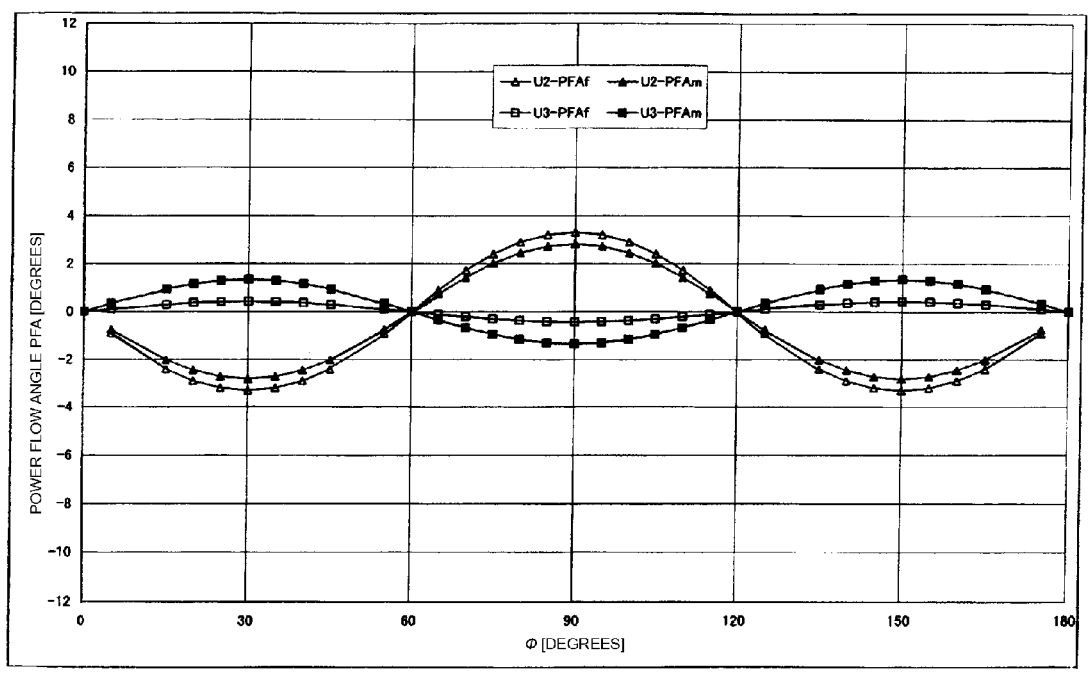
FIG. 29 is a graph showing the relationship between an Euler angle φ and the power flow angle PFA in the structure in which Au electrodes are formed on a LiNbO$_3$ substrate of (φ, 90°, 90°), and a SiO$_2$ film is then formed thereon.
Figure 30:
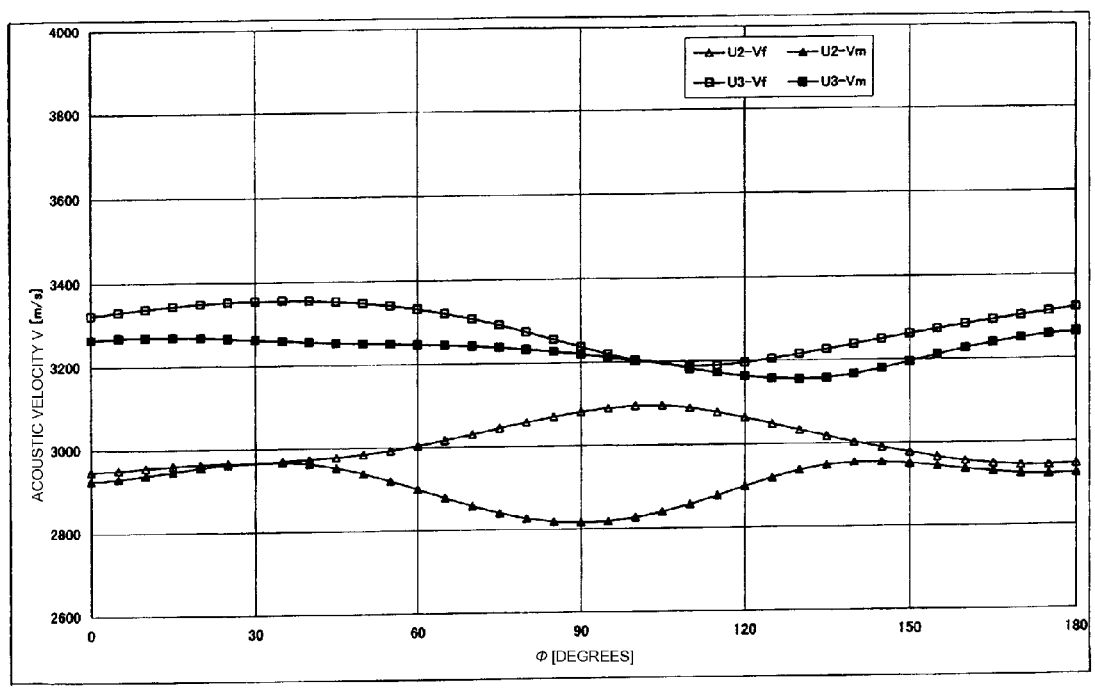
FIG. 30 is a graph showing the relationship between an Euler angle θ and the acoustic velocity V in the structure in which Au electrodes are formed on a LiNbO$_3$ substrate of (0°, θ, 0°), and a SiO$_2$ film is then formed thereon.
Figure 31:
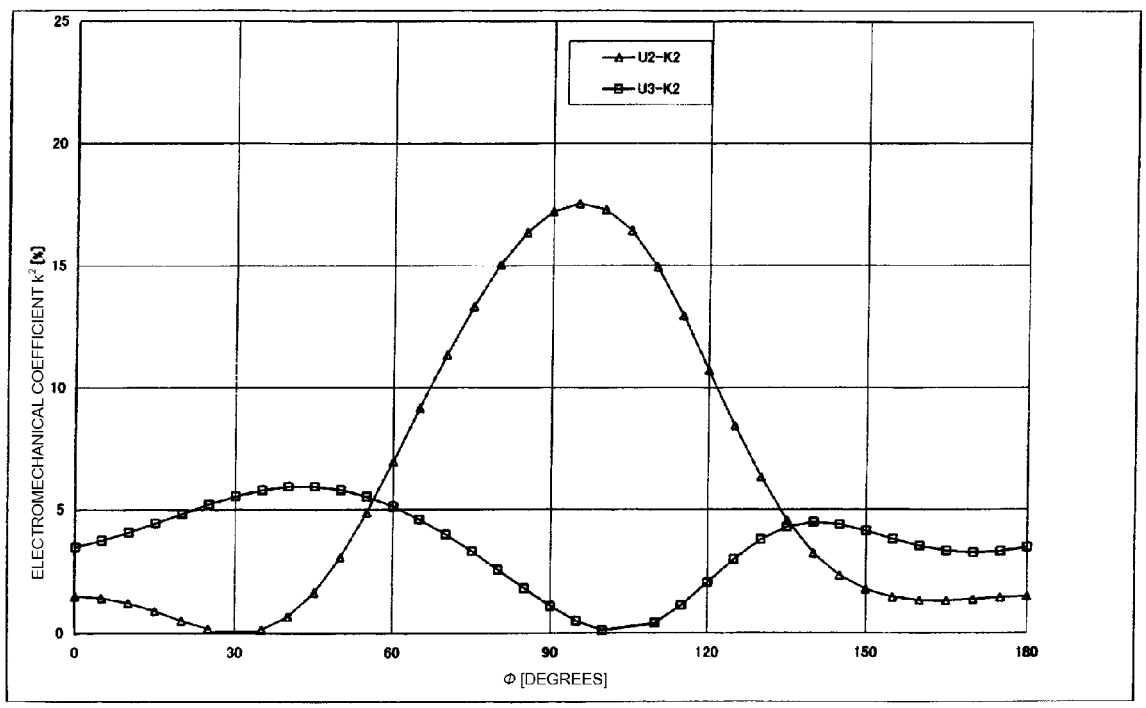
FIG. 31 is a graph showing the relationship between an Euler angle θ and the electromechanical coefficient k$^2$ in the structure in which Au electrodes are formed on a LiNbO$_3$ substrate of (0°, θ, 0°), and a SiO$_2$ film is then formed thereon.
Figure 32:
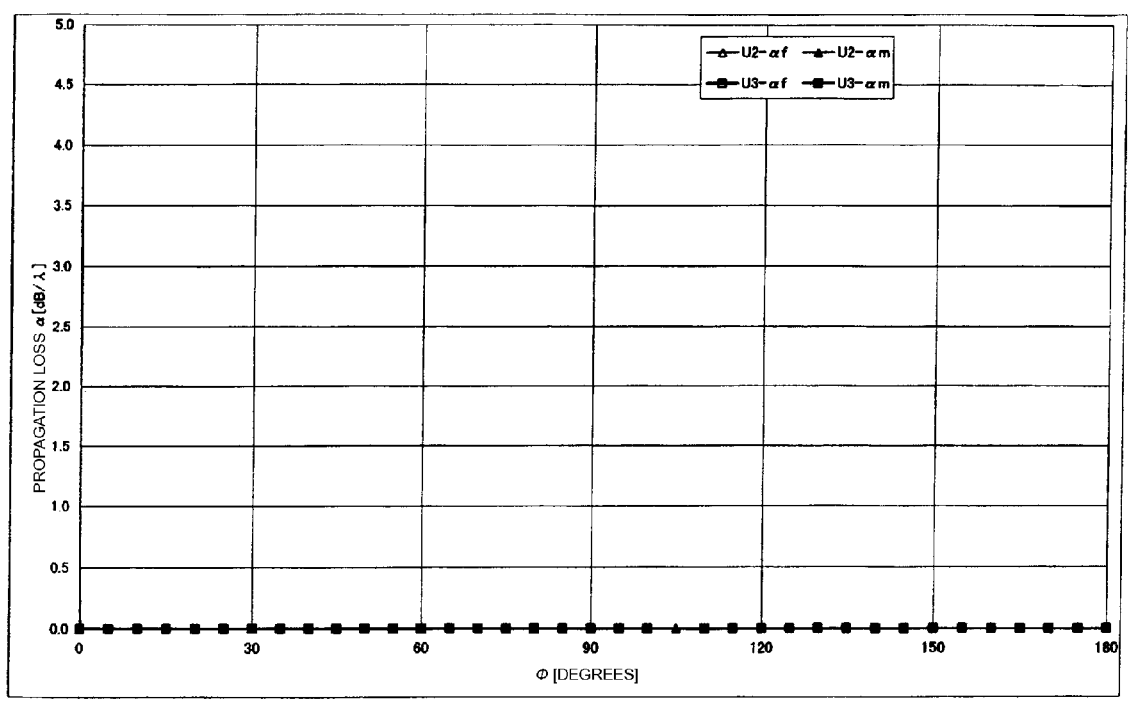
FIG. 32 is a graph showing the relationship between an Euler angle θ and the propagation loss α in the structure in which Au electrodes are formed on a LiNbO$_3$ substrate of (0°, θ, 0°), and a SiO$_2$ film is then formed thereon.
Figure 33:
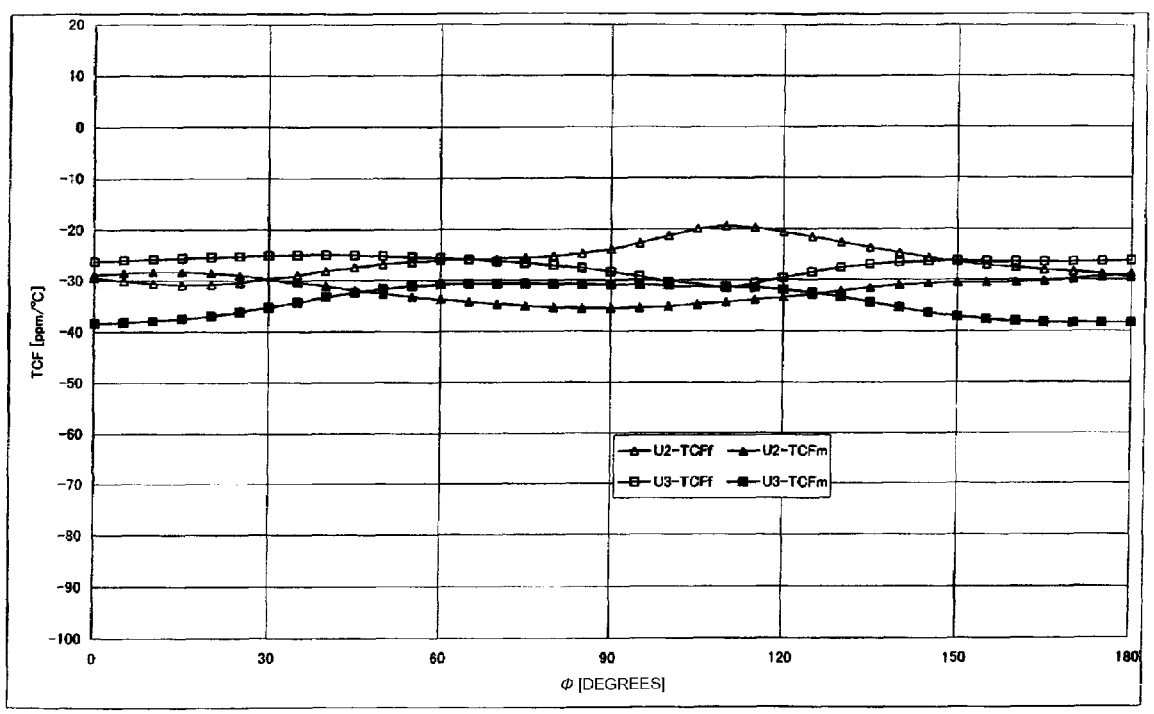
FIG. 33 is a graph showing the relationship between an Euler angle θ and the temperature coefficient of frequency TCF in the structure in which Au electrodes are formed on a LiNbO$_3$ substrate of (0°, θ, 0°), and a SiO$_2$ film is then formed thereon.
Figure 34:
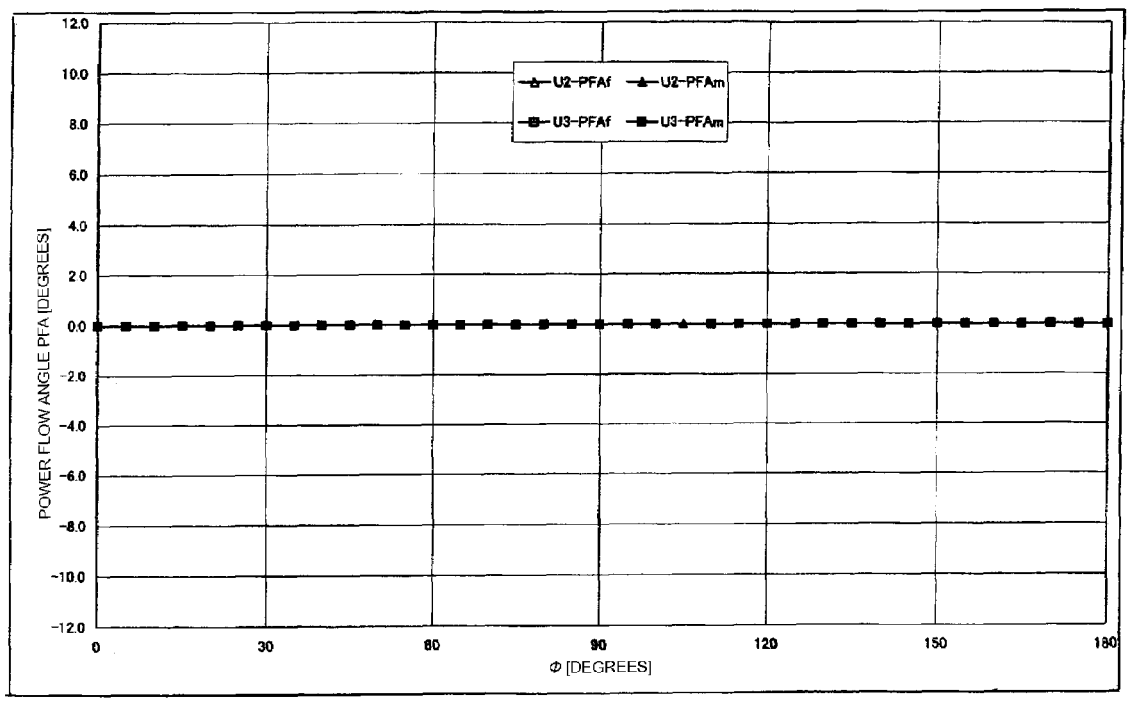
FIG. 34 is a graph showing the relationship between an Euler angle θ and the power flow angle PFA in the structure in which Au electrodes are formed on a LiNbO$_3$ substrate of (0°, θ, 0°), and a SiO$_2$ film is then formed thereon.
Figure 35:
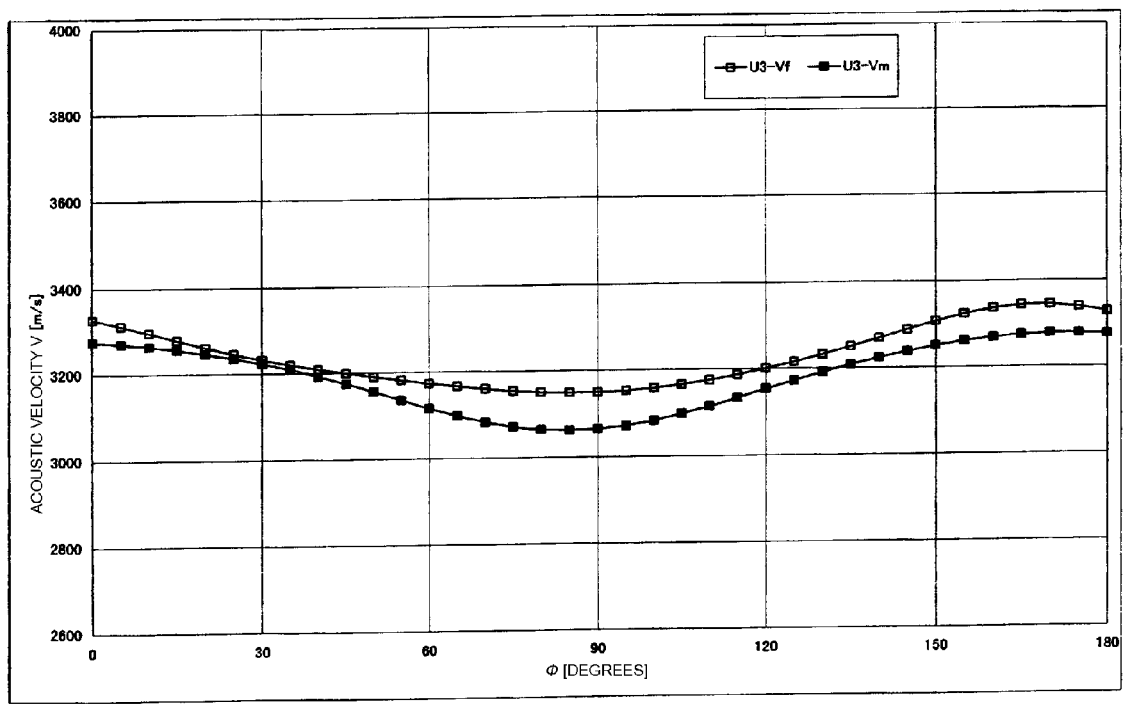
FIG. 35 is a graph showing the relationship between an Euler angle θ and the acoustic velocity V in the structure in which Au electrodes are formed on a LiNbO$_3$ substrate of (0°, θ, 90°), and a SiO$_2$ film is then formed thereon.
Figure 36:
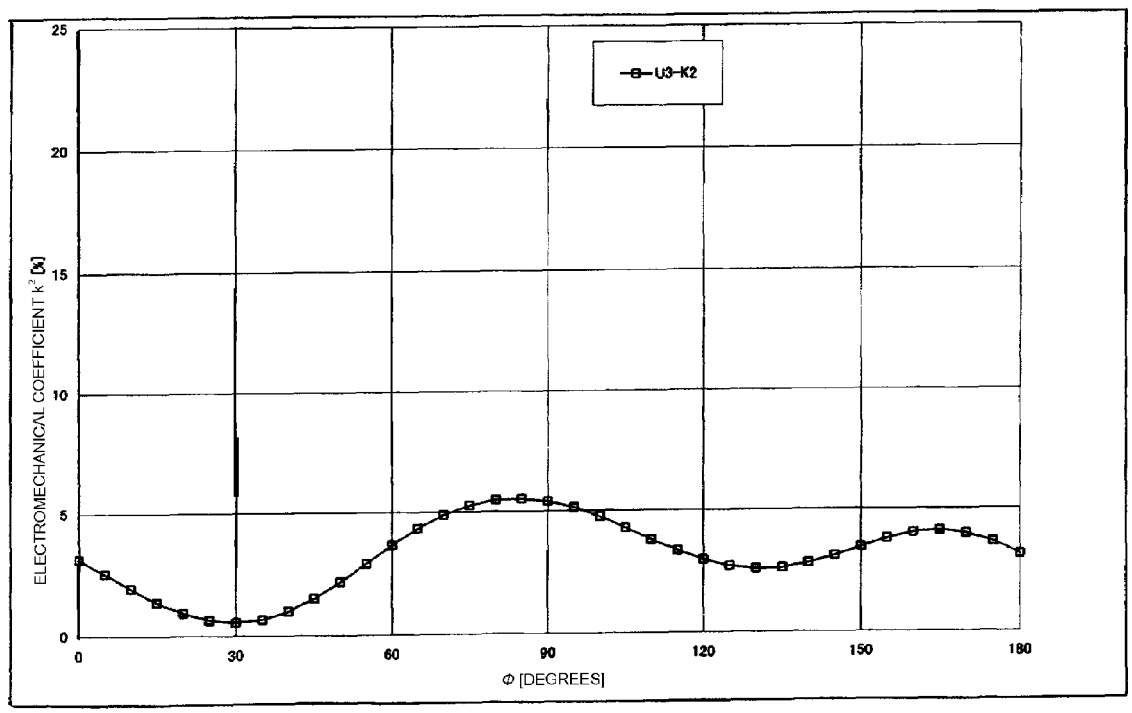
FIG. 36 is a graph showing the relationship between an Euler angle θ and the electromechanical coefficient k$^2$ in the structure in which Au electrodes are formed on a LiNbO$_3$ substrate of (0°, θ, 90°), and a SiO$_2$ film is then formed thereon.
Figure 37:
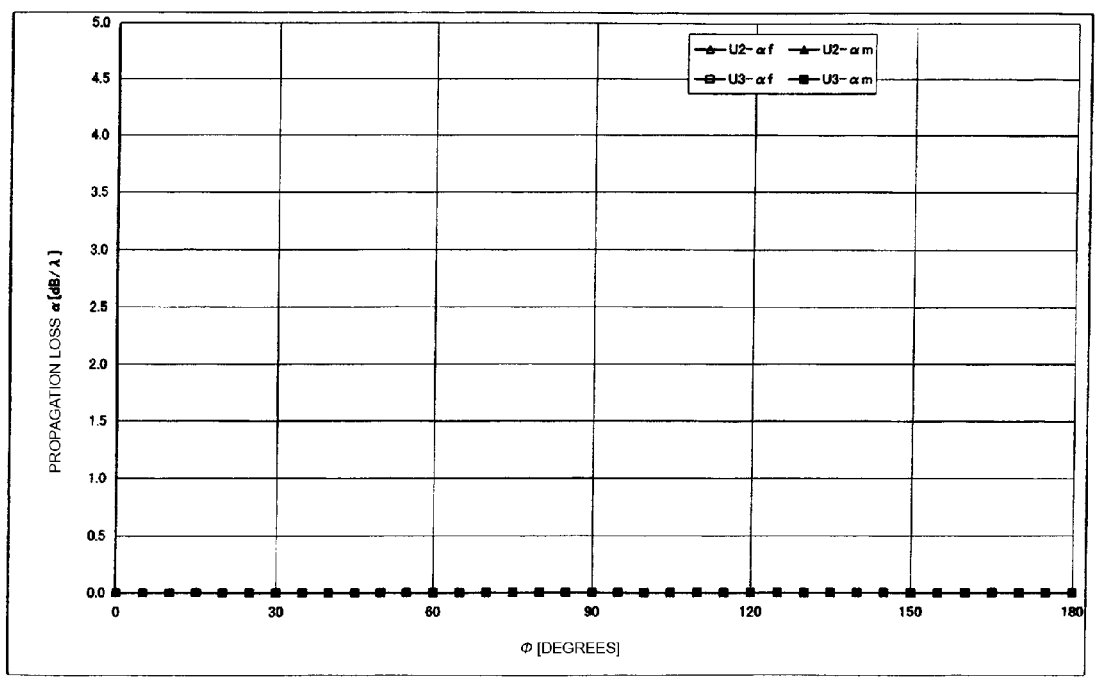
FIG. 37 is a graph showing the relationship between an Euler angle θ and the propagation loss α in the structure in which Au electrodes are formed on a LiNbO$_3$ substrate of (0°, θ, 90°), and a SiO$_2$ film is then formed thereon.
Figure 38:
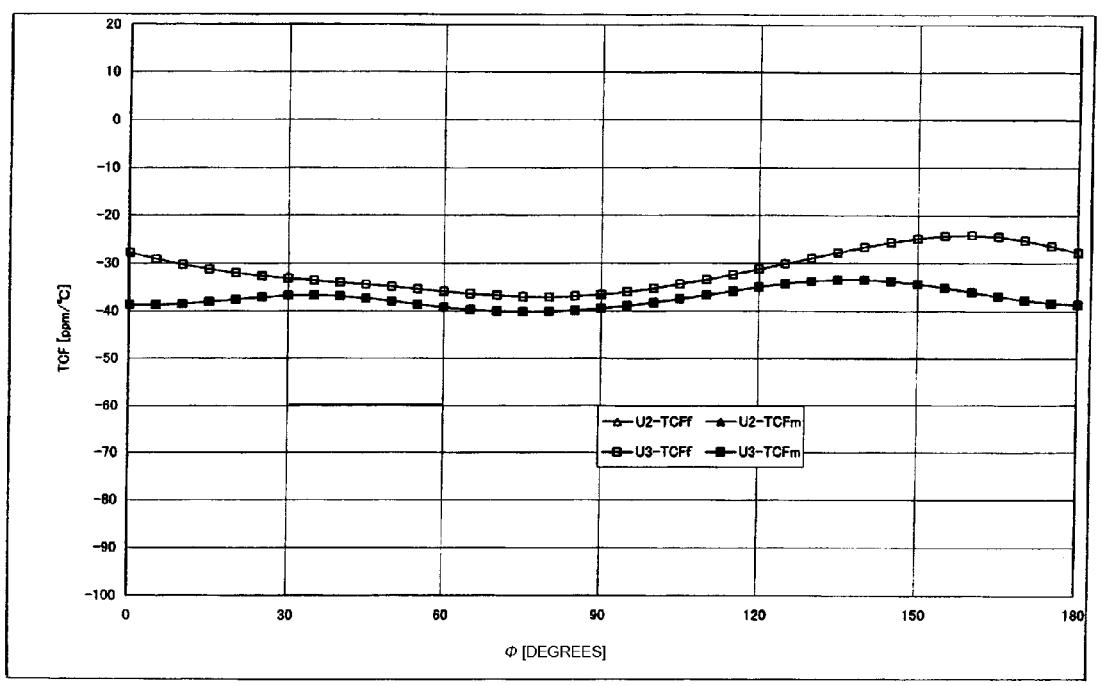
FIG. 38 is a graph showing the relationship between an Euler angle θ and the temperature coefficient of frequency TCF in the structure in which Au electrodes are formed on a LiNbO$_3$ substrate of (0°, θ, 90°), and a SiO$_2$ film is then formed thereon.
Figure 39:
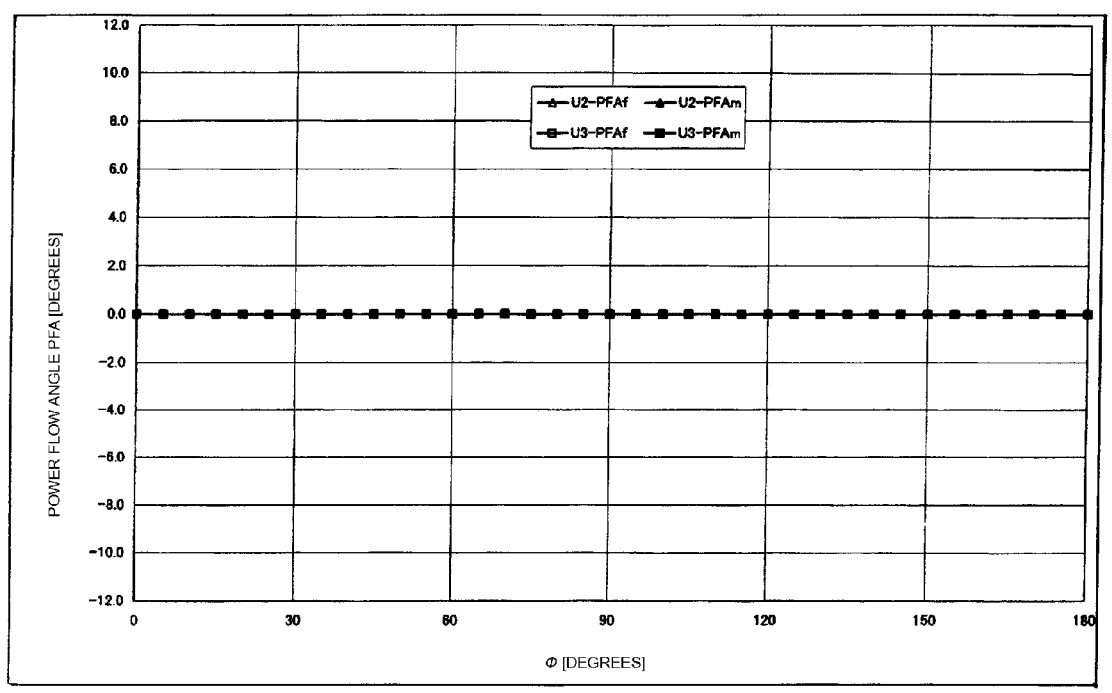
FIG. 39 is a graph showing the relationship between an Euler angle θ and the power flow angle PFA in the structure in which Au electrodes are formed on a LiNbO$_3$ substrate of (0°, θ, 90°), and a SiO$_2$ film is then formed thereon.
Figure 40:
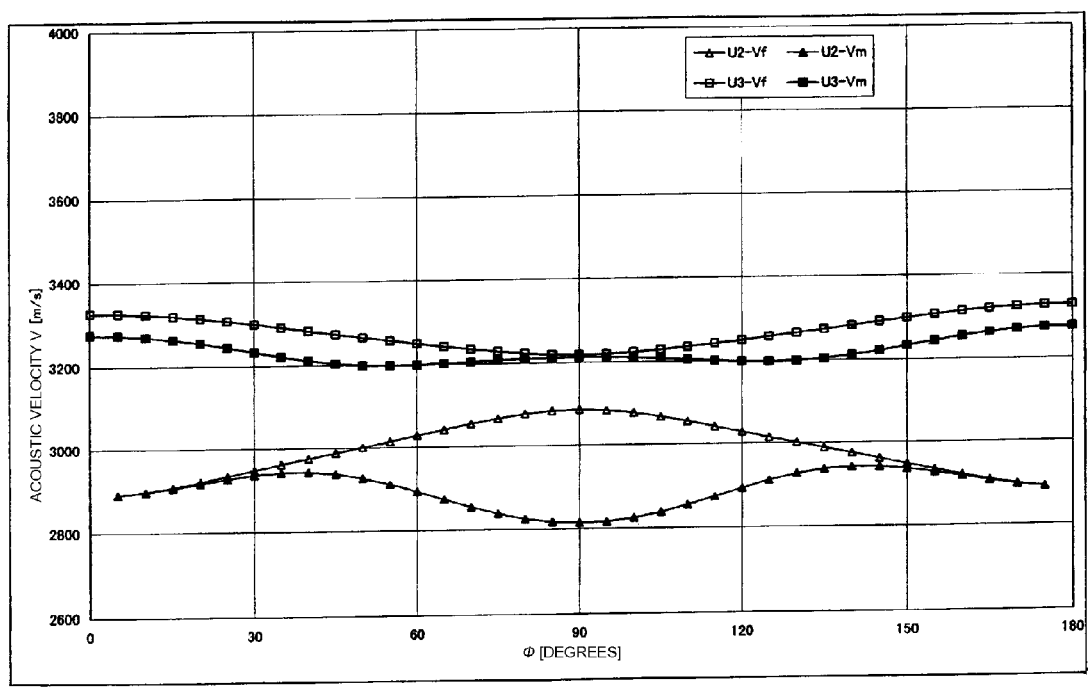
FIG. 40 is a graph showing the relationship between an Euler angle θ and the acoustic velocity V in the structure in which Au electrodes are formed on a LiNbO$_3$ substrate of (90°, θ, 0°), and a SiO$_2$ film is then formed thereon.
Figure 41:
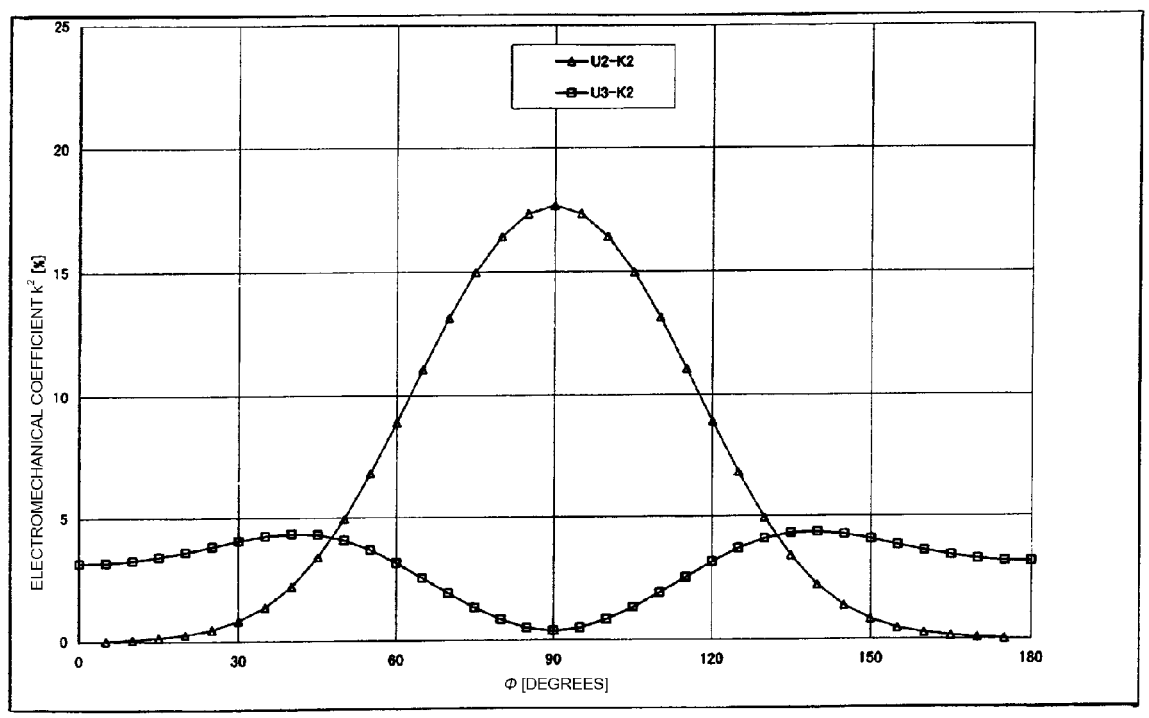
FIG. 41 is a graph showing the relationship between an Euler angle θ and the electromechanical coefficient k$^2$ in the structure in which Au electrodes are formed on a LiNbO$_3$ substrate of (90°, θ, 0°), and a SiO$_2$ film is then formed thereon.
Figure 42:
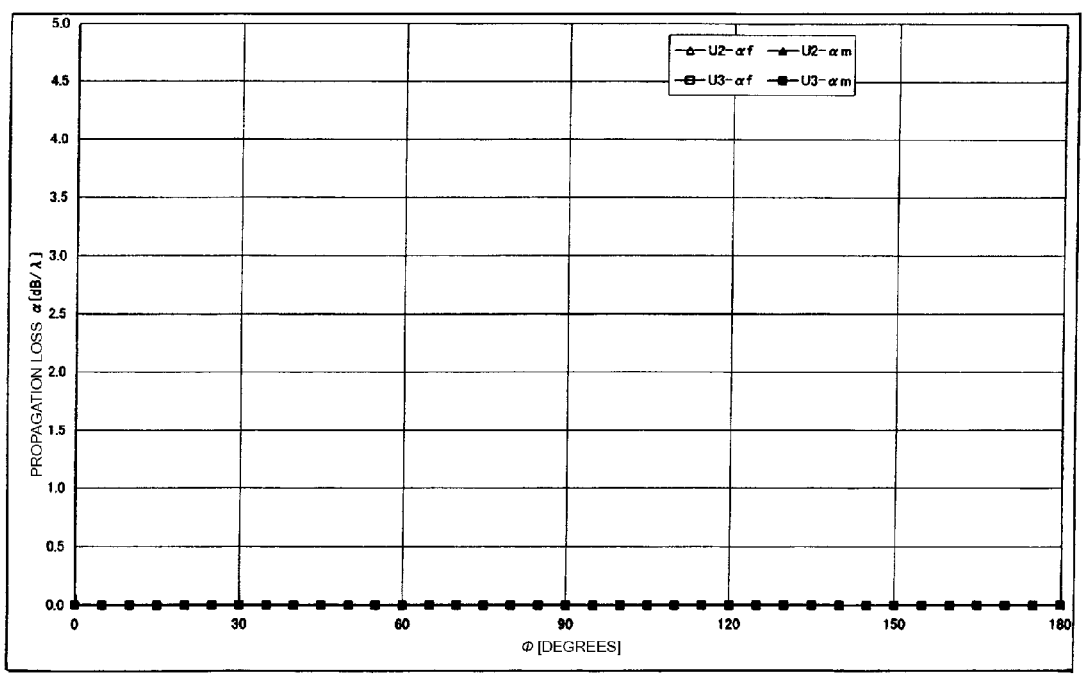
FIG. 42 is a graph showing the relationship between an Euler angle θ and the propagation loss α in the structure in which Au electrodes are formed on a LiNbO$_3$ substrate of (90°, θ, 0°), and a SiO$_2$ film is then formed thereon.
Figure 43:
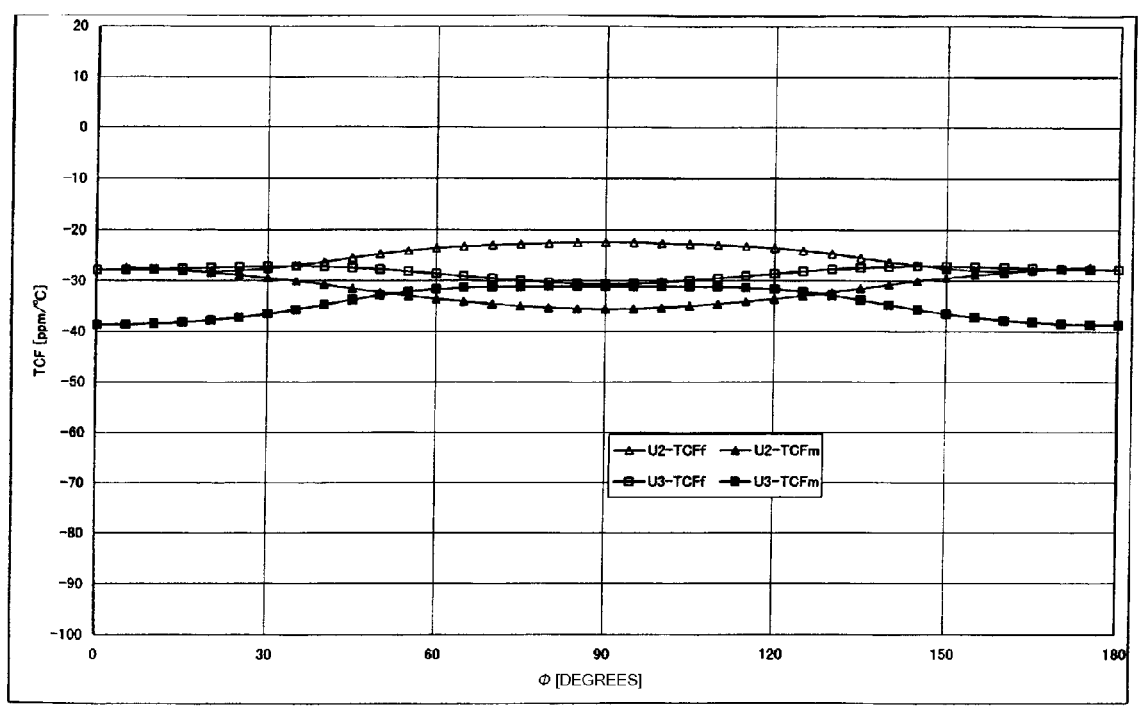
FIG. 43 is a graph showing the relationship between an Euler angle θ and the temperature coefficient of frequency TCF in the structure in which Au electrodes are formed on a LiNbO$_3$ substrate of (90°, θ, 0°), and a SiO$_2$ film is then formed thereon.
Figure 44:
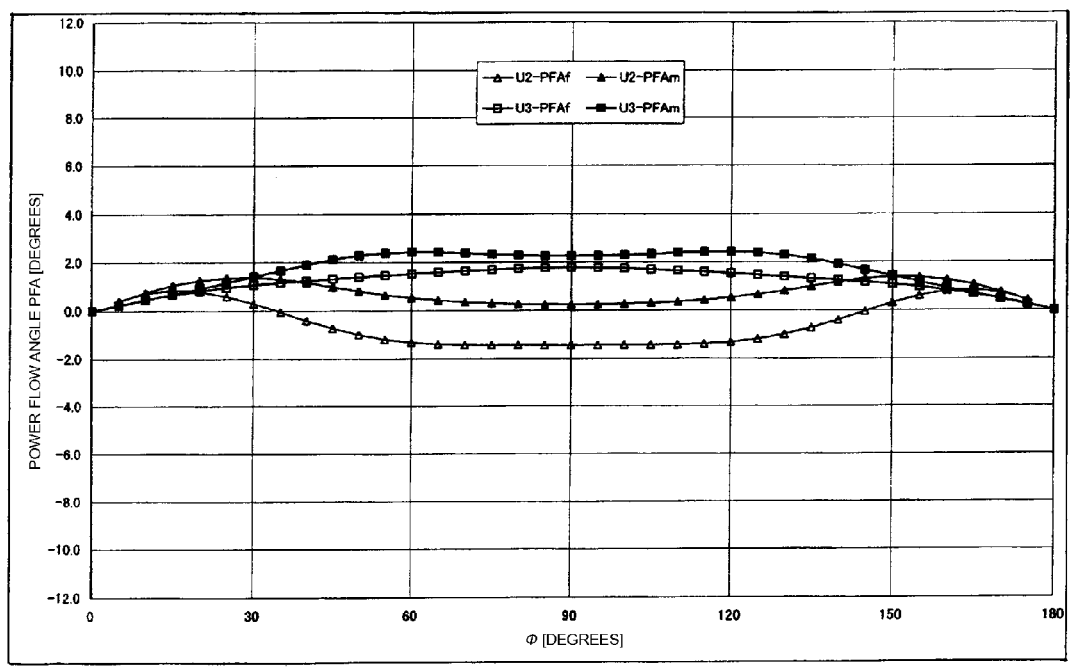
FIG. 44 is a graph showing the relationship between an Euler angle θ and the power flow angle PFA in the structure in which Au electrodes are formed on a LiNbO$_3$ substrate of (90°, θ, 0°), and a SiO$_2$ film is then formed thereon.
Figure 45:
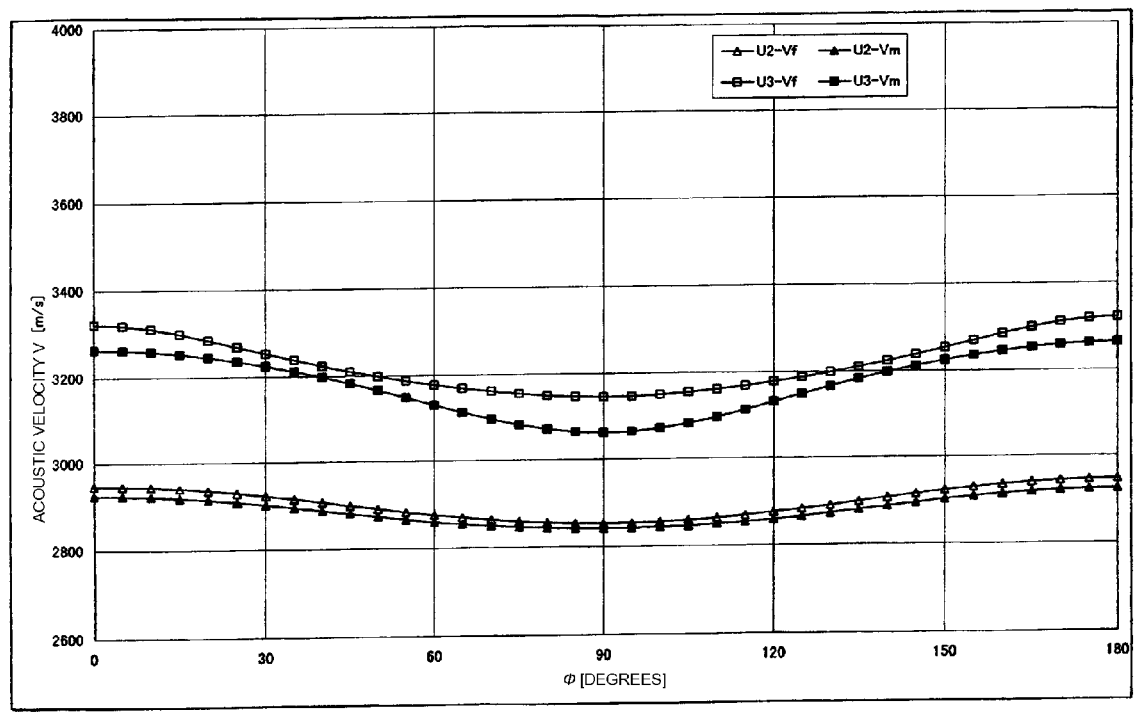
FIG. 45 is a graph showing the relationship between an Euler angle θ and the acoustic velocity V in the structure in which Au electrodes are formed on a LiNbO$_3$ substrate of (90°, θ, 90°), and a SiO$_2$ film is then formed thereon.
Figure 46:
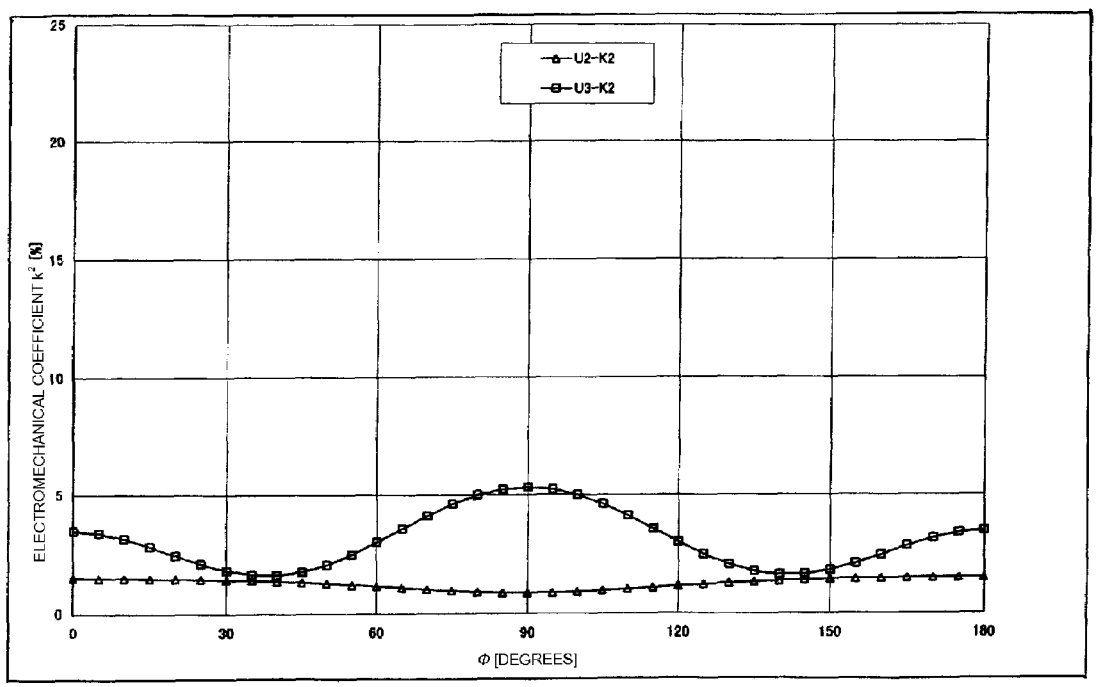
FIG. 46 is a graph showing the relationship between an Euler angle θ and the electromechanical coefficient k$^2$ in the structure in which Au electrodes are formed on a LiNbO$_3$ substrate of (90°, θ, 90°), and a SiO$_2$ film is then formed thereon.
Figure 47:
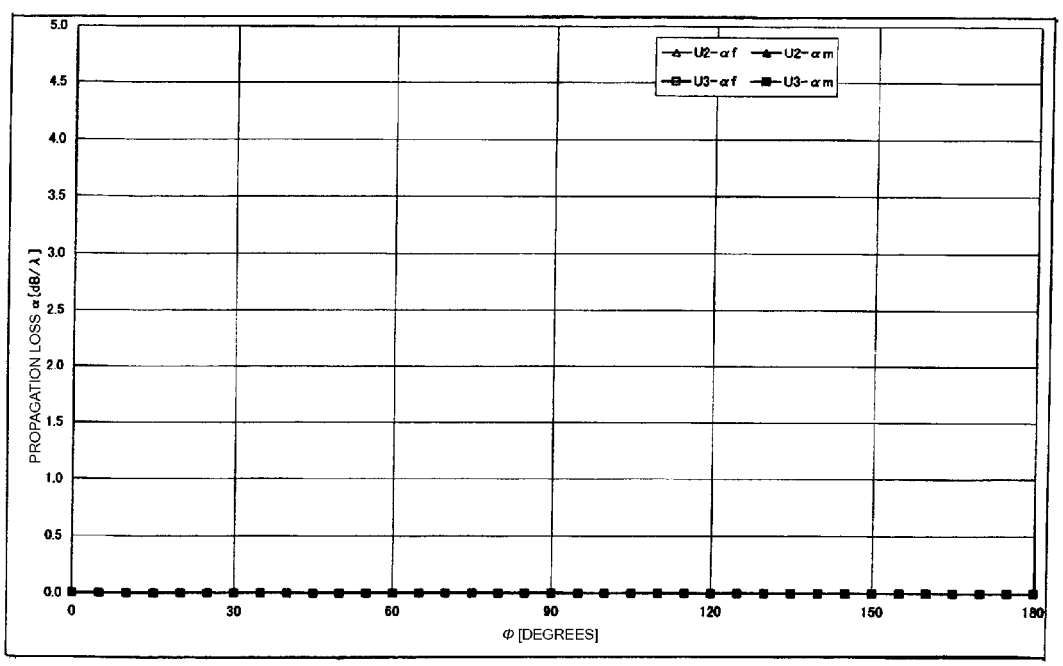
FIG. 47 is a graph showing the relationship between an Euler angle θ and the propagation loss α in the structure in which Au electrodes are formed on a LiNbO$_3$ substrate of (90°, θ, 90°), and a SiO$_2$ film is then formed thereon.
Figure 48:
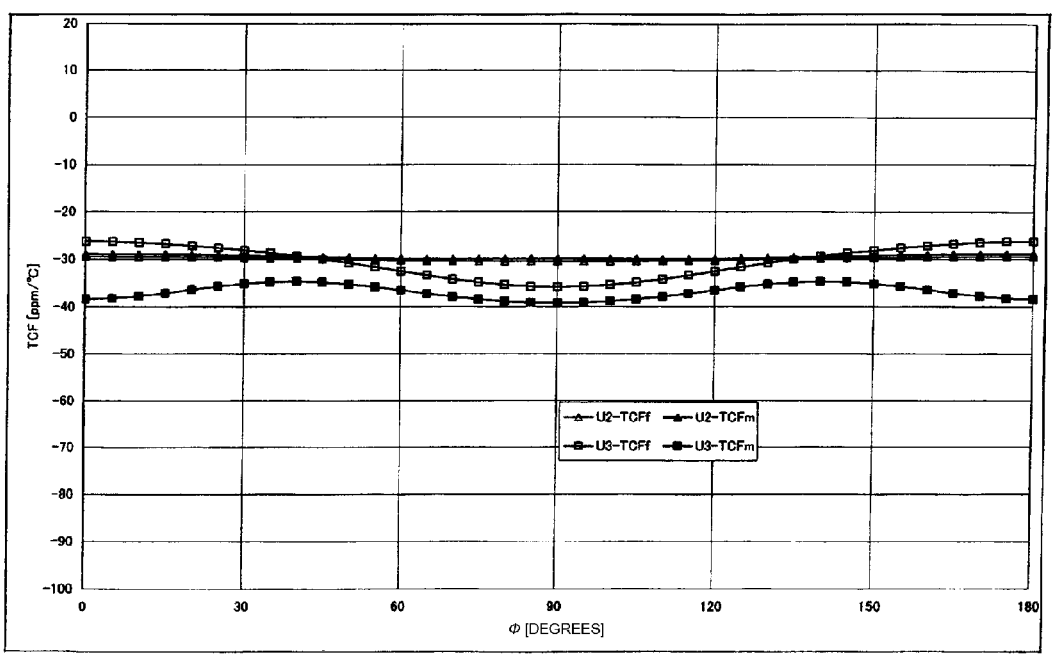
FIG. 48 is a graph showing the relationship between an Euler angle θ and the temperature coefficient of frequency TCF in the structure in which Au electrodes are formed on a LiNbO$_3$ substrate of (90°, θ, 90°), and a SiO$_2$ film is then formed thereon.
Figure 49:
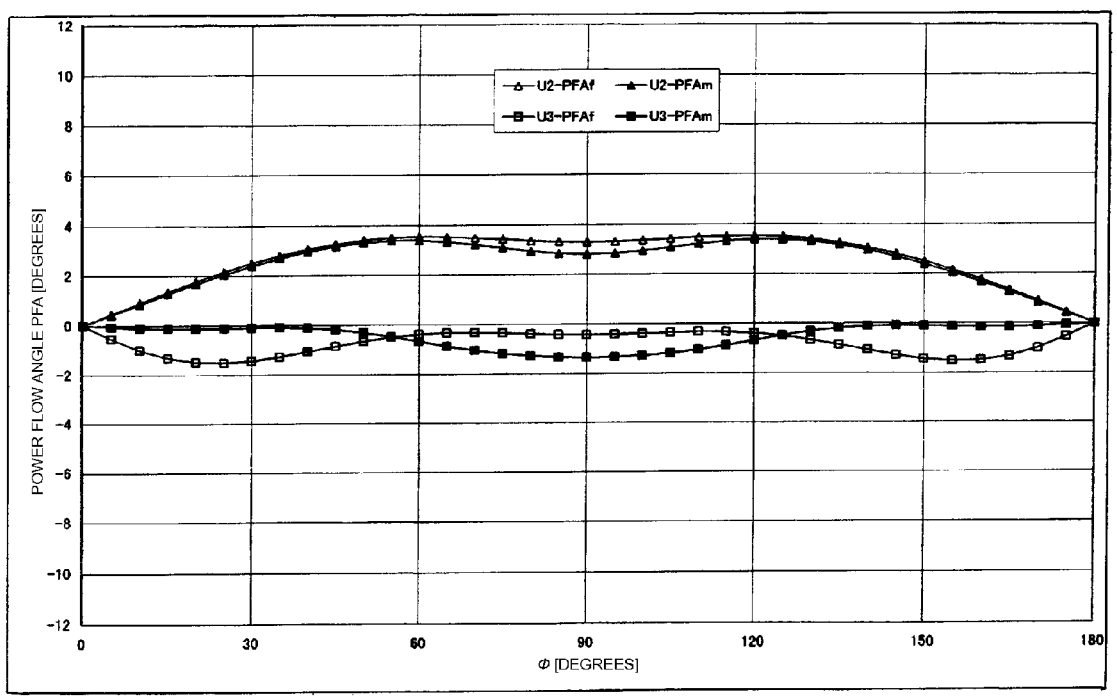
FIG. 49 is a graph showing the relationship between an Euler angle θ and the power flow angle PFA in the structure in which Au electrodes are formed on a LiNbO$_3$ substrate of (90°, θ, 90°), and a SiO$_2$ film is then formed thereon.
Figure 50:
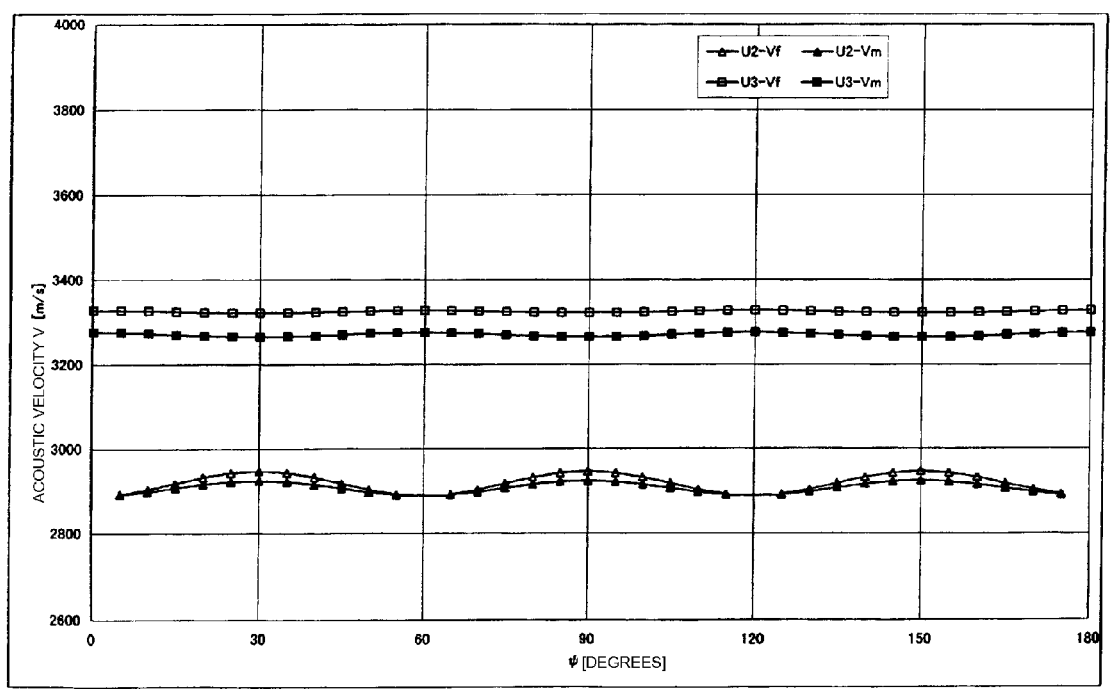
FIG. 50 is a graph showing the relationship between an Euler angle ψ and the acoustic velocity V in the structure in which Au electrodes are formed on a LiNbO$_3$ substrate of (0°, 0°, ψ), and a SiO$_2$ film is then formed thereon.
Figure 51:
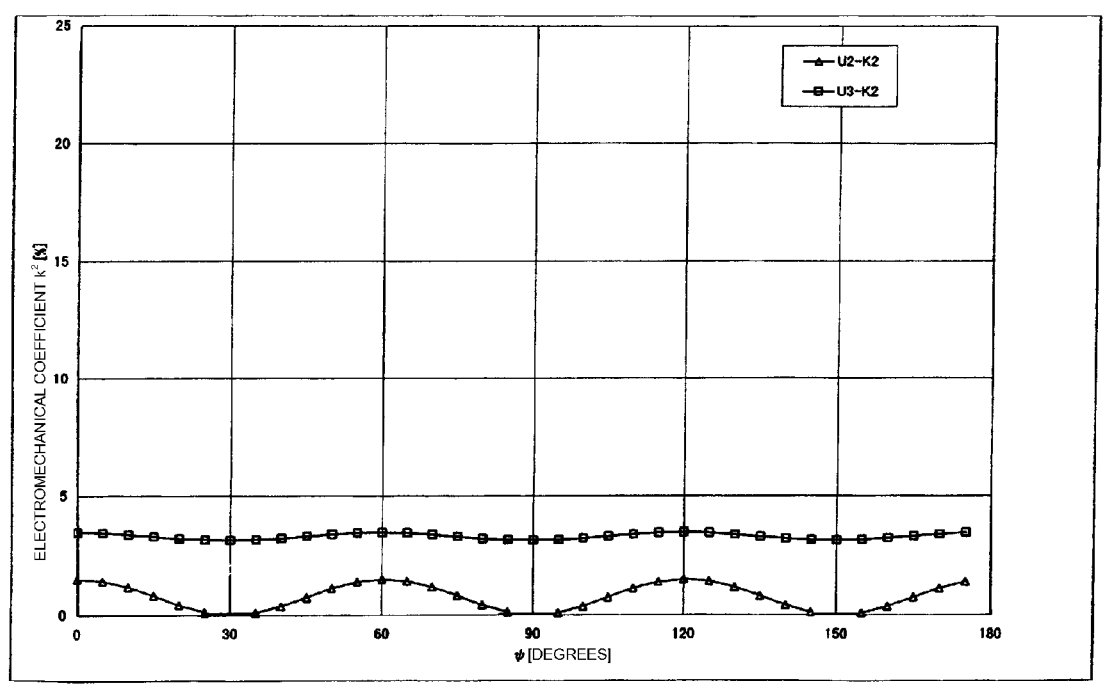
FIG. 51 is a graph showing the relationship between an Euler angle ψ and the electromechanical coefficient k$^2$ in the structure in which Au electrodes are formed on a LiNbO$_3$ substrate of (0°, 0°, ψ), and a SiO$_2$ film is then formed thereon.
Figure 52:
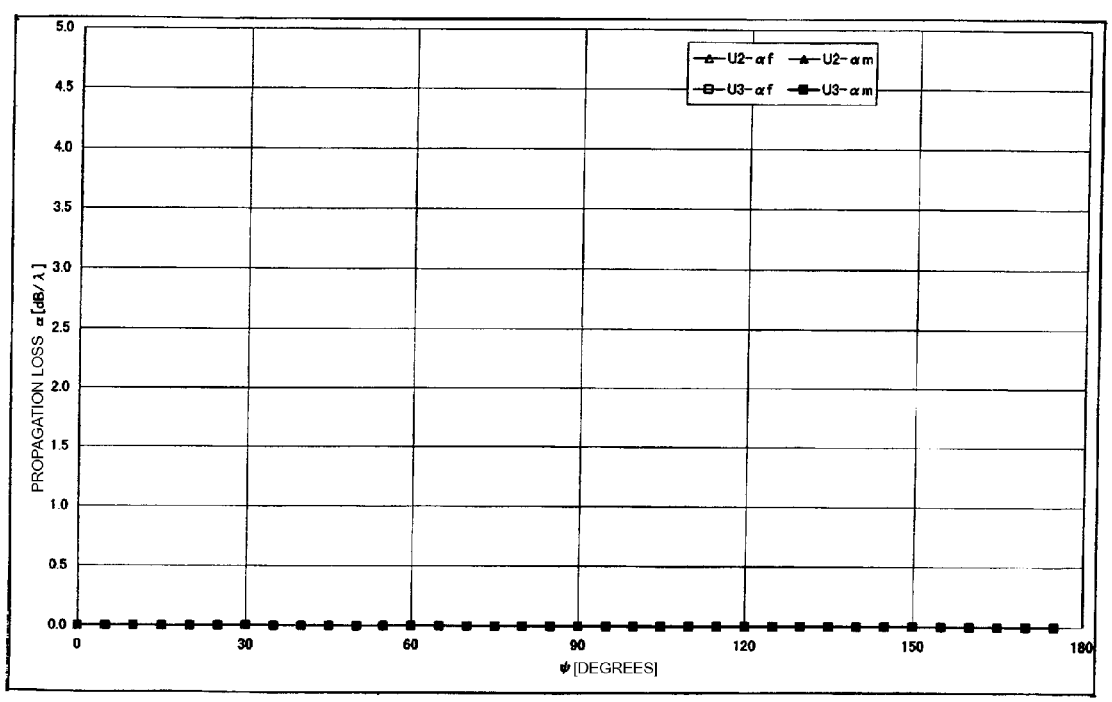
FIG. 52 is a graph showing the relationship between an Euler angle ψ and the propagation loss α in the structure in which Au electrodes are formed on a LiNbO$_3$ substrate of (0°, 0°, ψ), and a SiO$_2$ film is then formed thereon.
Figure 53:
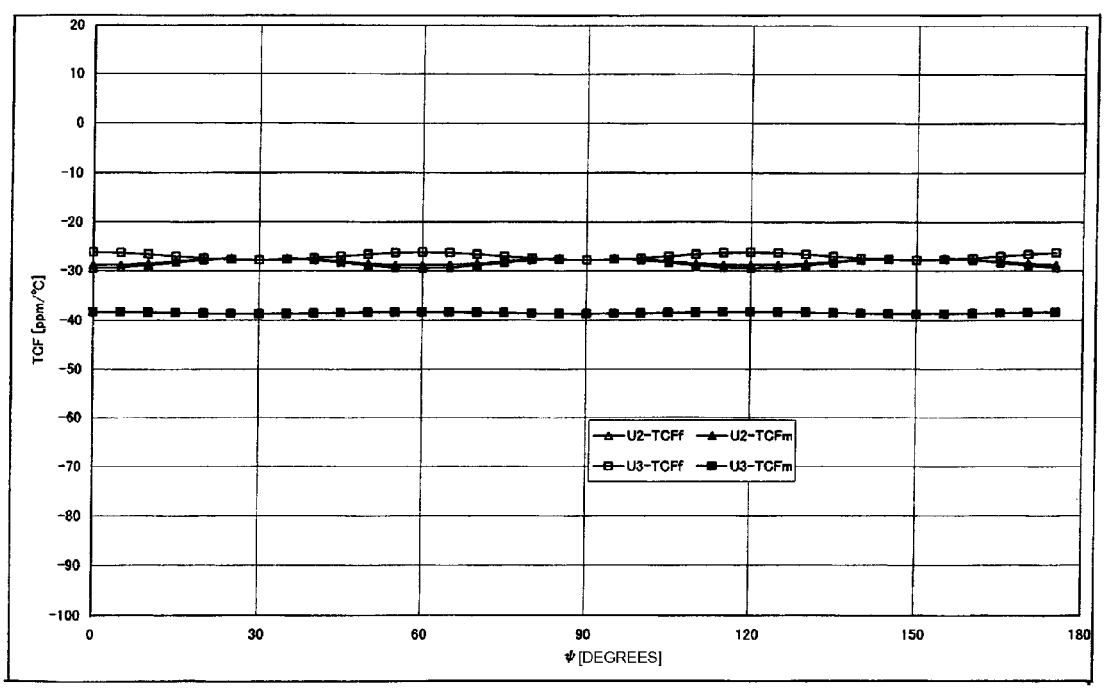
FIG. 53 is a graph showing the relationship between an Euler angle ψ and the temperature coefficient of frequency TCF in the structure in which Au electrodes are formed on a LiNbO$_3$ substrate of (0°, 0°, ψ), and a SiO$_2$ film is then formed thereon.
Figure 54:
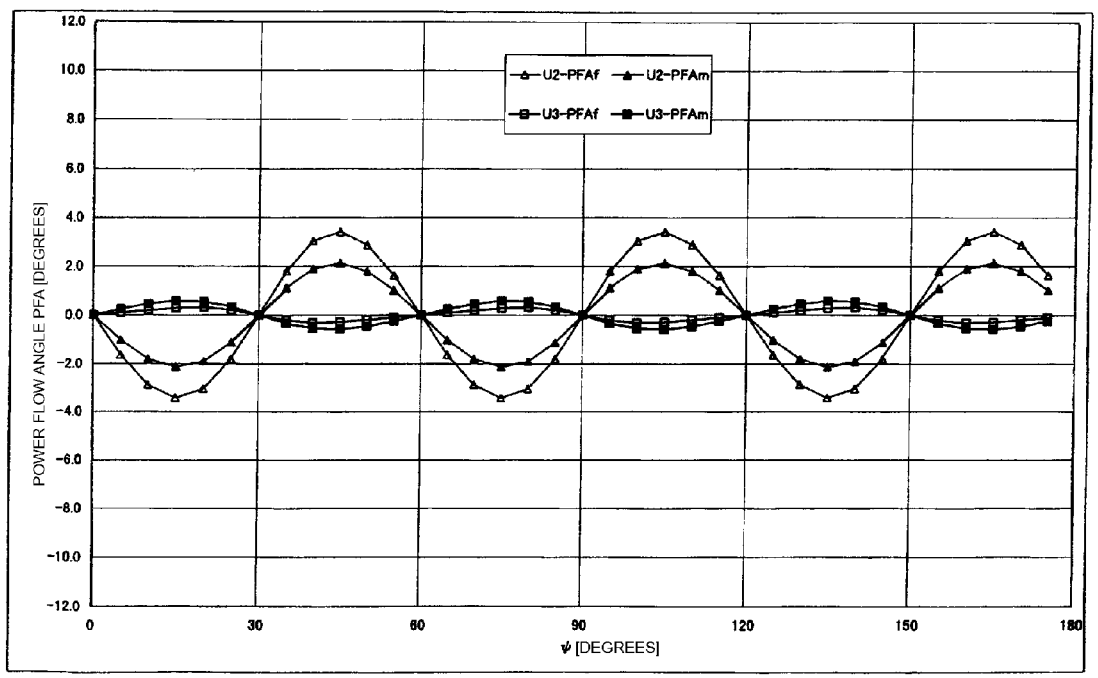
FIG. 54 is a graph showing the relationship between an Euler angle ψ and the power flow angle PFA in the structure in which Au electrodes are formed on a LiNbO$_3$ substrate of (0°, 0°, ψ), and a SiO$_2$ film is then formed thereon.
Figure 55:
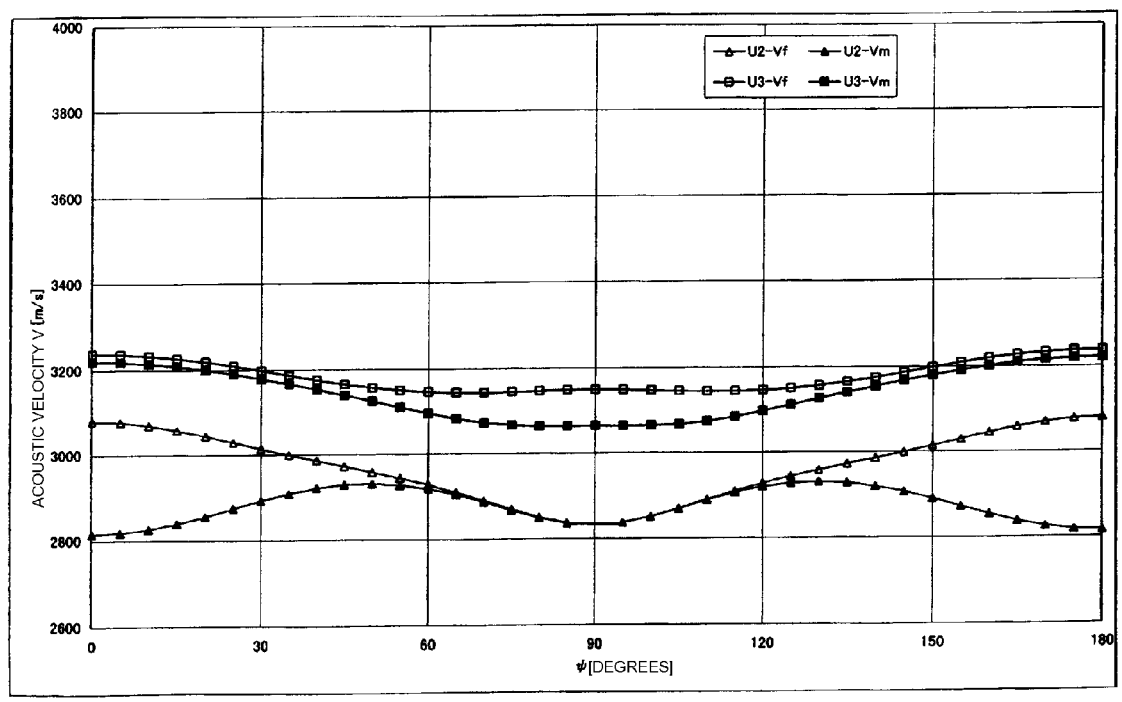
FIG. 55 is a graph showing the relationship between an Euler angle ψ and the acoustic velocity V in the structure in which Au electrodes are formed on a LiNbO$_3$ substrate of (0°, 90°, ψ), and a SiO$_2$ film is then formed thereon.
Figure 56:
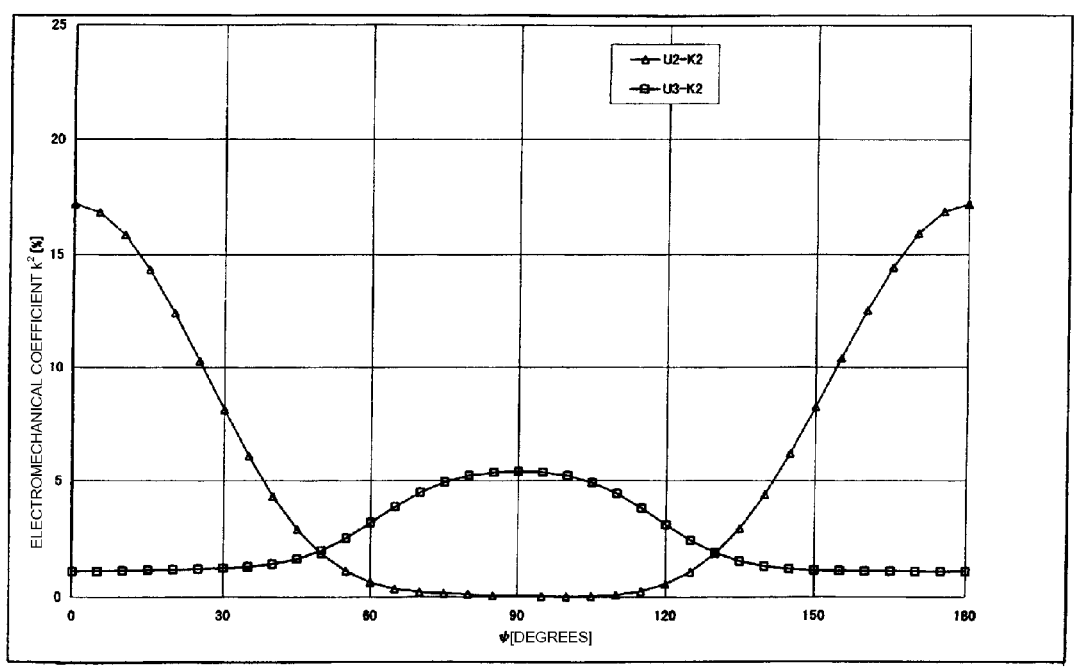
FIG. 56 is a graph showing the relationship between an Euler angle ψ and the electromechanical coefficient k$^2$ in the structure in which Au electrodes are formed on a LiNbO$_3$ substrate of (0°, 90°, ψ), and a SiO$_2$ film is then formed thereon.
Figure 57:
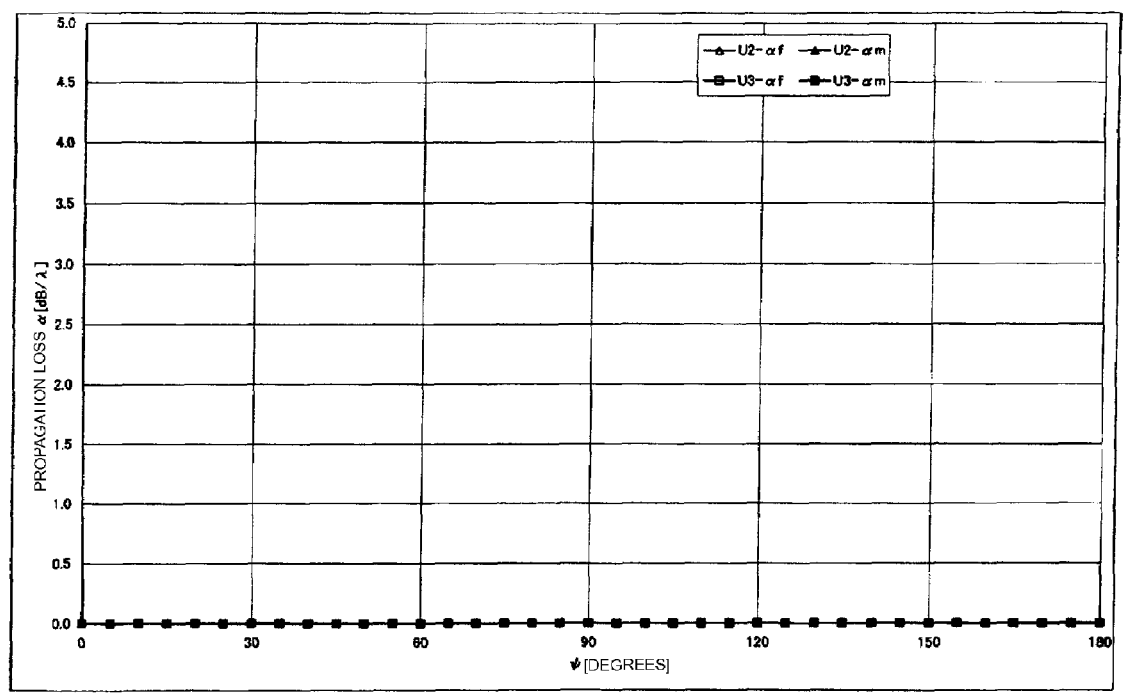
FIG. 57 is a graph showing the relationship between an Euler angle ψ and the propagation loss α in the structure in which Au electrodes are formed on a LiNbO$_3$ substrate of (0°, 90°, ψ), and a SiO$_2$ film is then formed thereon.
Figure 58:
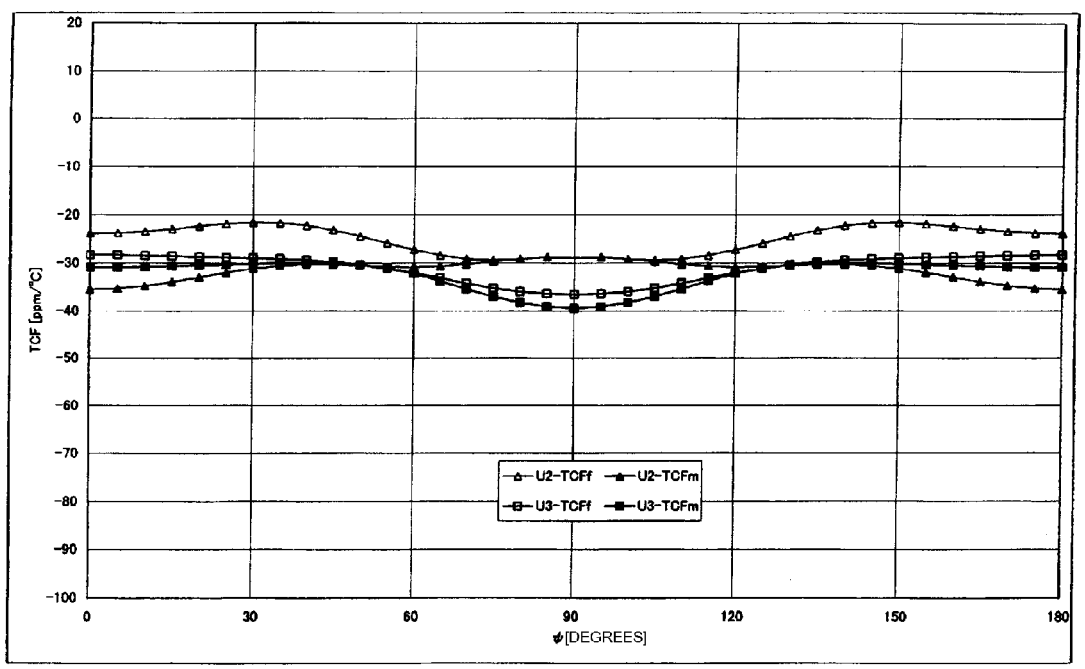
FIG. 58 is a graph showing the relationship between an Euler angle ψ and the temperature coefficient of frequency TCF in the structure in which Au electrodes are formed on a LiNbO$_3$ substrate of (0°, 90°, ψ), and a SiO$_2$ film is then formed thereon.
Figure 59:
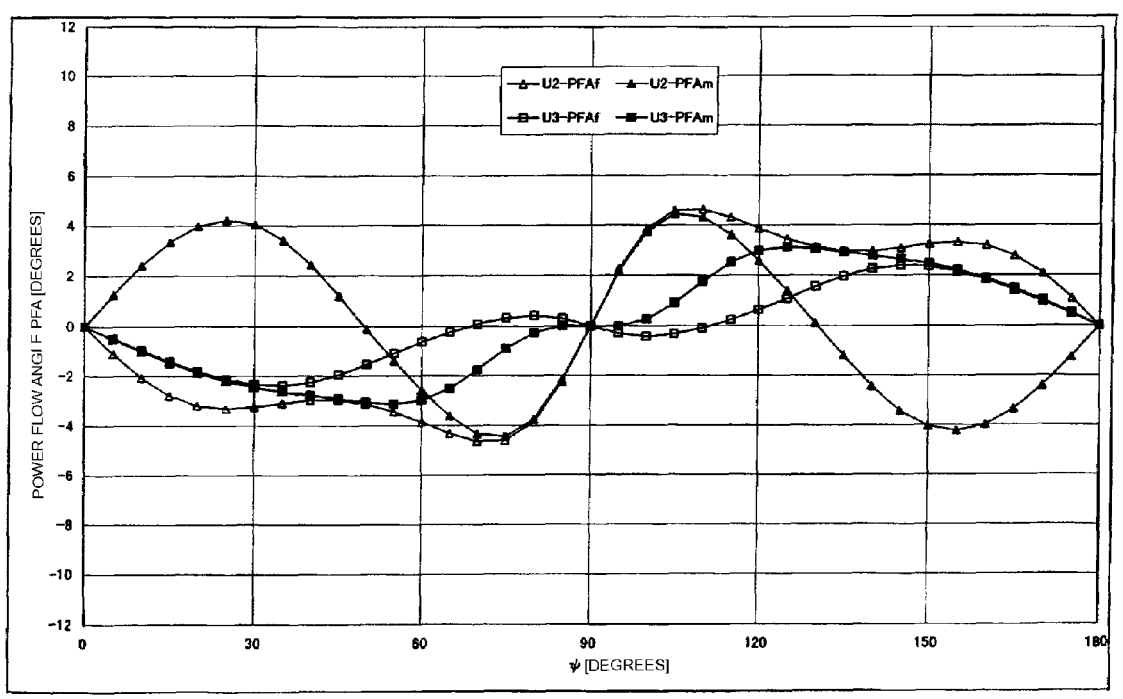
FIG. 59 is a graph showing the relationship between an Euler angle ψ and the power flow angle PFA in the structure in which Au electrodes are formed on a LiNbO$_3$ substrate of (0°, 90°, ψ), and a SiO$_2$ film is then formed thereon.
Figure 60:
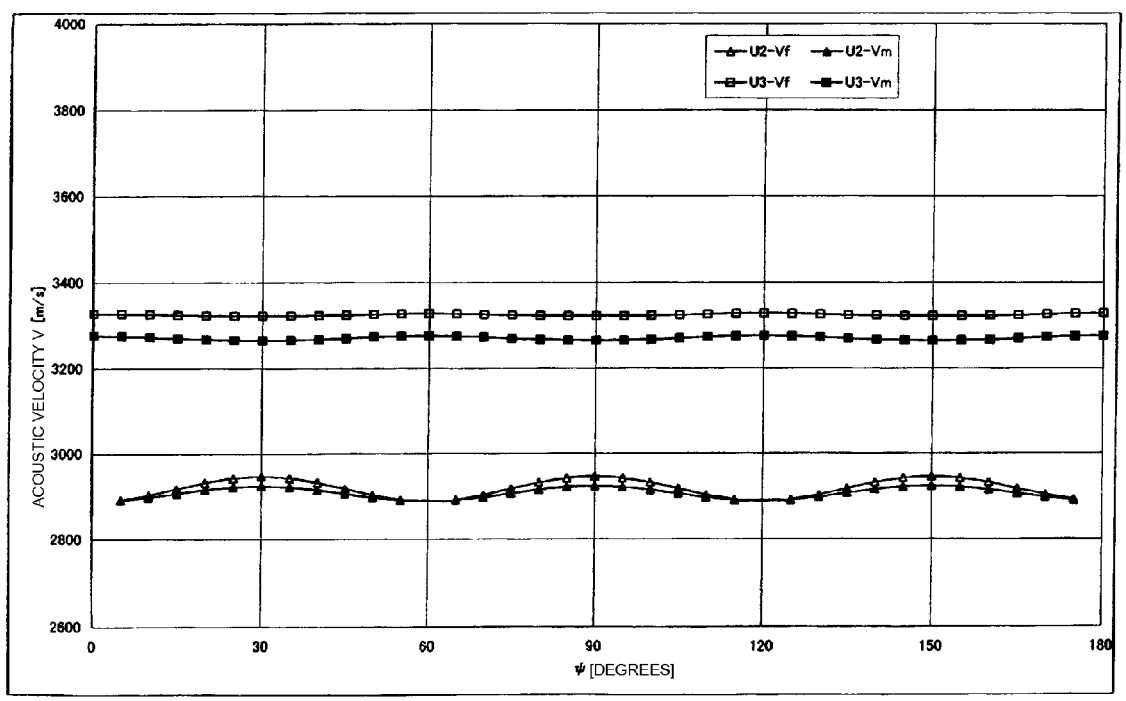
FIG. 60 is a graph showing the relationship between an Euler angle ψ and the acoustic velocity V in the structure in which Au electrodes are formed on a LiNbO$_3$ substrate of (90°, 0°, ψ), and a SiO$_2$ film is then formed thereon.
Figure 61:
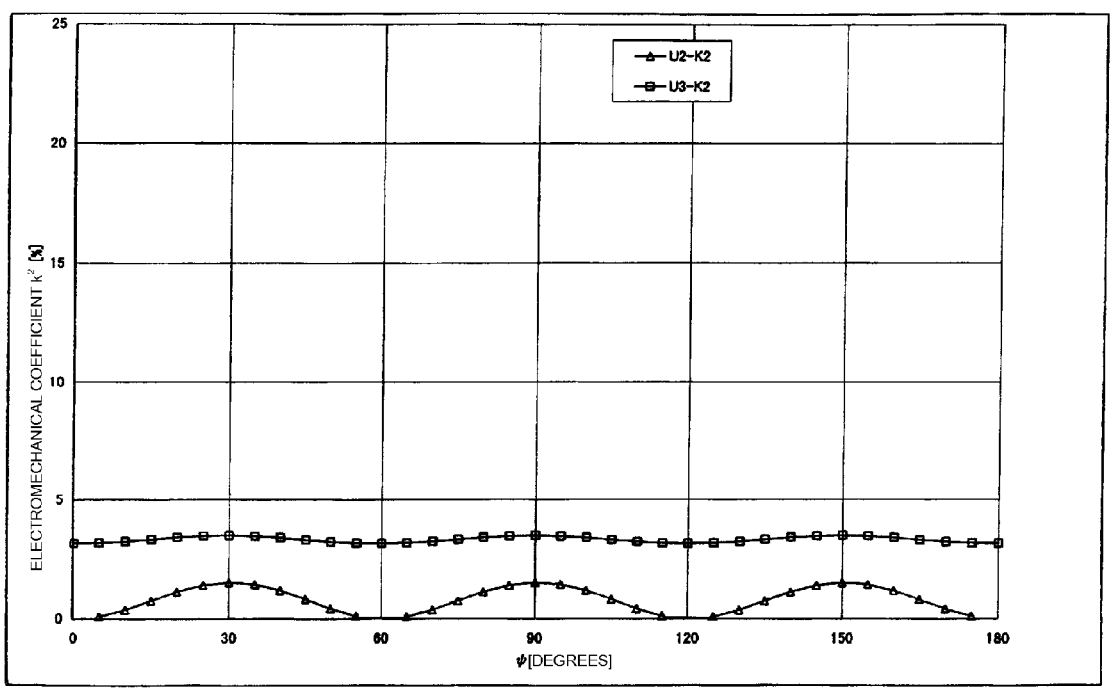
FIG. 61 is a graph showing the relationship between an Euler angle ψ and the electromechanical coefficient k$^2$ in the structure in which Au electrodes are formed on a LiNbO$_3$ substrate of (90°, 0°, ψ), and a SiO$_2$ film is then formed thereon.
Figure 62:
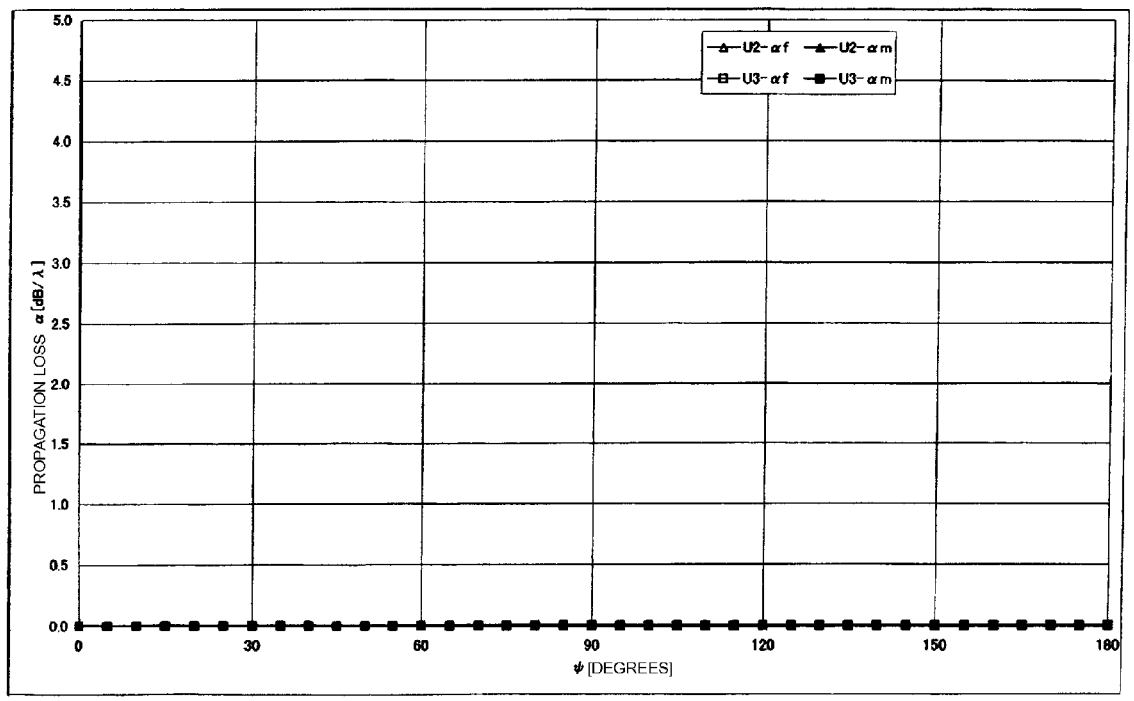
FIG. 62 is a graph showing the relationship between an Euler angle ψ and the propagation loss α in the structure in which Au electrodes are formed on a LiNbO$_3$ substrate of (90°, 0°, ψ), and a SiO$_2$ film is then formed thereon.
Figure 63:
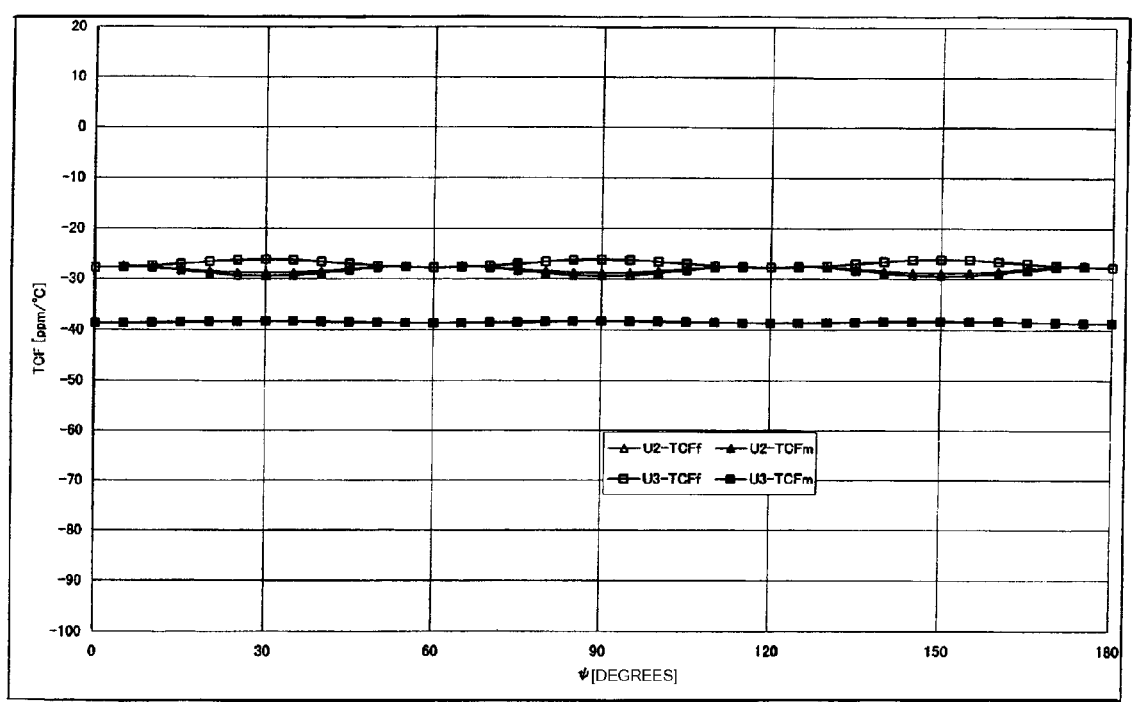
FIG. 63 is a graph showing the relationship between an Euler angle ψ and the temperature coefficient of frequency TCF in the structure in which Au electrodes are formed on a LiNbO$_3$ substrate of (90°, 0°, ψ), and a SiO$_2$ film is then formed thereon.
Figure 64:
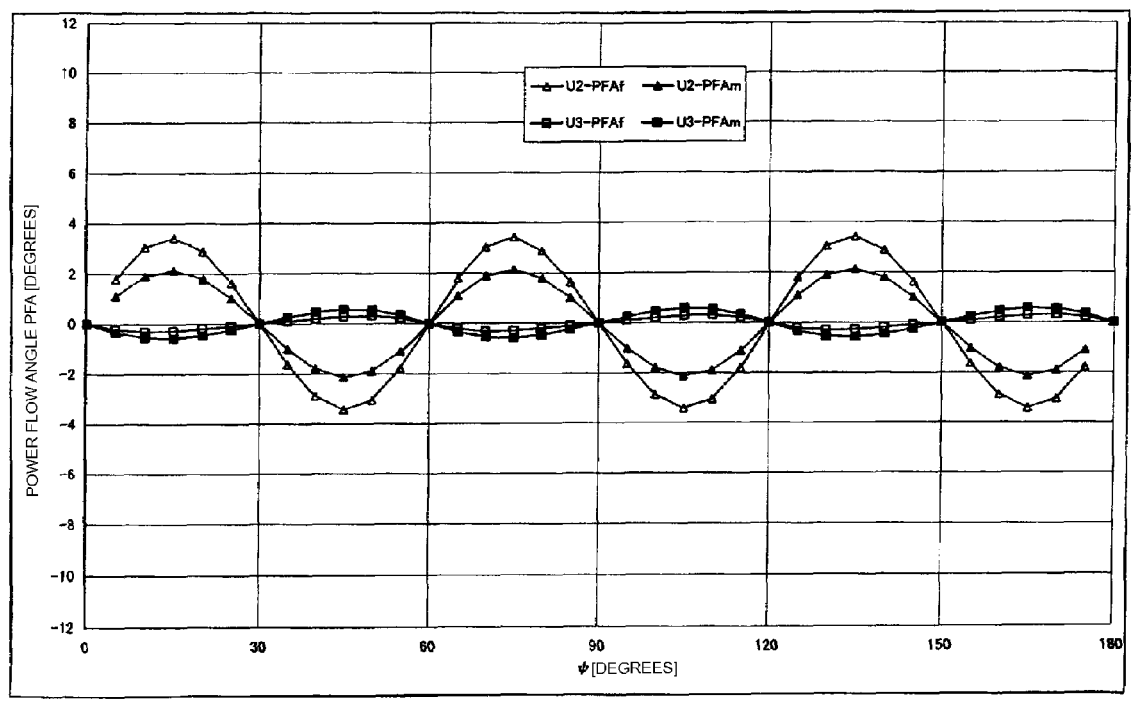
FIG. 64 is a graph showing the relationship between an Euler angle ψ and the power flow angle PFA in the structure in which Au electrodes are formed on a LiNbO$_3$ substrate of (90°, 0°, ψ), and a SiO$_2$ film is then formed thereon.
Figure 65:
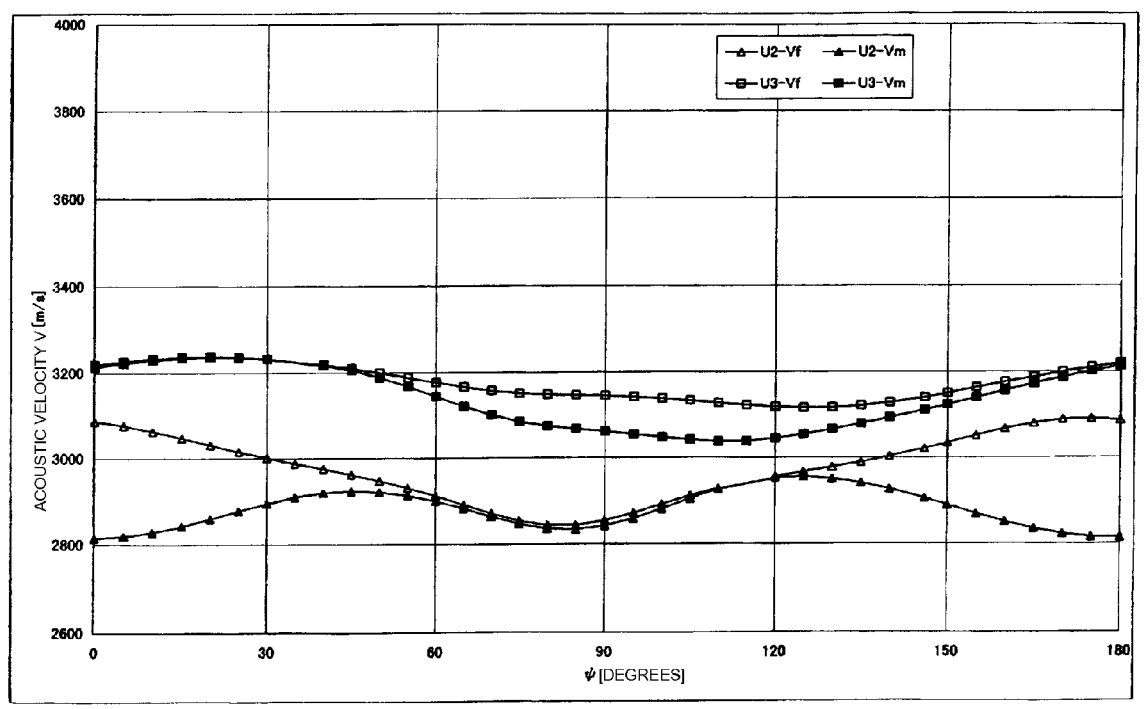
FIG. 65 is a graph showing the relationship between an Euler angle ψ and the acoustic velocity V in the structure in which Au electrodes are formed on a LiNbO$_3$ substrate of (90°, 90°, ψ), and a SiO$_2$ film is then formed thereon.
Figure 66:
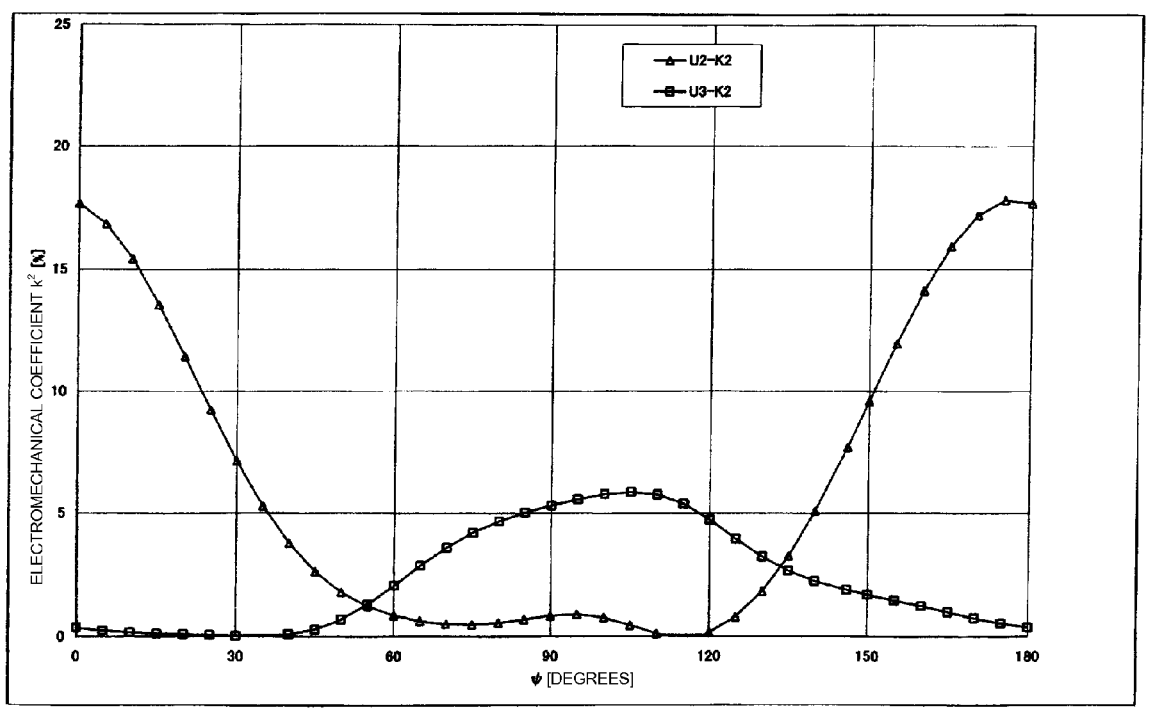
FIG. 66 is a graph showing the relationship between an Euler angle ψ and the electromechanical coefficient k$^2$ in the structure in which Au electrodes are formed on a LiNbO$_3$ substrate of (90°, 90°, ψ), and a SiO$_2$ film is then formed thereon.
Figure 67:
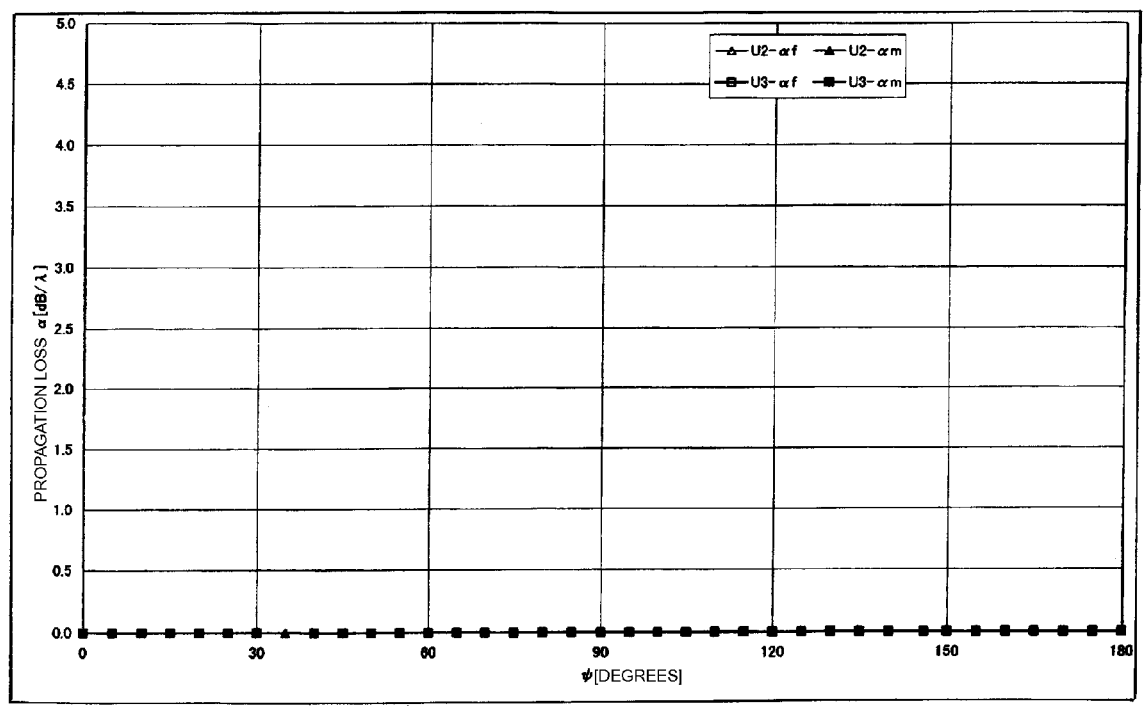
FIG. 67 is a graph showing the relationship between an Euler angle ψ and the propagation loss α in the structure in which Au electrodes are formed on a LiNbO$_3$ substrate of (90°, 90°, ψ), and a SiO$_2$ film is then formed thereon.
Figure 68:
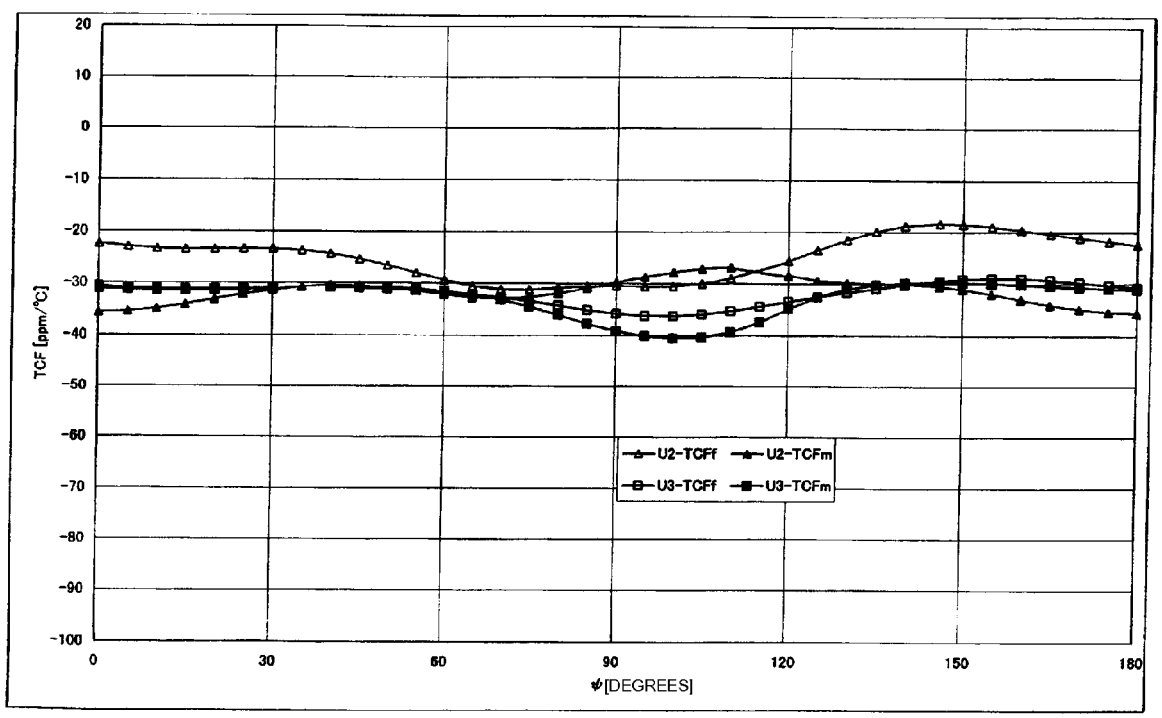
FIG. 68 is a graph showing the relationship between an Euler angle ψ and the temperature coefficient of frequency TCF in the structure in which Au electrodes are formed on a LiNbO$_3$ substrate of (90°, 90°, ψ), and a SiO$_2$ film is then formed thereon.
Figure 69:
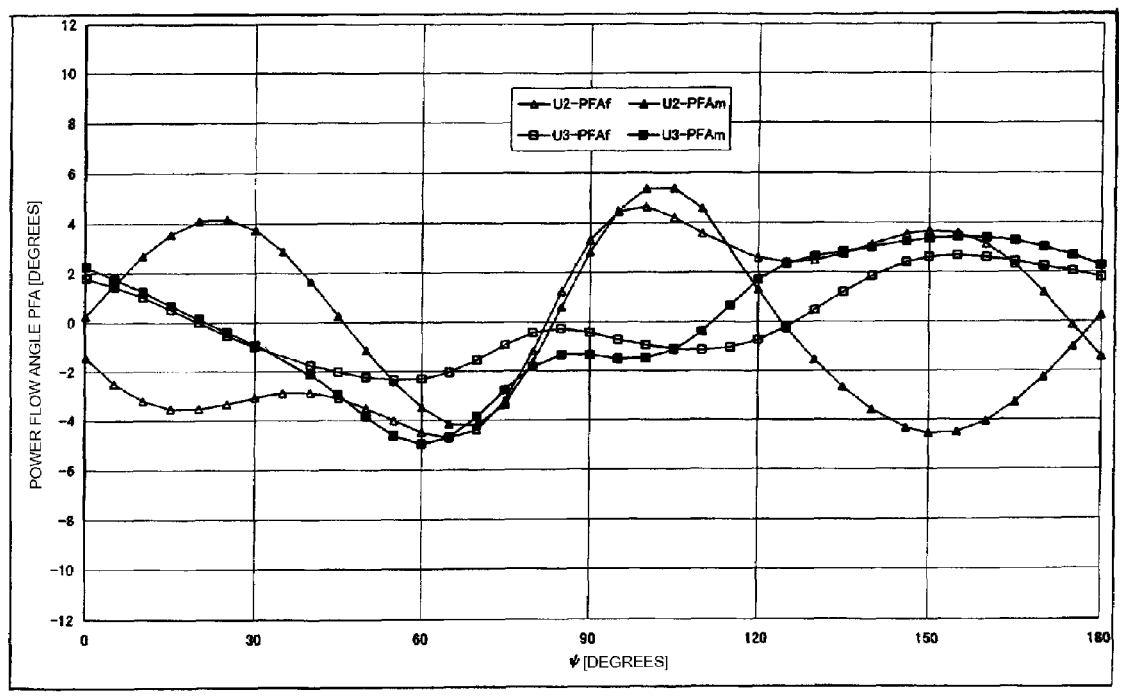
FIG. 69 is a graph showing the relationship between an Euler angle ψ and the power flow angle PFA in the structure in which Au electrodes are formed on a LiNbO$_3$ substrate of (90°, 90°, ψ), and a SiO$_2$ film is then formed thereon.
Figure 70:
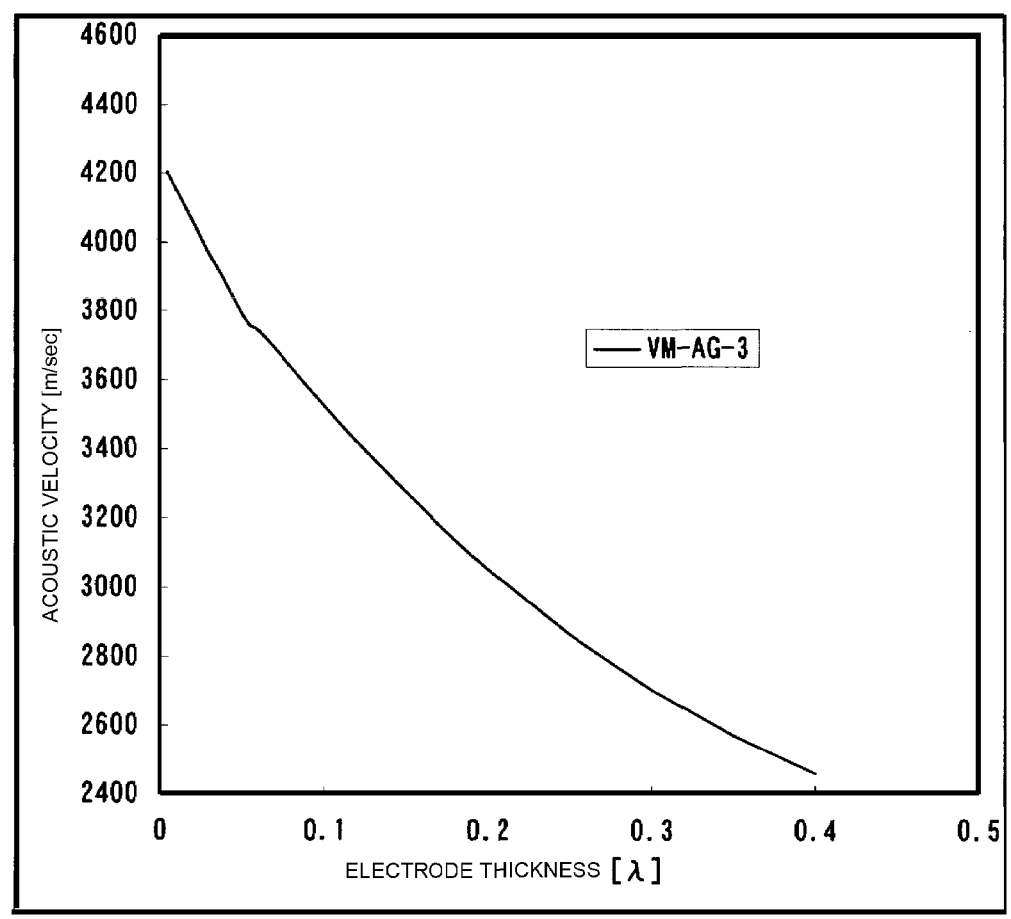
FIG. 70 is a graph showing the relationship between the electrode thickness and the acoustic velocity of a Stoneley wave in a boundary acoustic wave device formed in Example 3 in which the electrodes are formed from Ag.
Figure 71:
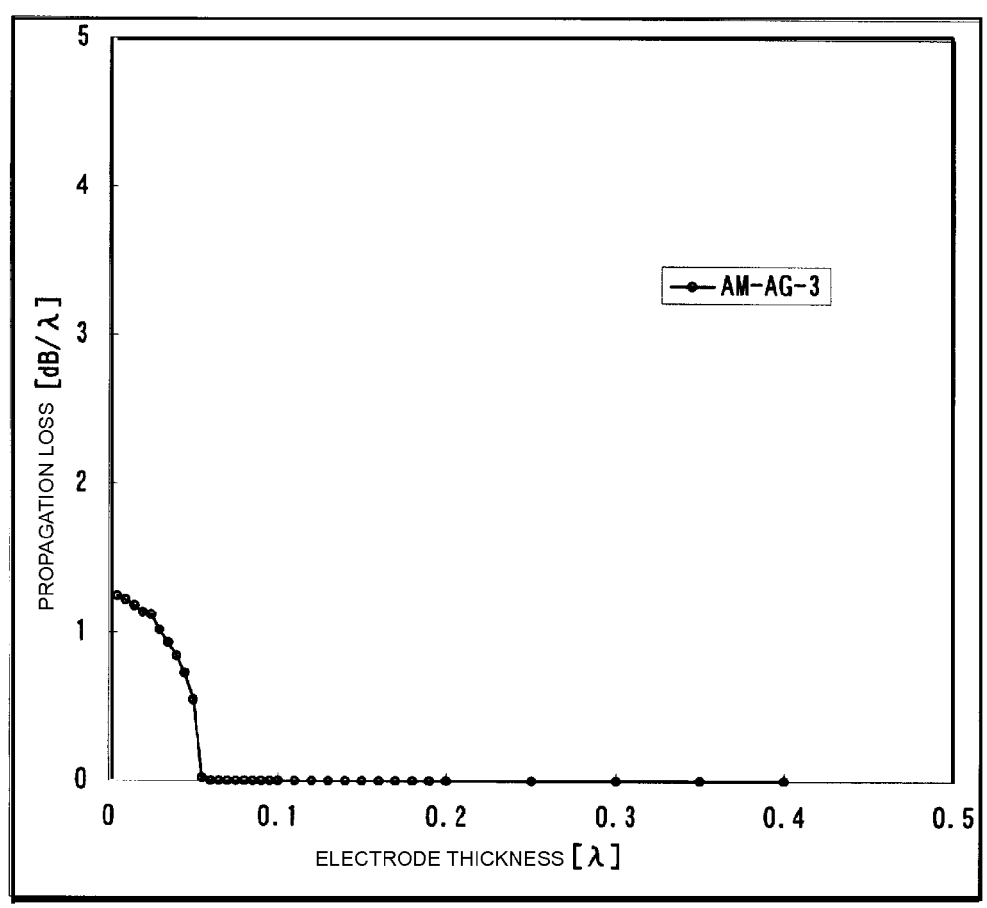
FIG. 71 is a graph showing the relationship between the electrode thickness and the propagation loss α of a Stoneley wave in a boundary acoustic wave device formed in Example 3 in which the electrodes are formed from Ag.
Figure 72:
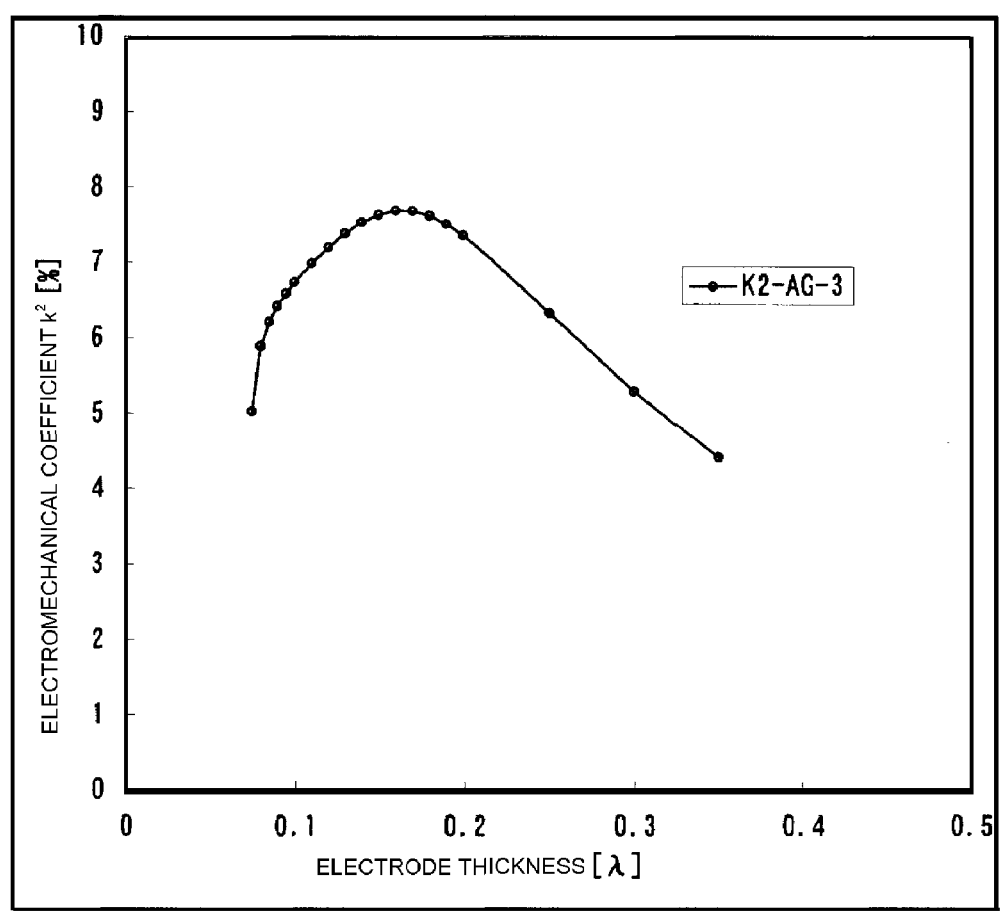
FIG. 72 is a graph showing the relationship between the electrode thickness and the electromechanical coefficient k$^2$ of a Stoneley wave in a boundary acoustic wave device formed in Example 3 in which the electrodes are formed from Ag.
Figure 73:
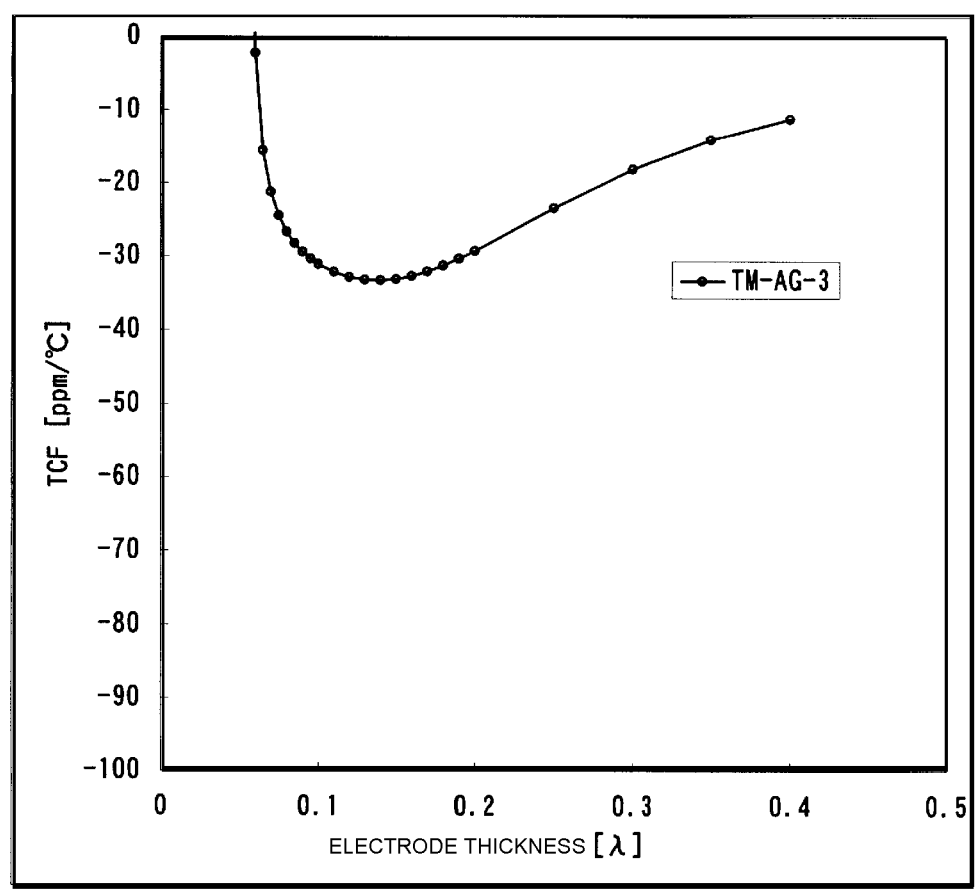
FIG. 73 is a graph showing the relationship between the electrode thickness and the temperature coefficient of frequency TCF of a Stoneley wave in a boundary acoustic wave device formed in Example 3 in which the electrodes are formed from Ag.
Figure 74:
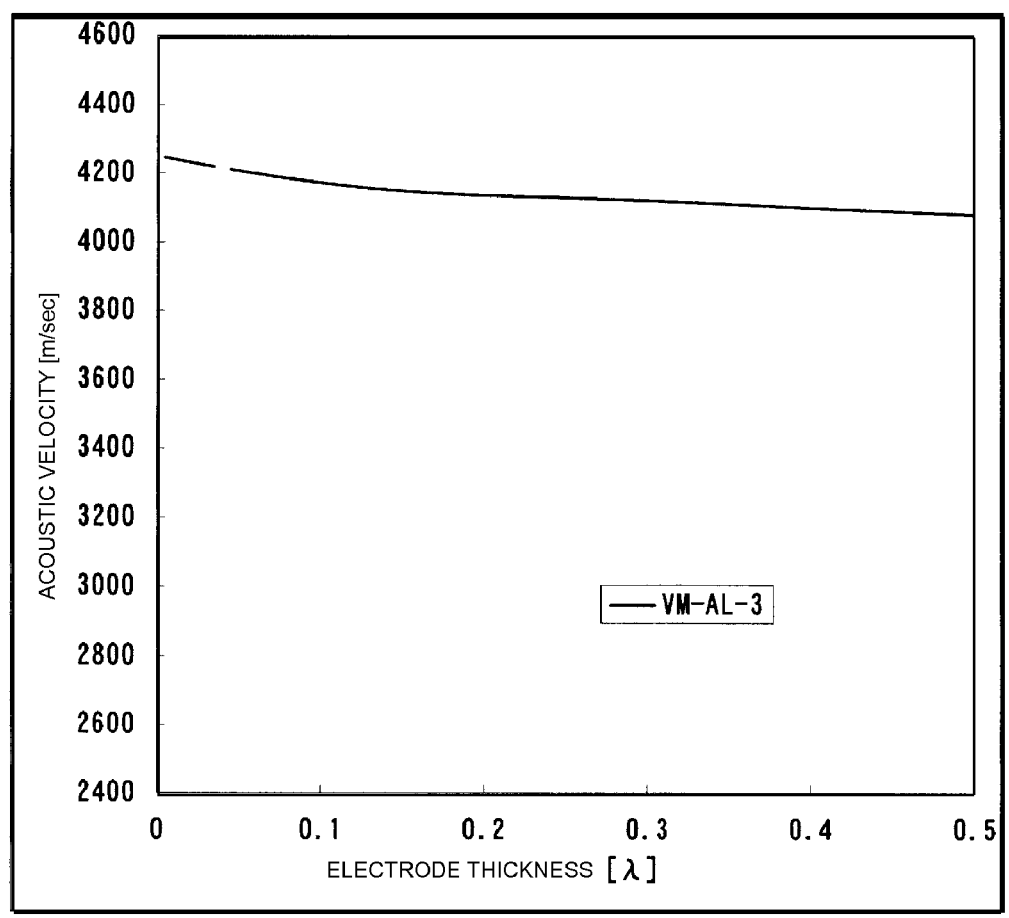
FIG. 74 is a graph showing the relationship between the electrode thickness and the acoustic velocity of a Stoneley wave in a boundary acoustic wave device formed in Example 3 in which the electrodes are formed from Al.
Figure 75:
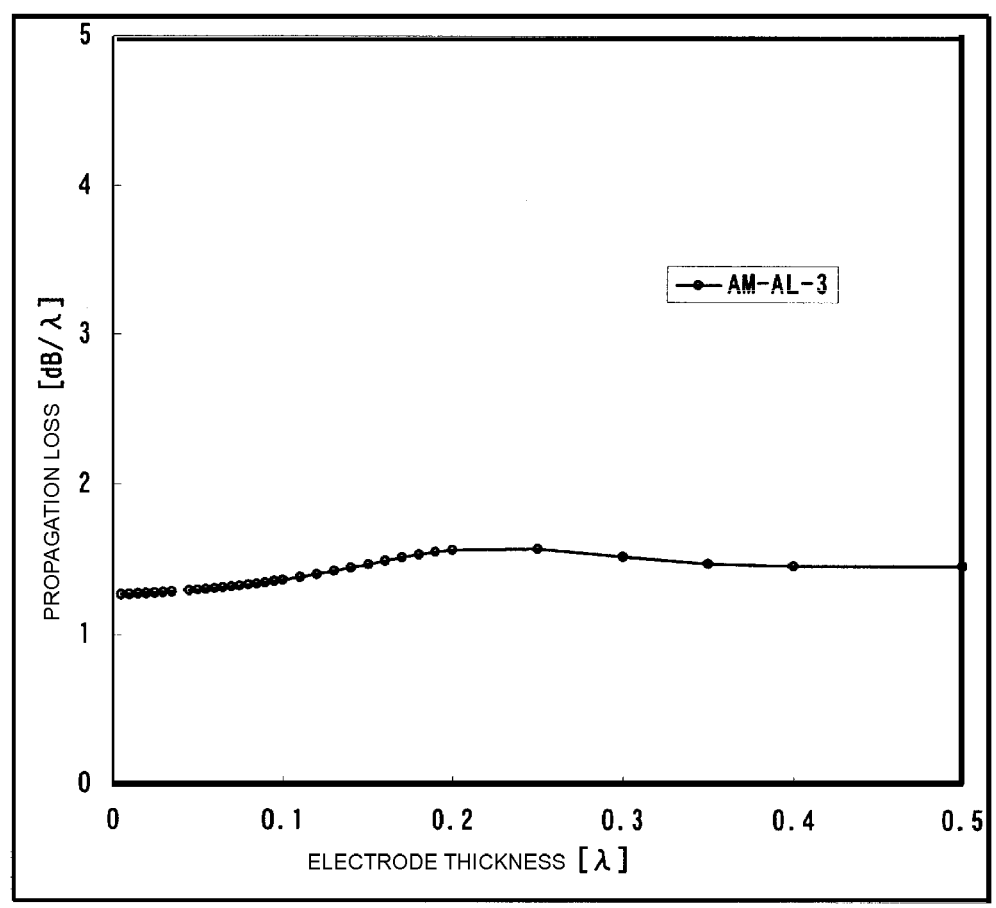
FIG. 75 is a graph showing the relationship between the electrode thickness and the propagation loss α of a Stoneley wave in a boundary acoustic wave device formed in Example 3 in which the electrodes are formed from Al.
Figure 76:
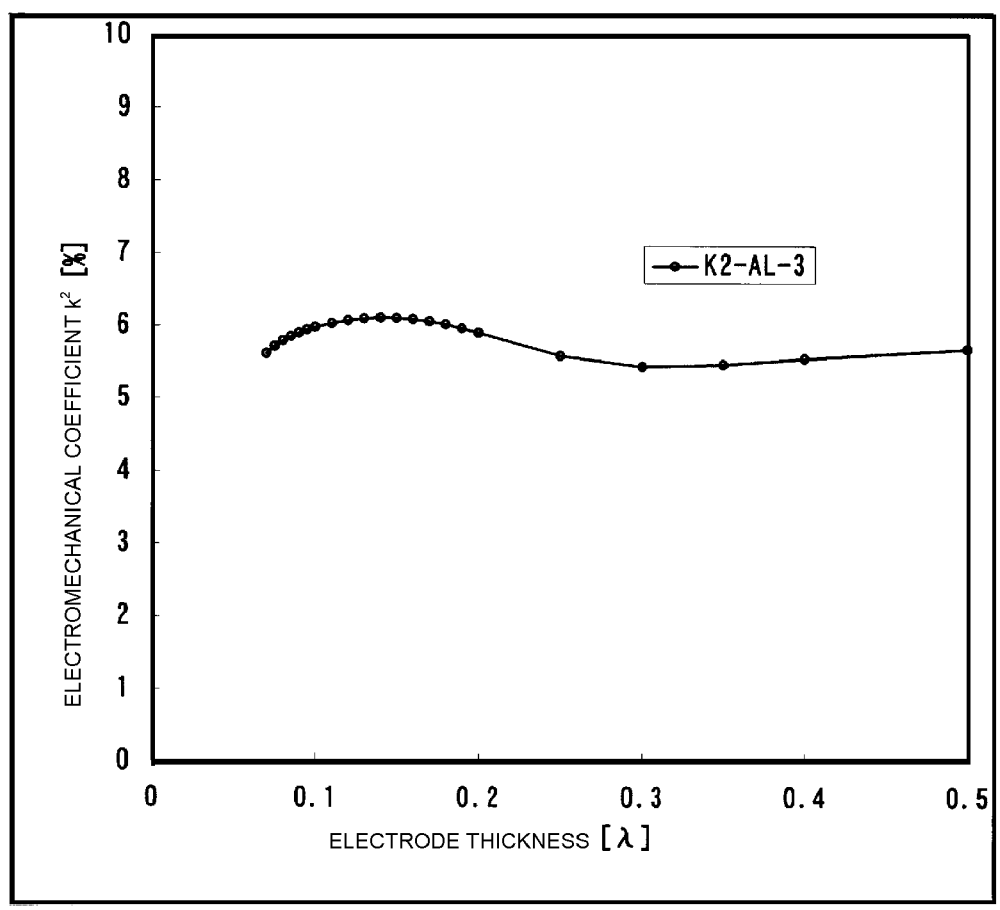
FIG. 76 is a graph showing the relationship between the electrode thickness and the electromechanical coefficient $k^2$ of a Stoneley wave in a boundary acoustic wave device formed in Example 3 in which the electrodes are formed from Al.
Figure 77:
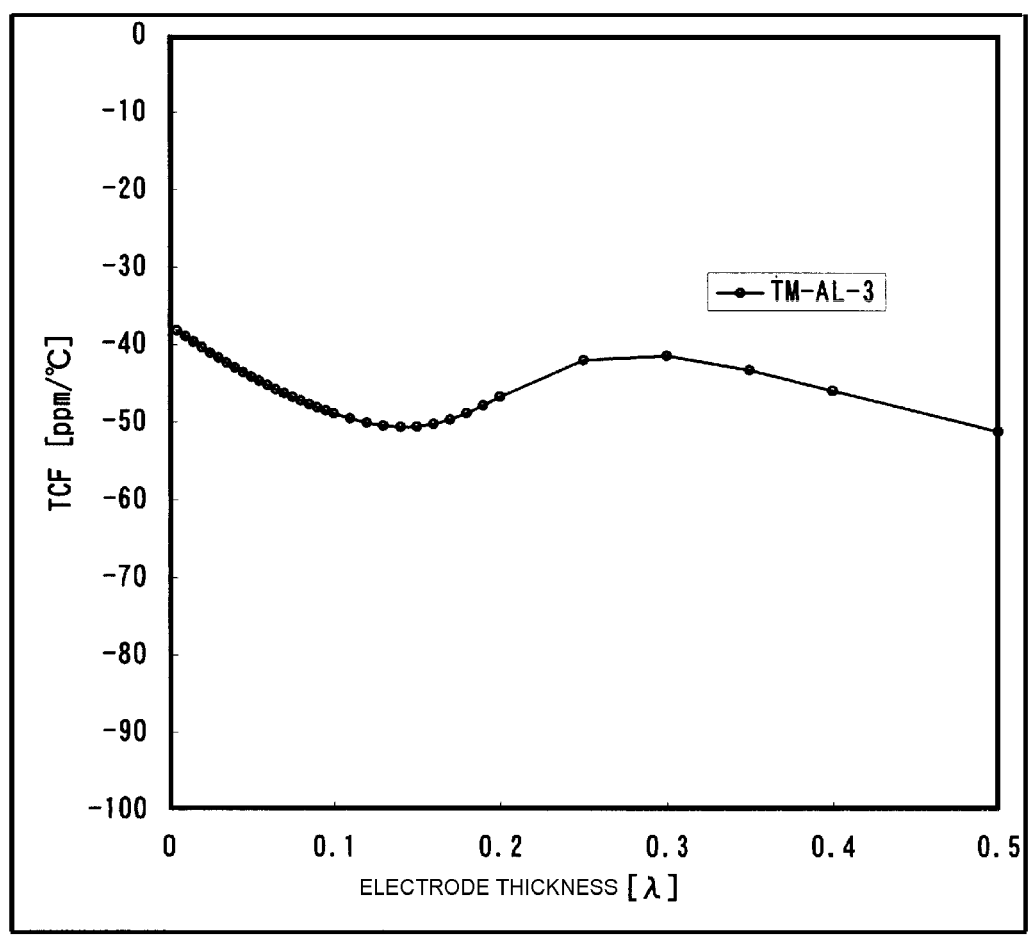
FIG. 77 is a graph showing the relationship between the electrode thickness and the temperature coefficient of frequency TCF of a Stoneley wave in a boundary acoustic wave device formed in Example 3 in which the electrodes are formed from Al.
Figure 78:
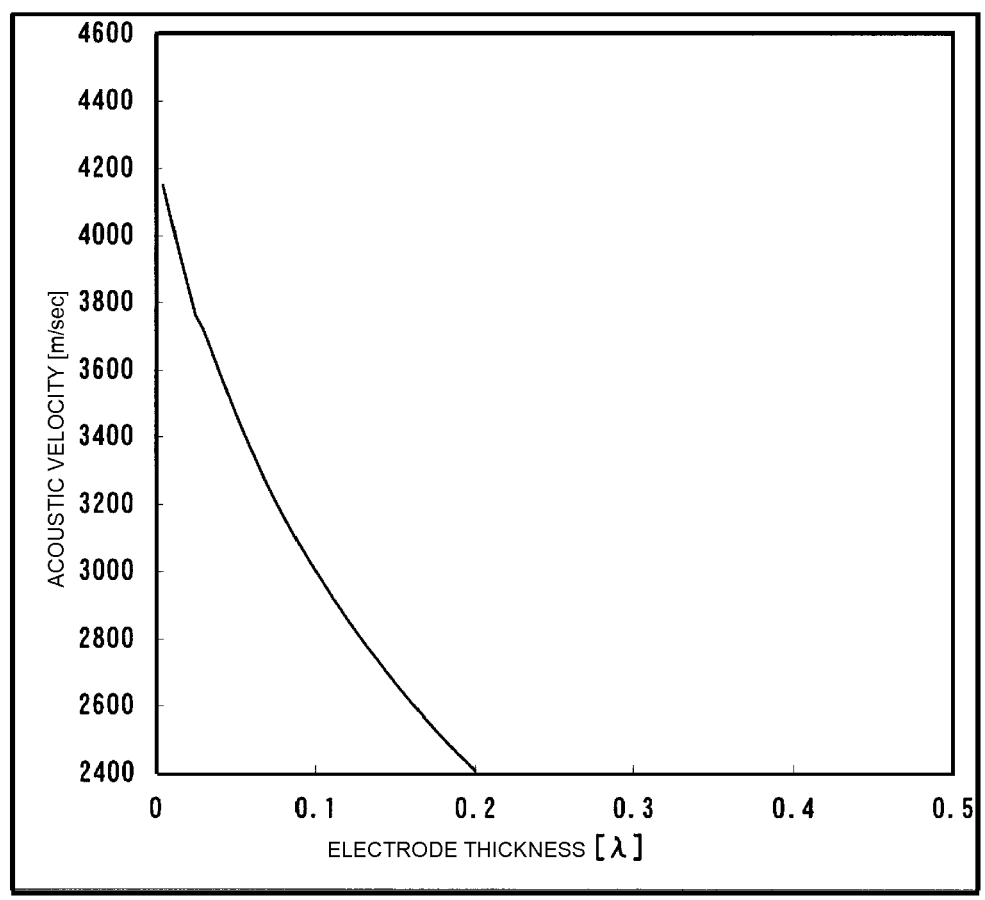
FIG. 78 is a graph showing the relationship between the electrode thickness and the acoustic velocity of a Stoneley wave in a boundary acoustic wave device formed in Example 3 in which the electrodes are formed from Au.
Figure 79:
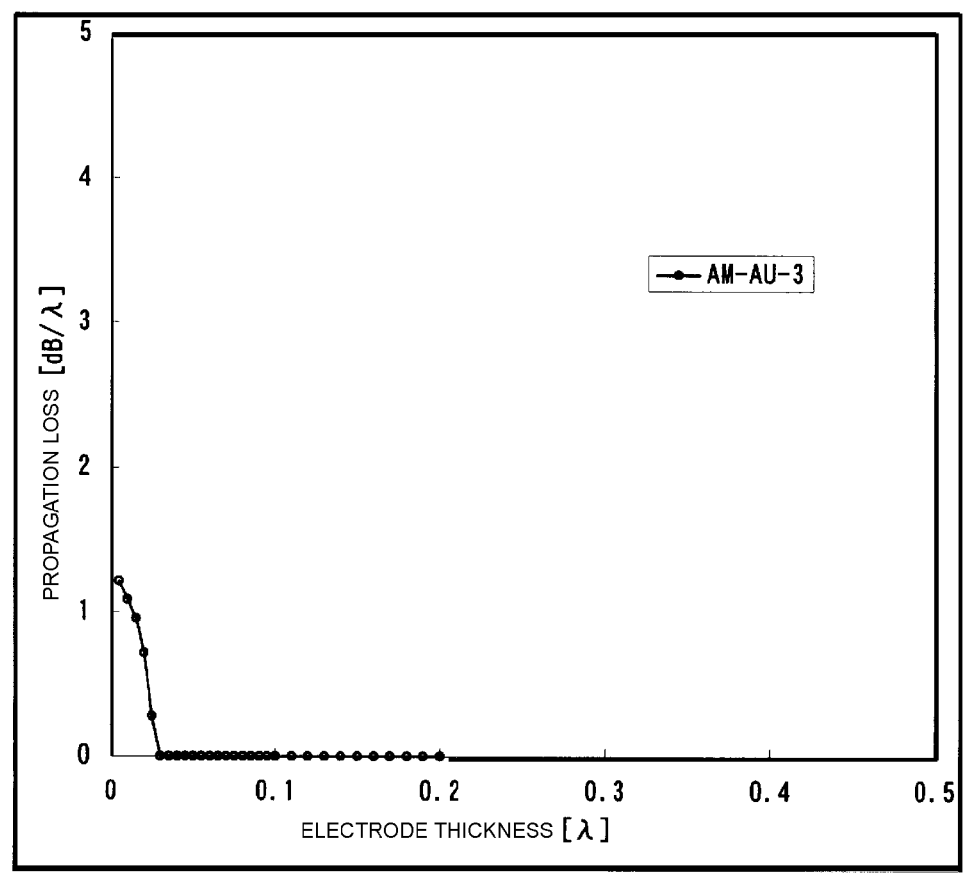
FIG. 79 is a graph showing the relationship between the electrode thickness and the propagation loss α of a Stoneley wave in a boundary acoustic wave device formed in Example 3 in which the electrodes are formed from Au.
Figure 80:
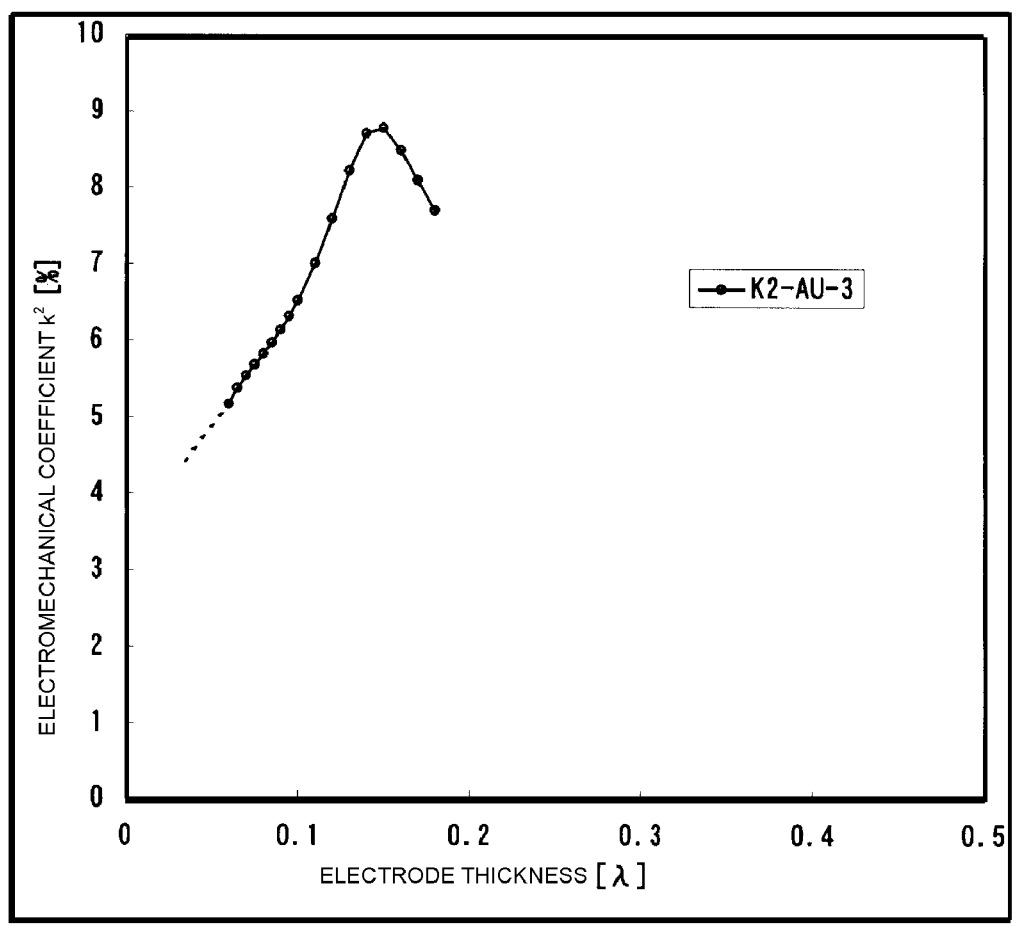
FIG. 80 is a graph showing the relationship between the electrode thickness and the electromechanical coefficient $k^2$ of a Stoneley wave in a boundary acoustic wave device formed in Example 3 in which the electrodes are formed from Au.
Figure 81:
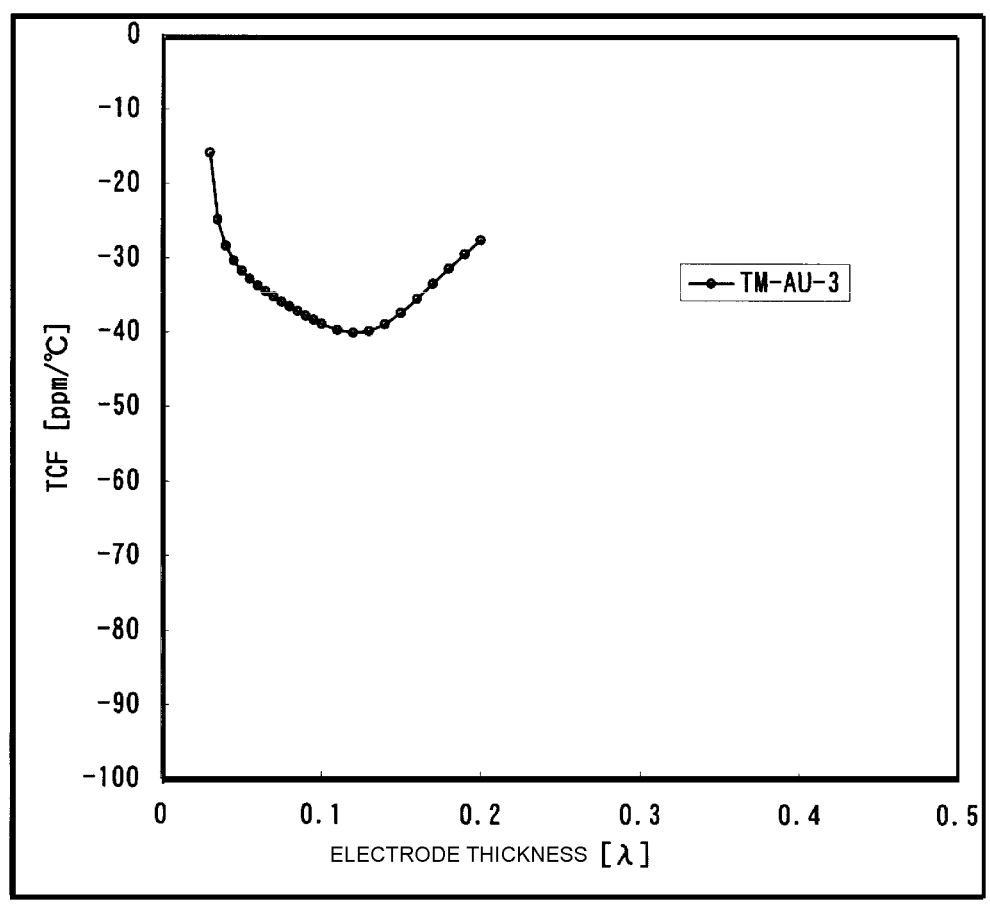
FIG. 81 is a graph showing the relationship between the electrode thickness and the temperature coefficient of frequency TCF of a Stoneley wave in a boundary acoustic wave device formed in Example 3 in which the electrodes are formed from Au.
Figure 82:
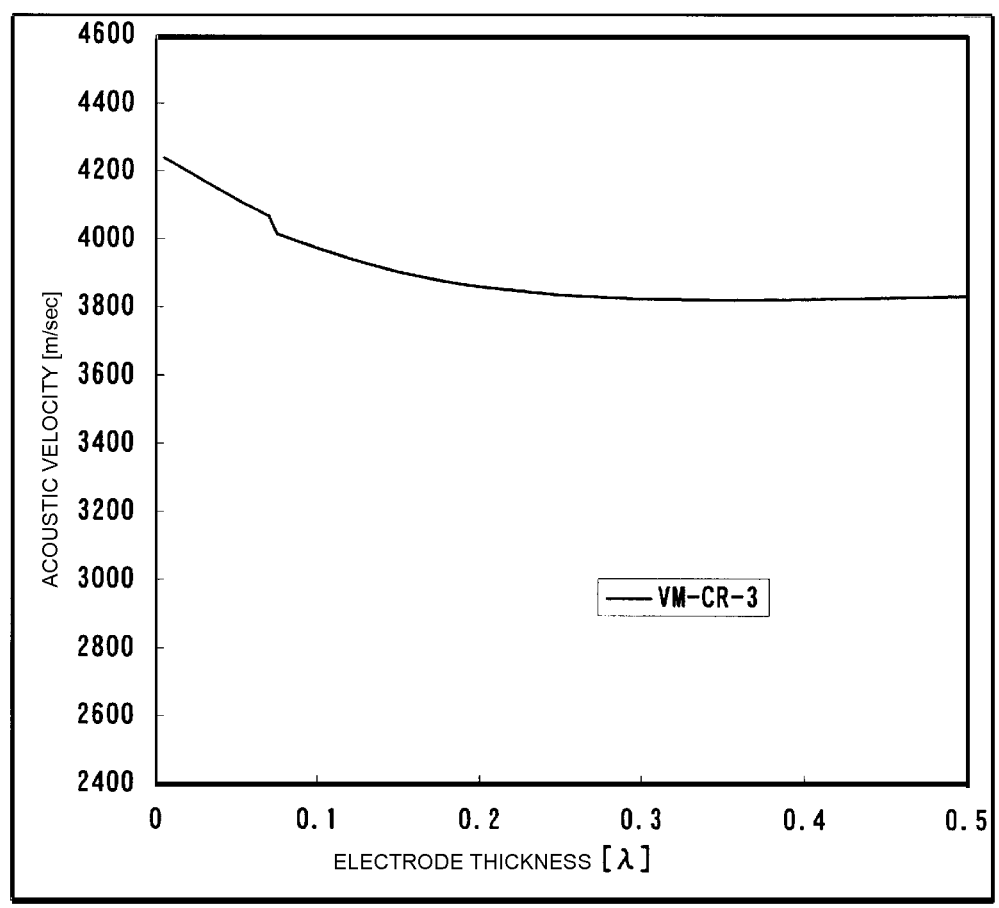
FIG. 82 is a graph showing the relationship between the electrode thickness and the acoustic velocity of a Stoneley wave in a boundary acoustic wave device formed in Example 3 in which the electrodes are formed from Cr.
Figure 83:
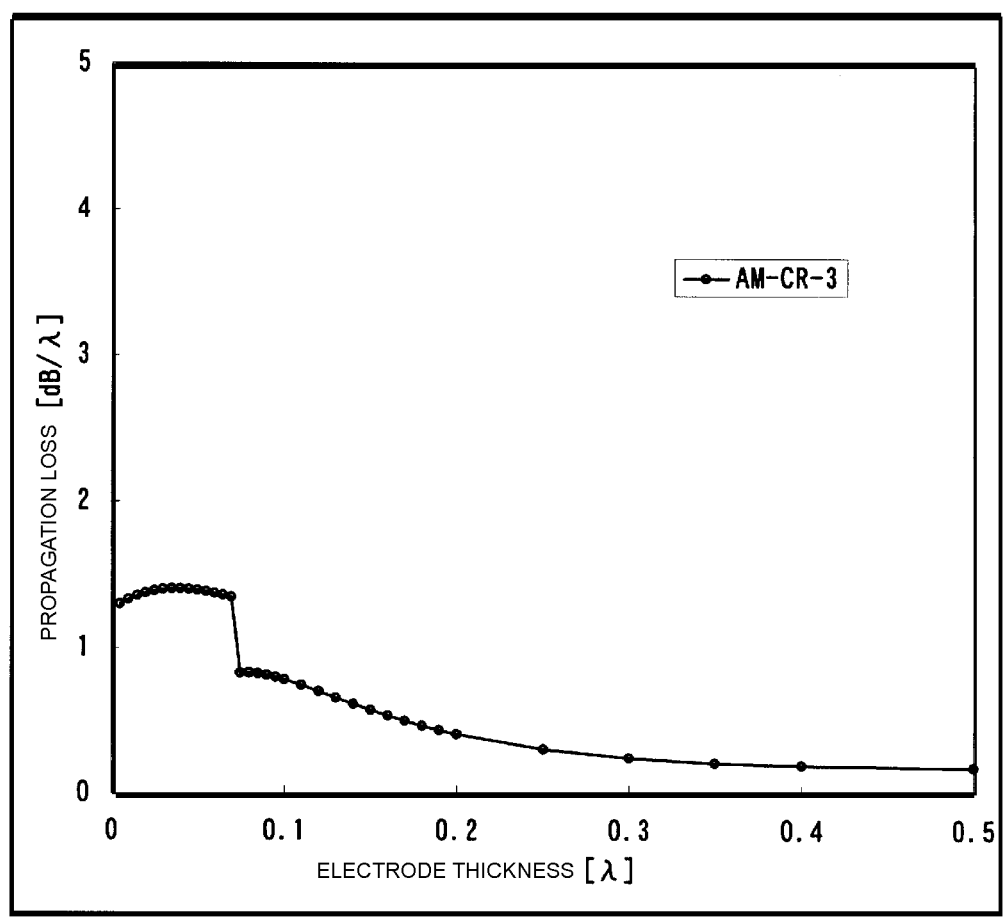
FIG. 83 is a graph showing the relationship between the electrode thickness and the propagation loss α of a Stoneley wave in a boundary acoustic wave device formed in Example 3 in which the electrodes are formed from Cr.
Figure 84:
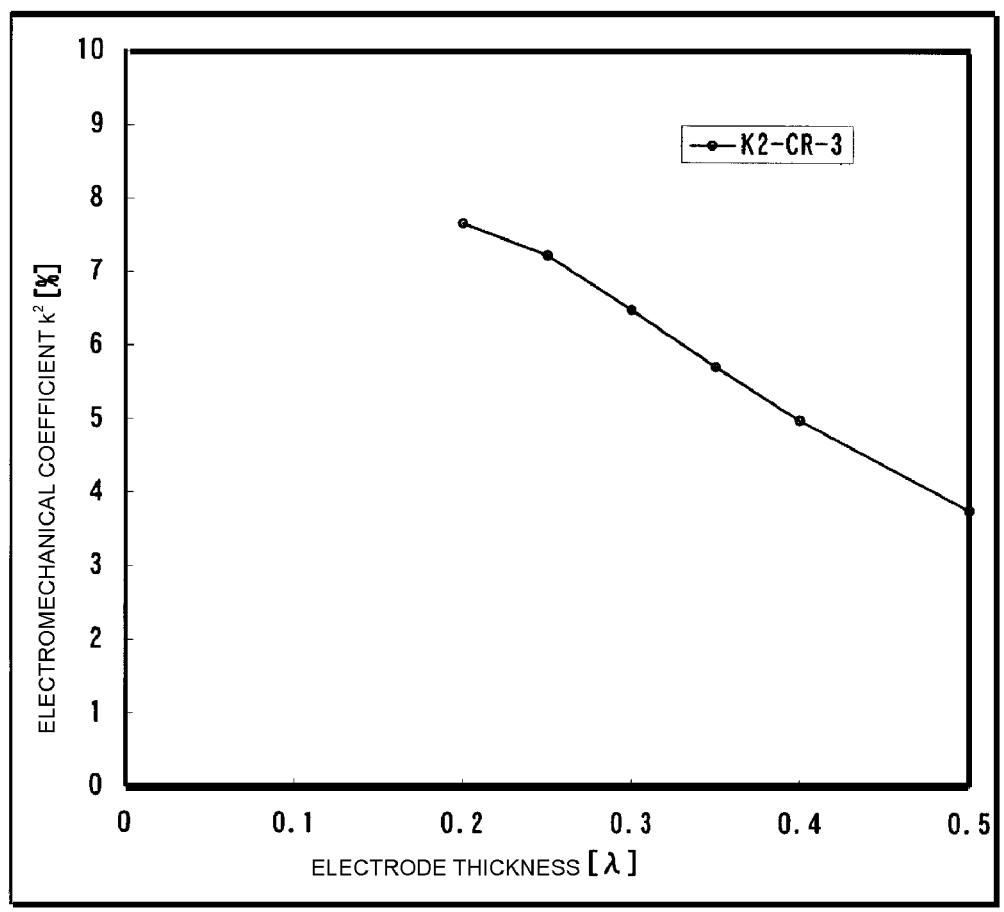
FIG. 84 is a graph showing the relationship between the electrode thickness and the electromechanical coefficient $k^2$ of a Stoneley wave in a boundary acoustic wave device formed in Example 3 in which the electrodes are formed from Cr.
Figure 85:
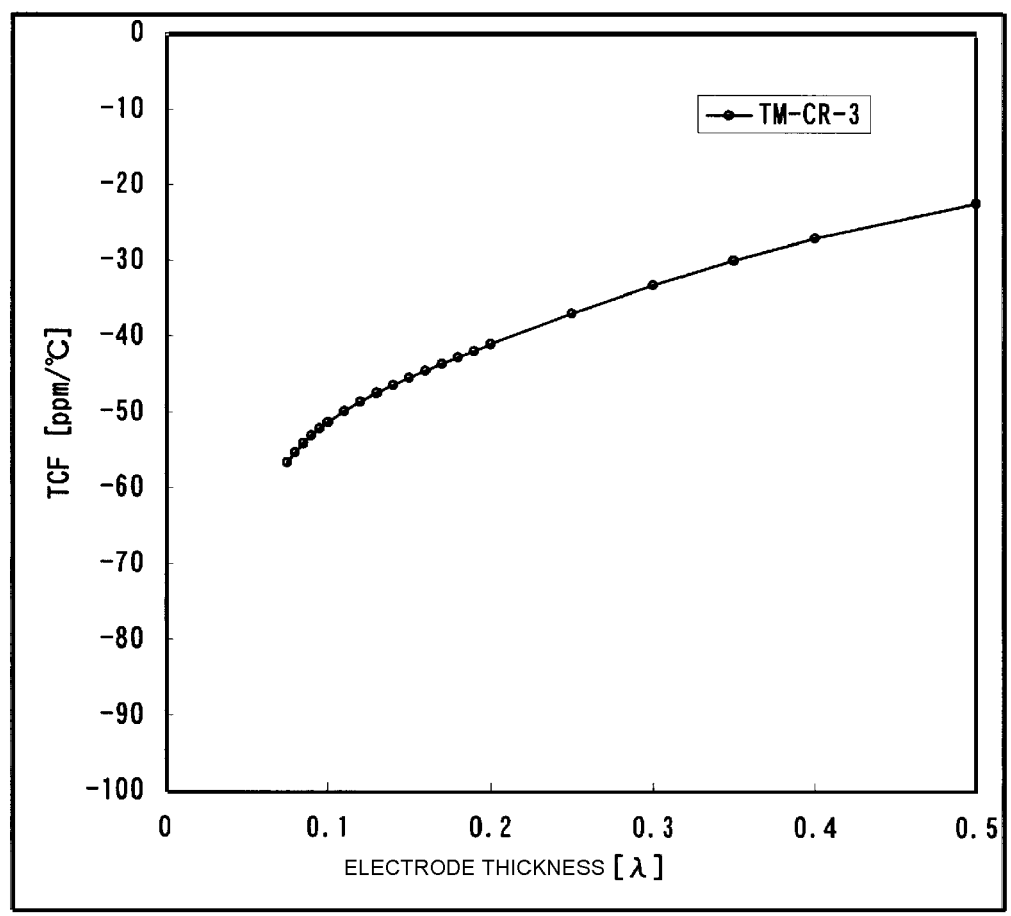
FIG. 85 is a graph showing the relationship between the electrode thickness and the temperature coefficient of frequency TCF of a Stoneley wave in a boundary acoustic wave device formed in Example 3 in which the electrodes are formed from Cr.
Figure 86:
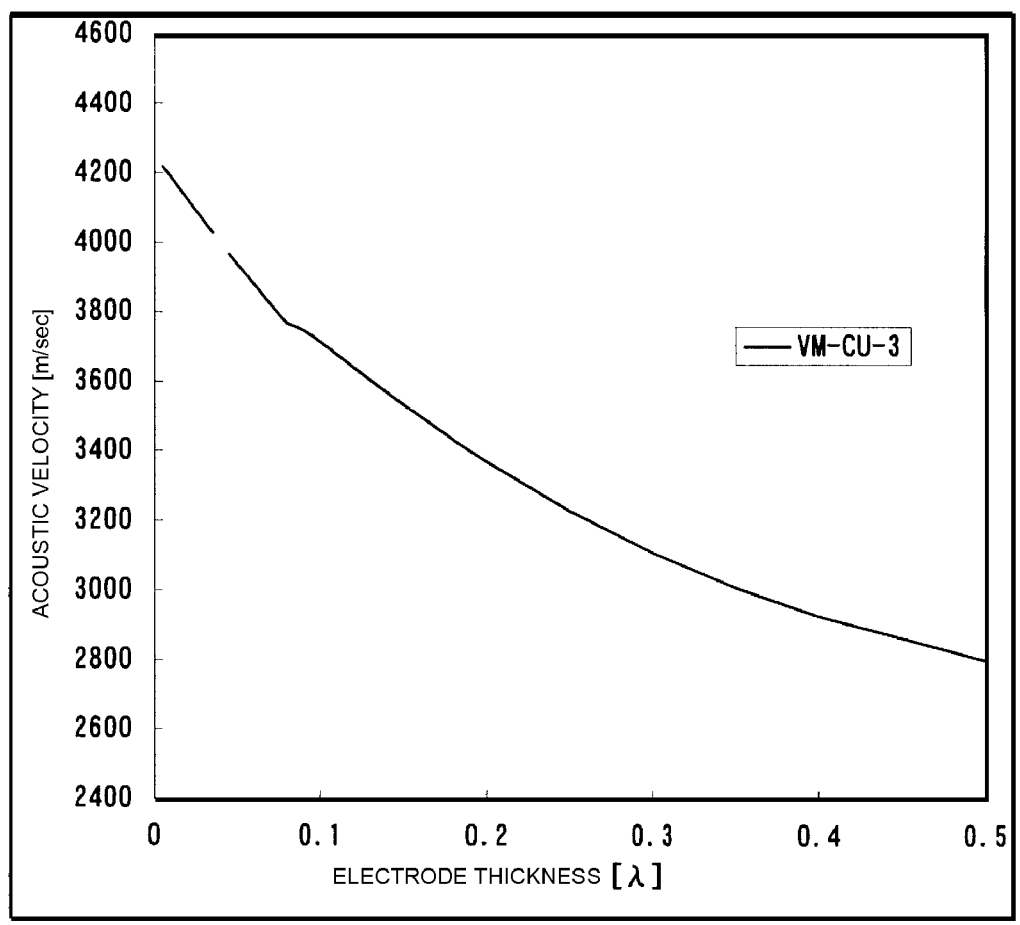
FIG. 86 is a graph showing the relationship between the electrode thickness and the acoustic velocity of a Stoneley wave in a boundary acoustic wave device formed in Example 3 in which the electrodes are formed from Cu.
Figure 87:
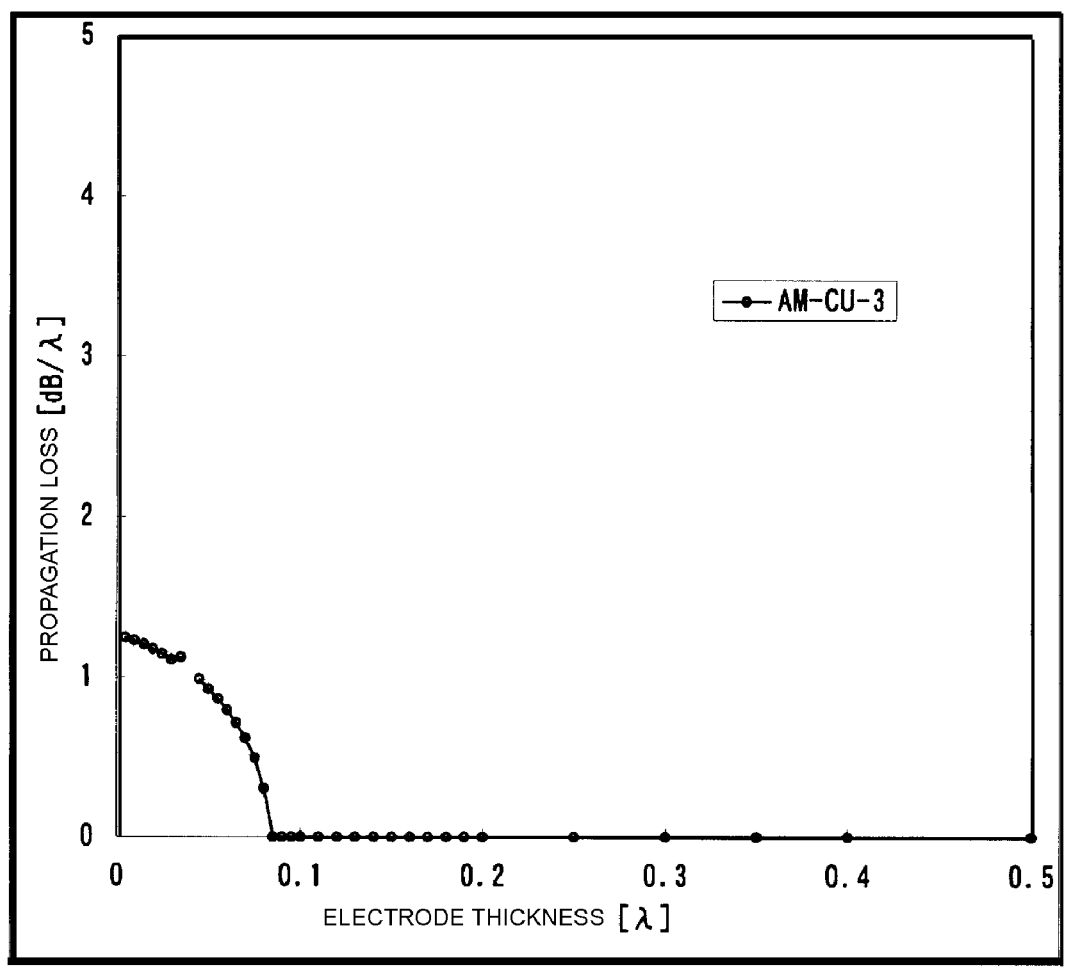
FIG. 87 is a graph showing the relationship between the electrode thickness and the propagation loss α of a Stoneley wave in a boundary acoustic wave device formed in Example 3 in which the electrodes are formed from Cu.
Figure 88:
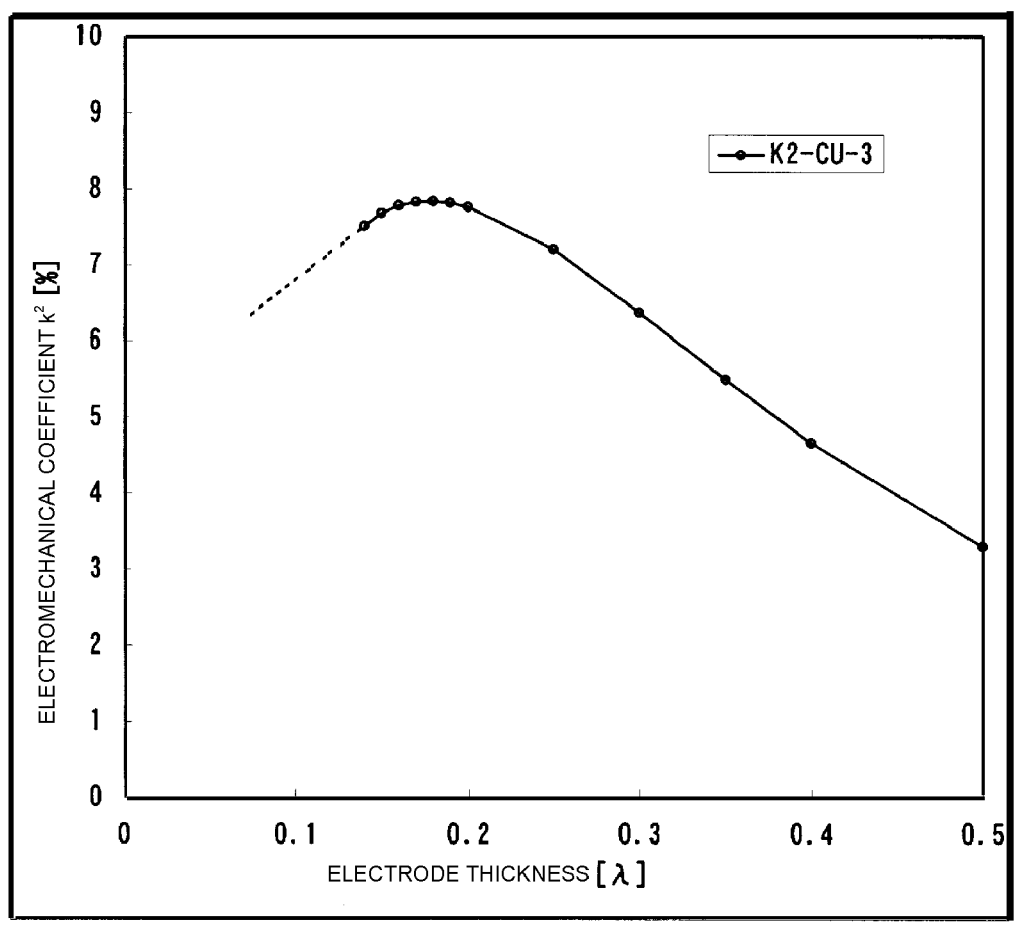
FIG. 88 is a graph showing the relationship between the electrode thickness and the electromechanical coefficient $k^2$ of a Stoneley wave in a boundary acoustic wave device formed in Example 3 in which the electrodes are formed from Cu.
Figure 89:
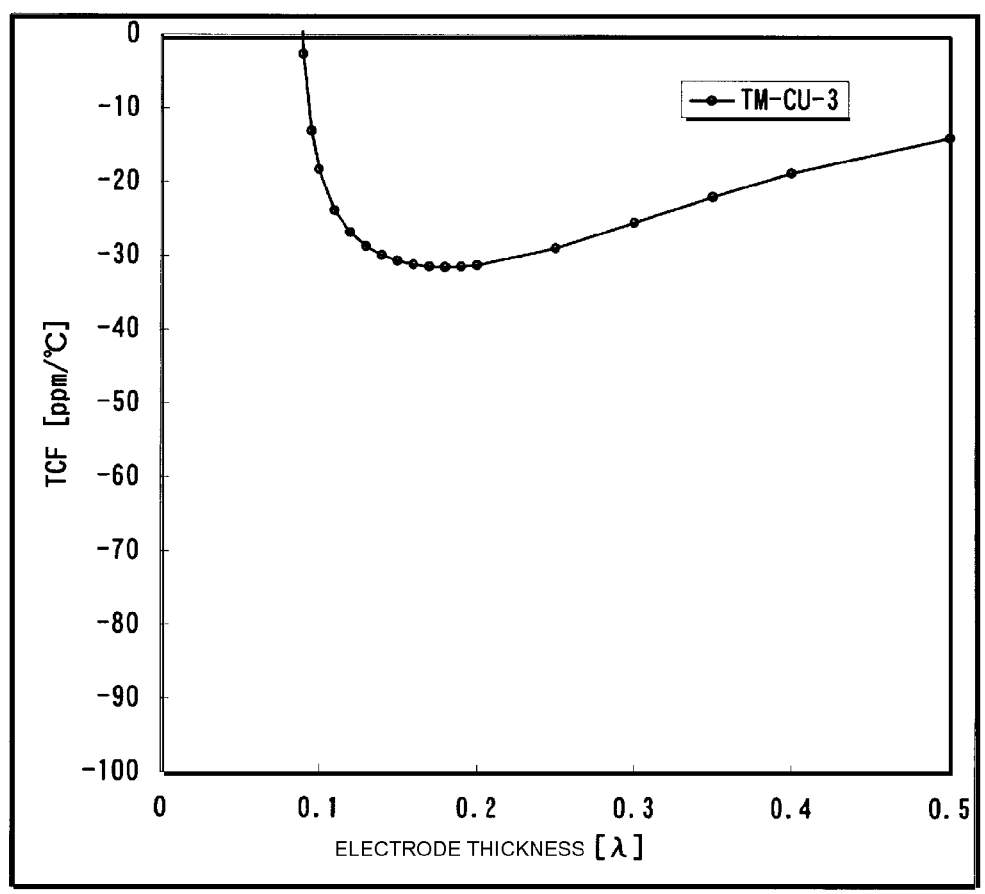
FIG. 89 is a graph showing the relationship between the electrode thickness and the temperature coefficient of frequency TCF of a Stoneley wave in a boundary acoustic wave device formed in Example 3 in which the electrodes are formed from Cu.
Figure 90:
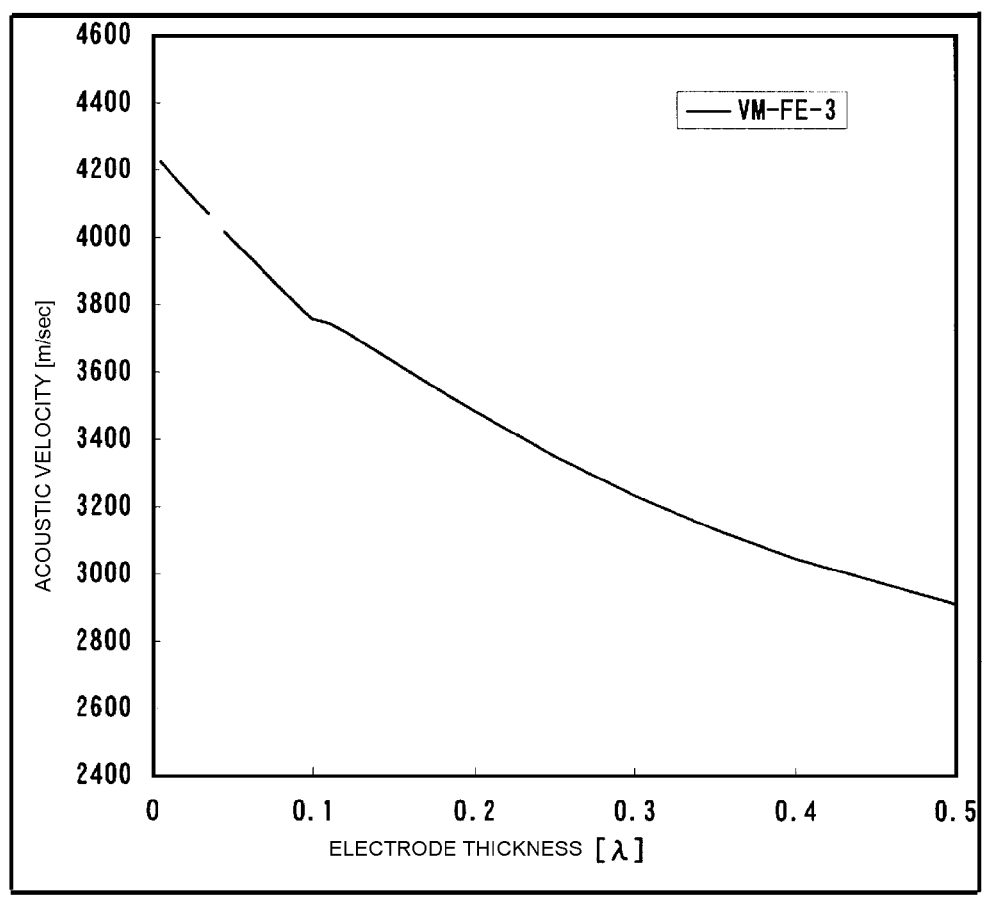
FIG. 90 is a graph showing the relationship between the electrode thickness and the acoustic velocity of a Stoneley wave in a boundary acoustic wave device formed in Example 3 in which the electrodes are formed from Fe.
Figure 91:
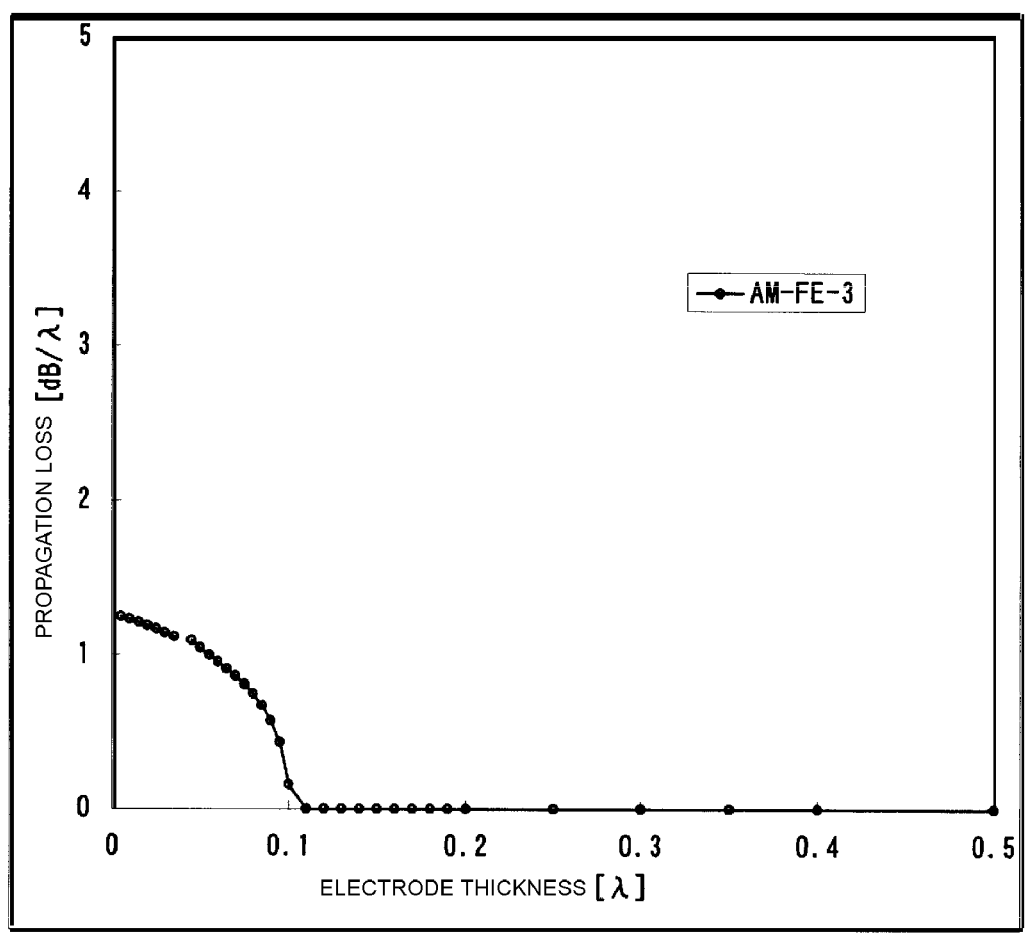
FIG. 91 is a graph showing the relationship between the electrode thickness and the propagation loss α of a Stoneley wave in a boundary acoustic wave device formed in Example 3 in which the electrodes are formed from Fe.
Figure 92:
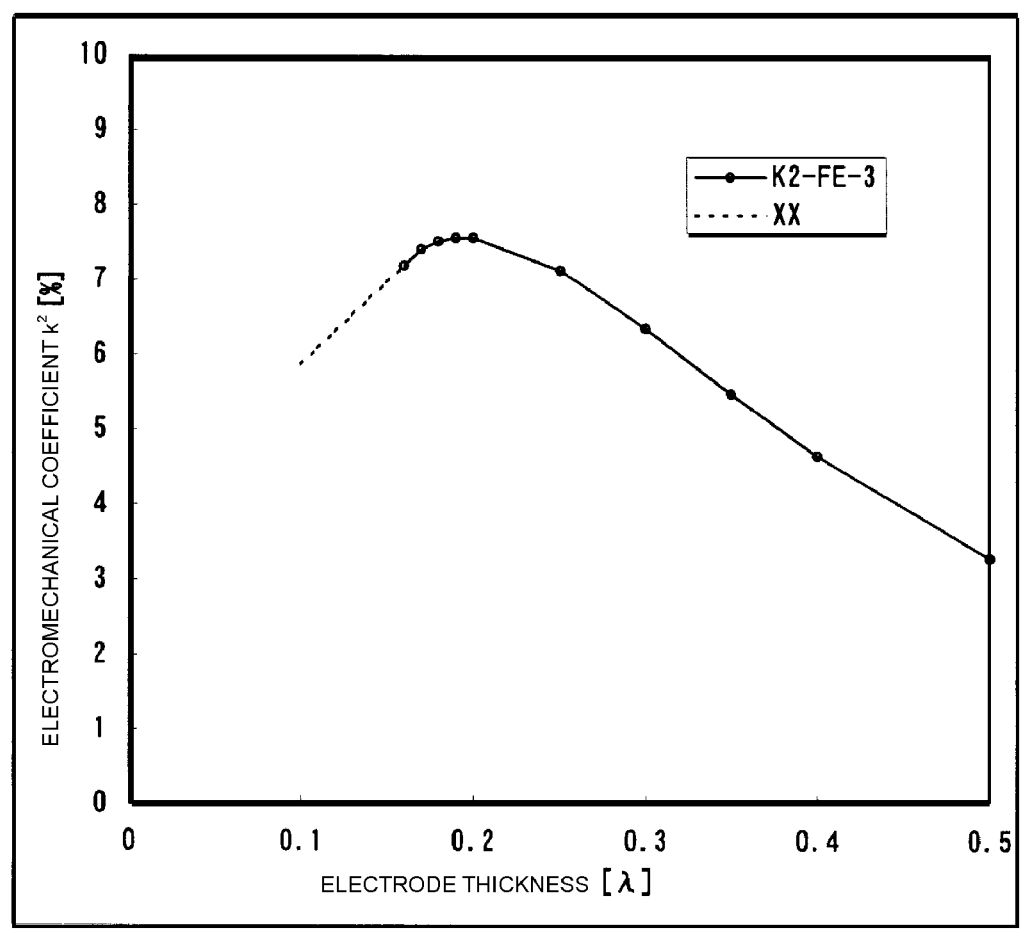
FIG. 92 is a graph showing the relationship between the electrode thickness and the electromechanical coefficient $k^2$ of a Stoneley wave in a boundary acoustic wave device formed in Example 3 in which the electrodes are formed from Fe.
Figure 93:
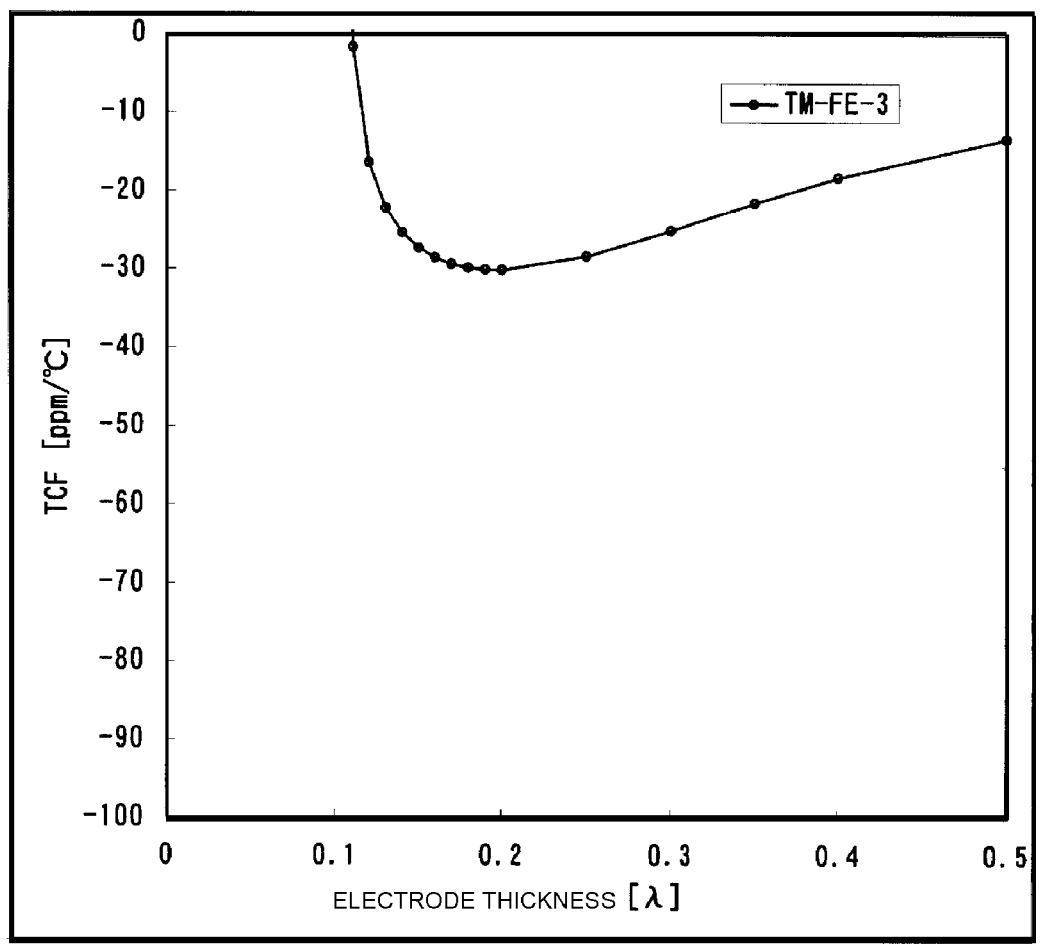
FIG. 93 is a graph showing the relationship between the electrode thickness and the temperature coefficient of frequency TCF of a Stoneley wave in a boundary acoustic wave device formed in Example 3 in which the electrodes are formed from Fe.
Figure 94:
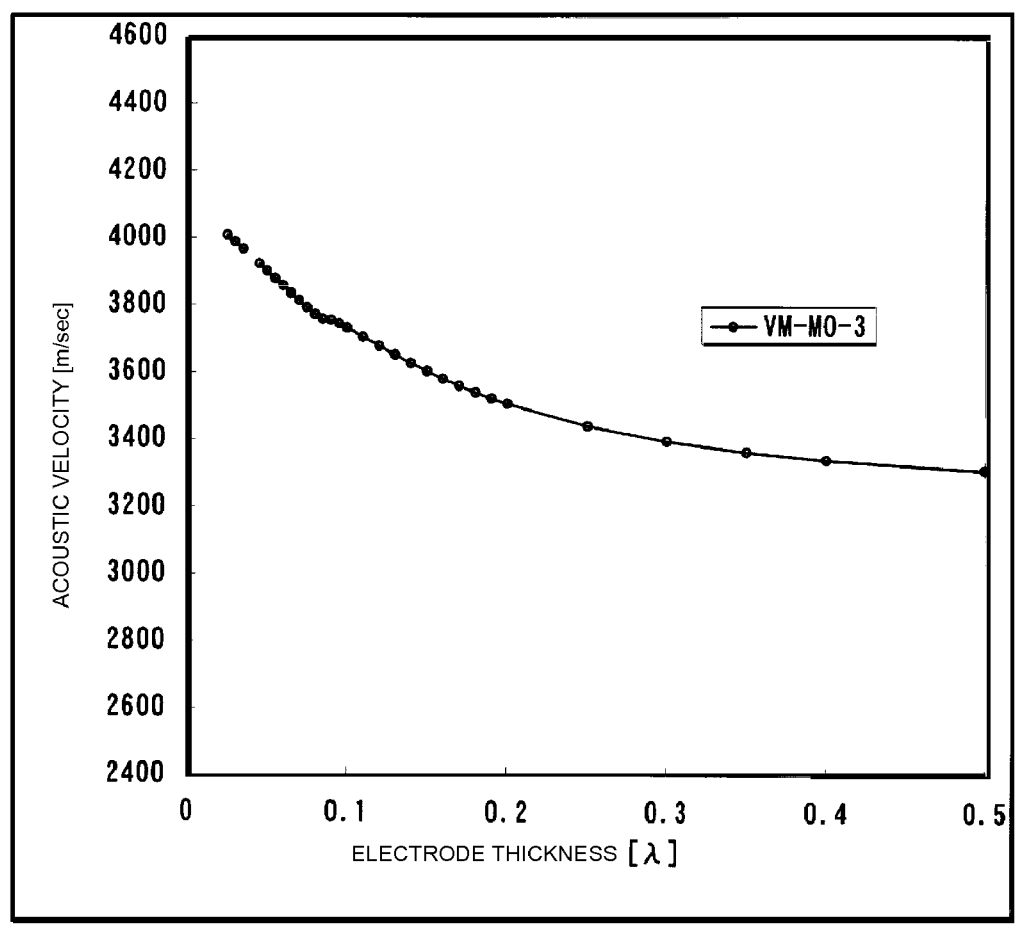
FIG. 94 is a graph showing the relationship between the electrode thickness and the acoustic velocity of a Stoneley wave in a boundary acoustic wave device formed in Example 3 in which the electrodes are formed from Mo.
Figure 95:
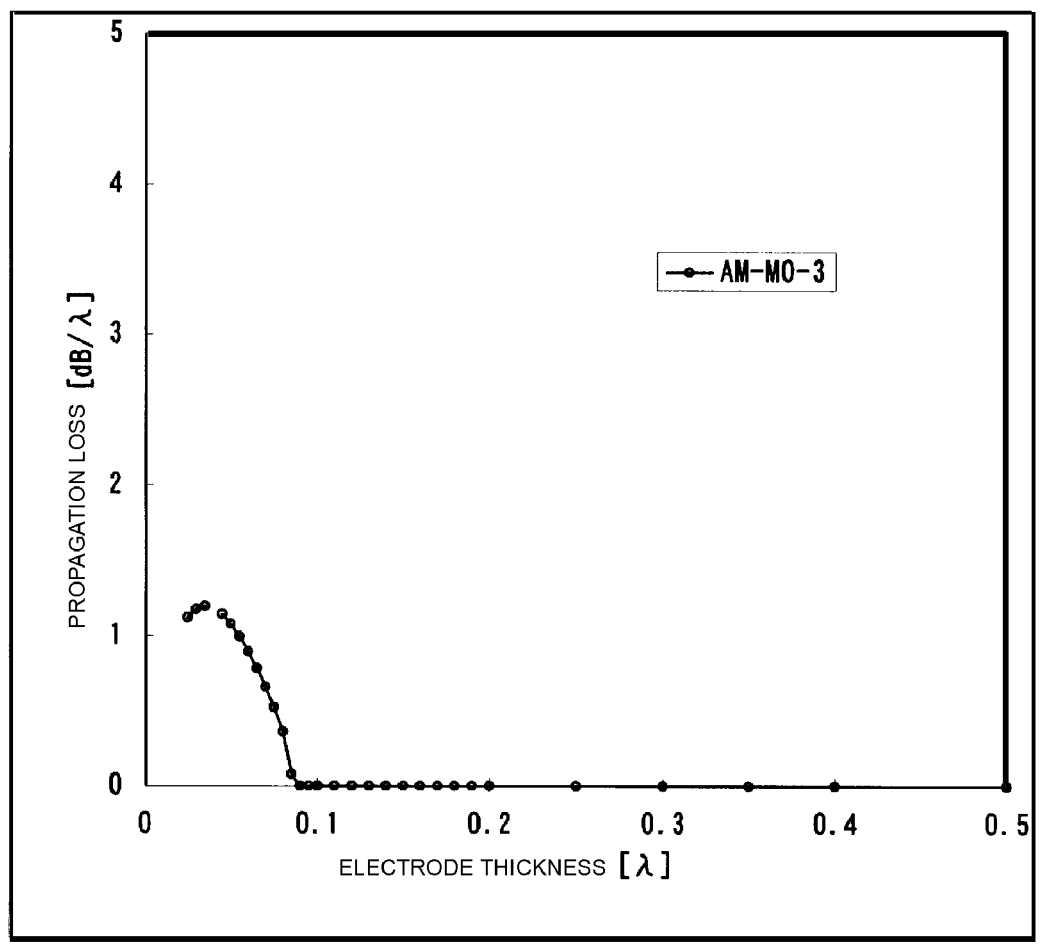
FIG. 95 is a graph showing the relationship between the electrode thickness and the propagation loss α of a Stoneley wave in a boundary acoustic wave device formed in Example 3 in which the electrodes are formed from Mo.
Figure 96:
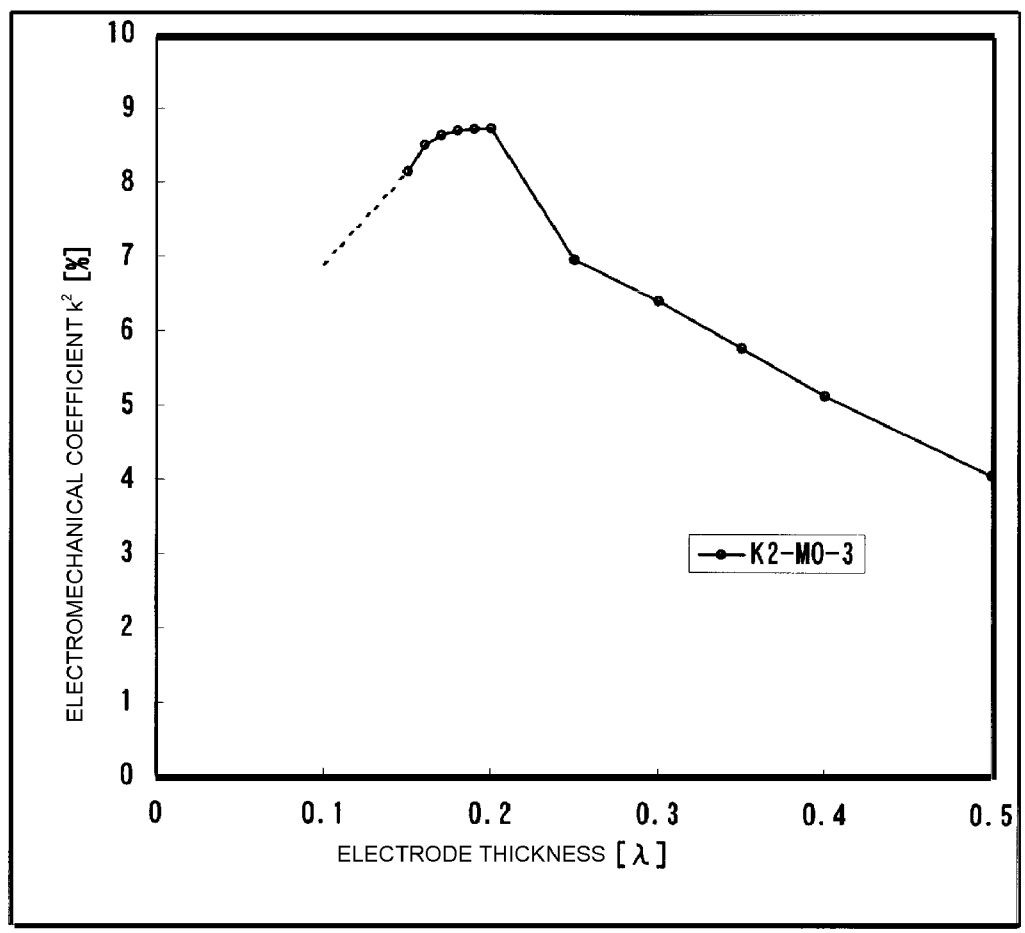
FIG. 96 is a graph showing the relationship between the electrode thickness and the electromechanical coefficient $k^2$ of a Stoneley wave in a boundary acoustic wave device formed in Example 3 in which the electrodes are formed from Mo.
Figure 97:
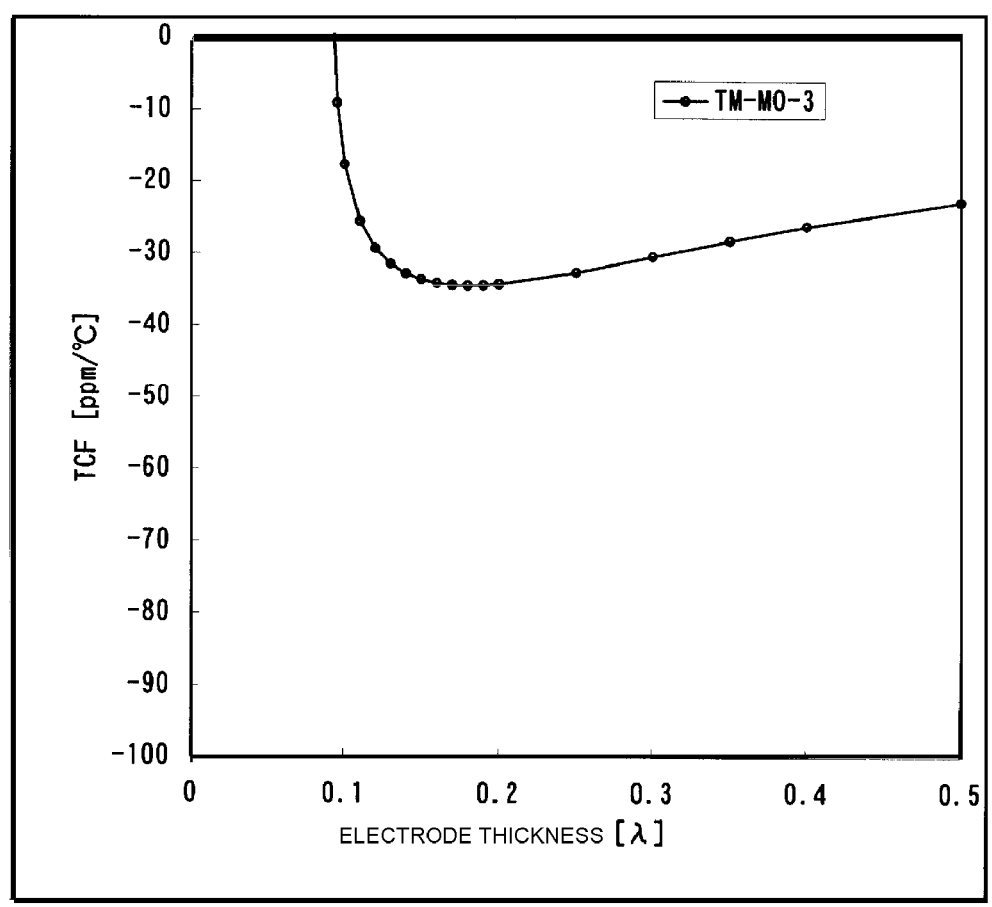
FIG. 97 is a graph showing the relationship between the electrode thickness and the temperature coefficient of frequency TCF of a Stoneley wave in a boundary acoustic wave device formed in Example 3 in which the electrodes are formed from Mo.
Figure 98:
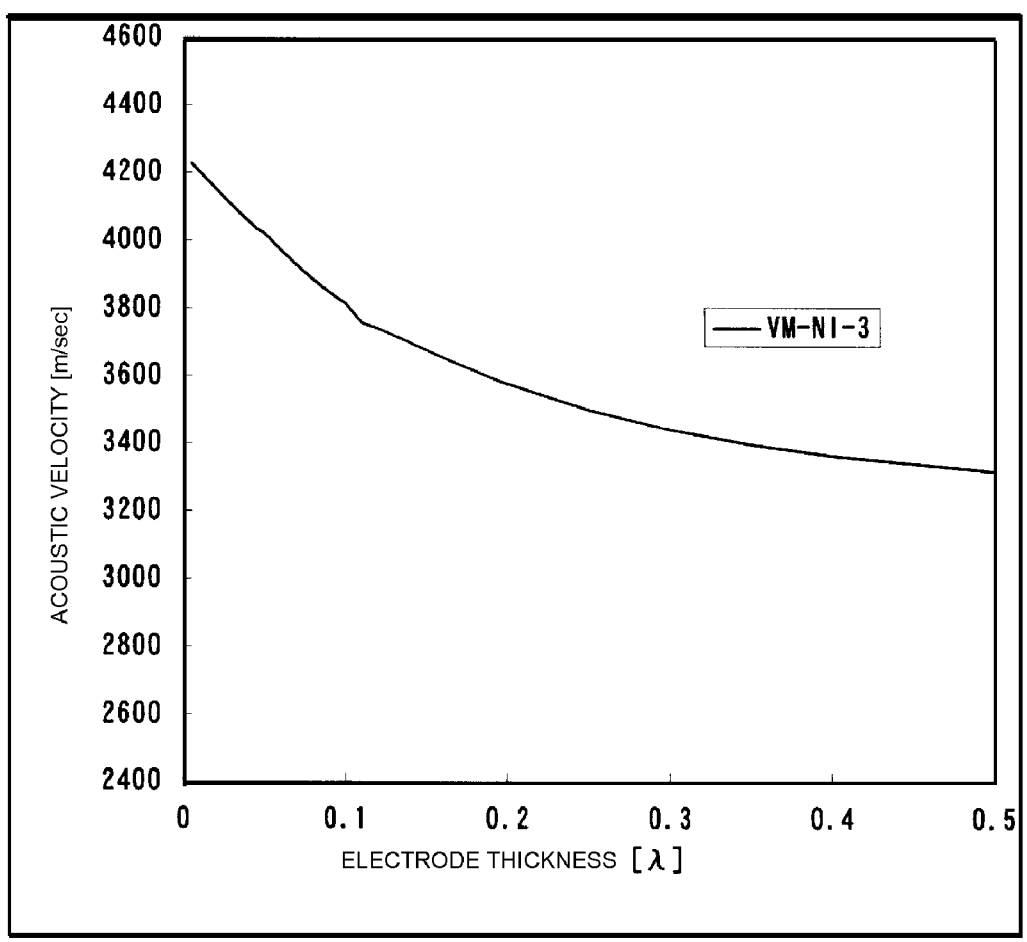
FIG. 98 is a graph showing the relationship between the electrode thickness and the acoustic velocity of a Stoneley wave in a boundary acoustic wave device formed in Example 3 in which the electrodes are formed from Ni.
Figure 99:
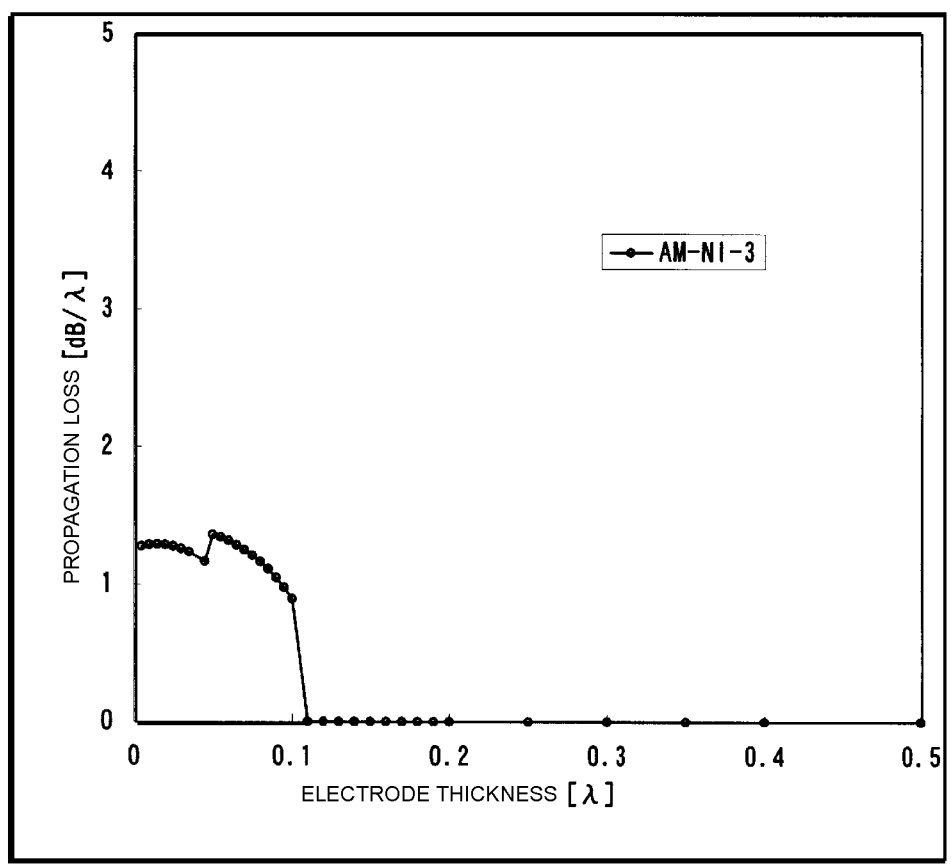
FIG. 99 is a graph showing the relationship between the electrode thickness and the propagation loss α of a Stoneley wave in a boundary acoustic wave device formed in Example 3 in which the electrodes are formed from Ni.
Figure 100:
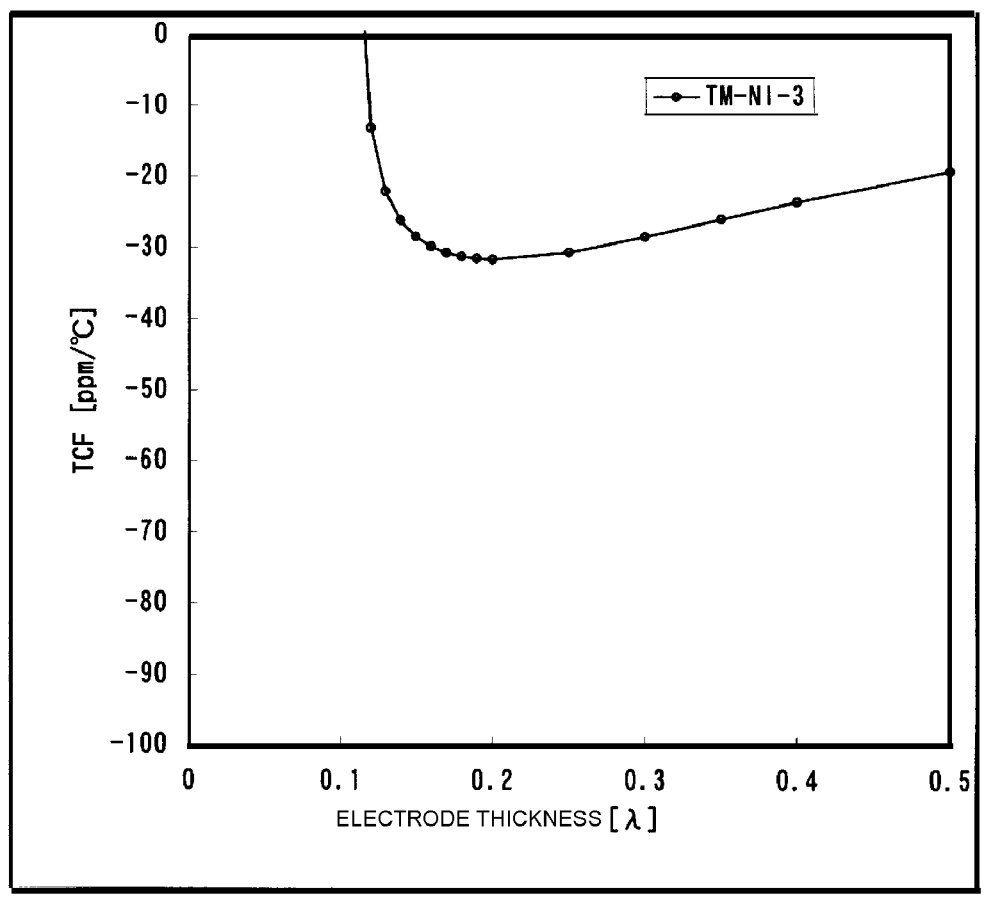
FIG. 100 is a graph showing the relationship between the electrode thickness and the temperature coefficient of frequency TCF of a Stoneley wave in a boundary acoustic wave device formed in Example 3 in which the electrodes are formed from Ni.
Figure 101:
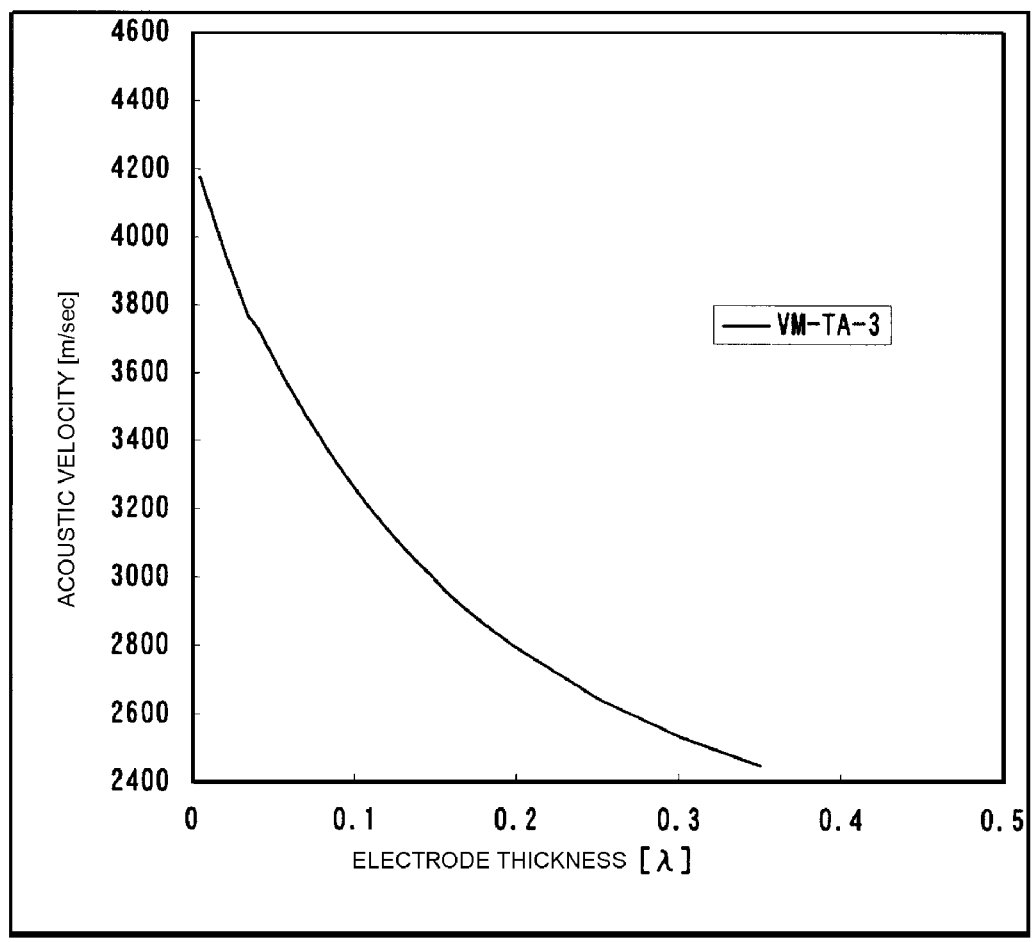
FIG. 101 is a graph showing the relationship between the electrode thickness and the acoustic velocity of a Stoneley wave in a boundary acoustic wave device formed in Example 3 in which the electrodes are formed from Ta.
Figure 102:
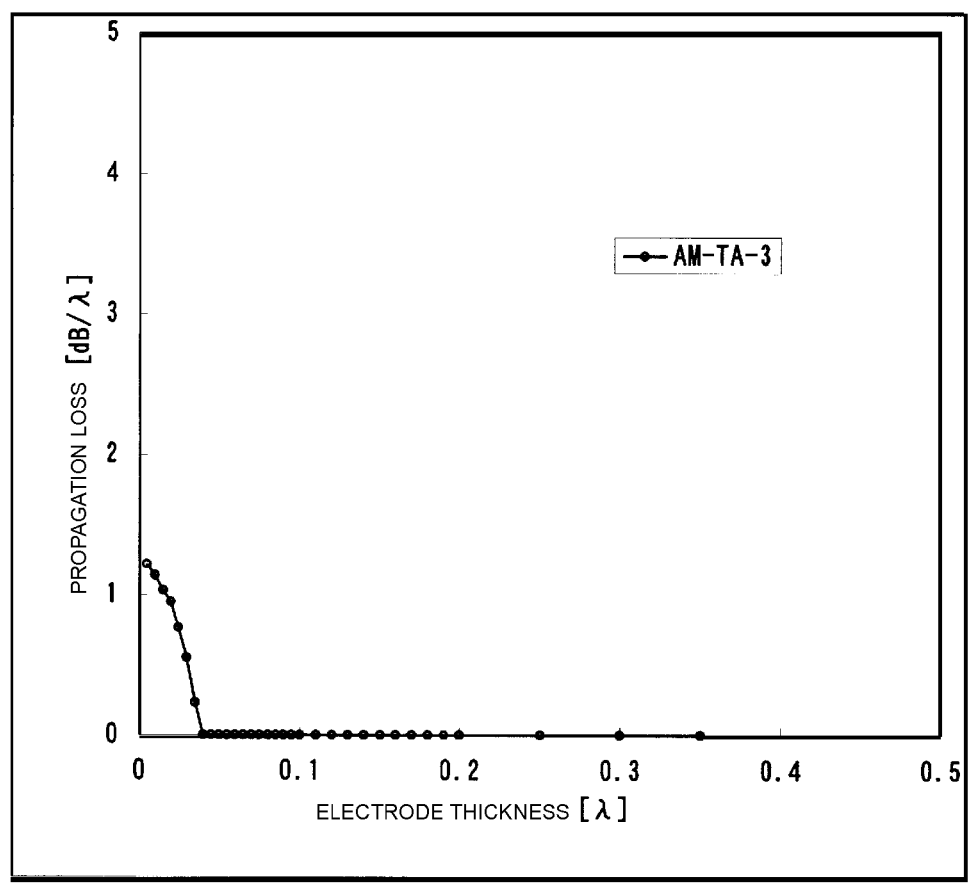
FIG. 102 is a graph showing the relationship between the electrode thickness and the propagation loss α of a Stoneley wave in a boundary acoustic wave device formed in Example 3 in which the electrodes are formed from Ta.
Figure 103:
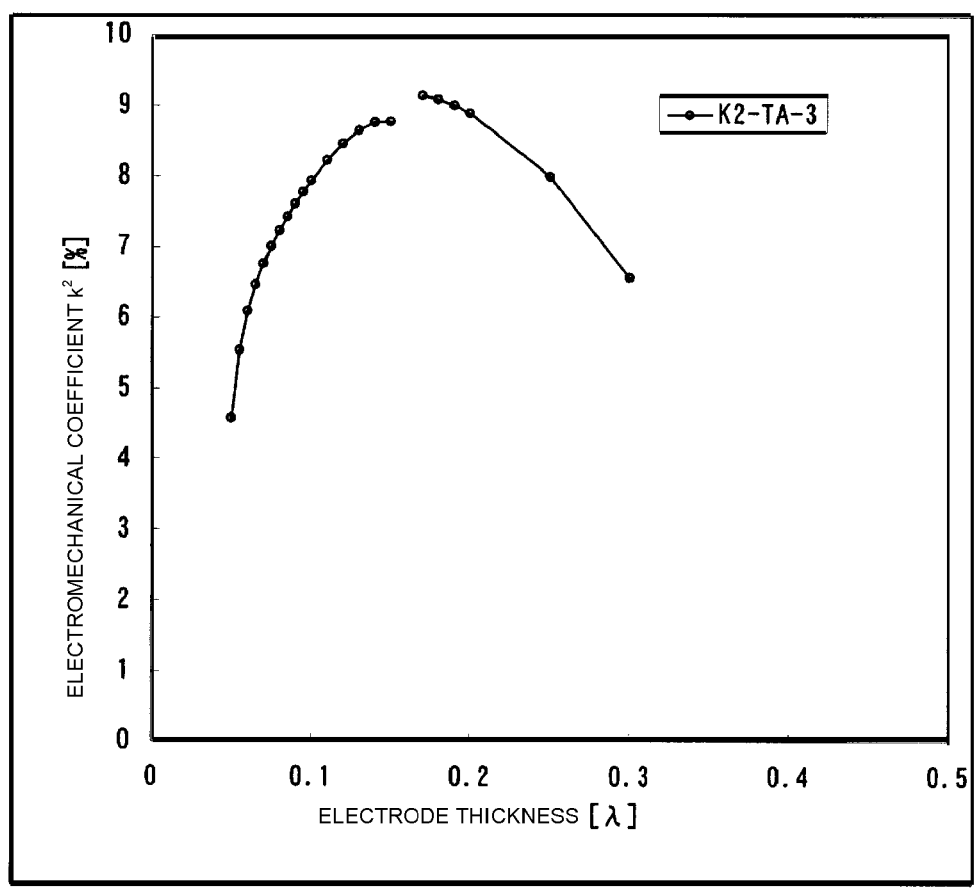
FIG. 103 is a graph showing the relationship between the electrode thickness and the electromechanical coefficient $k^2$ of a Stoneley wave in a boundary acoustic wave device formed in Example 3 in which the electrodes are formed from Ta.
Figure 104:
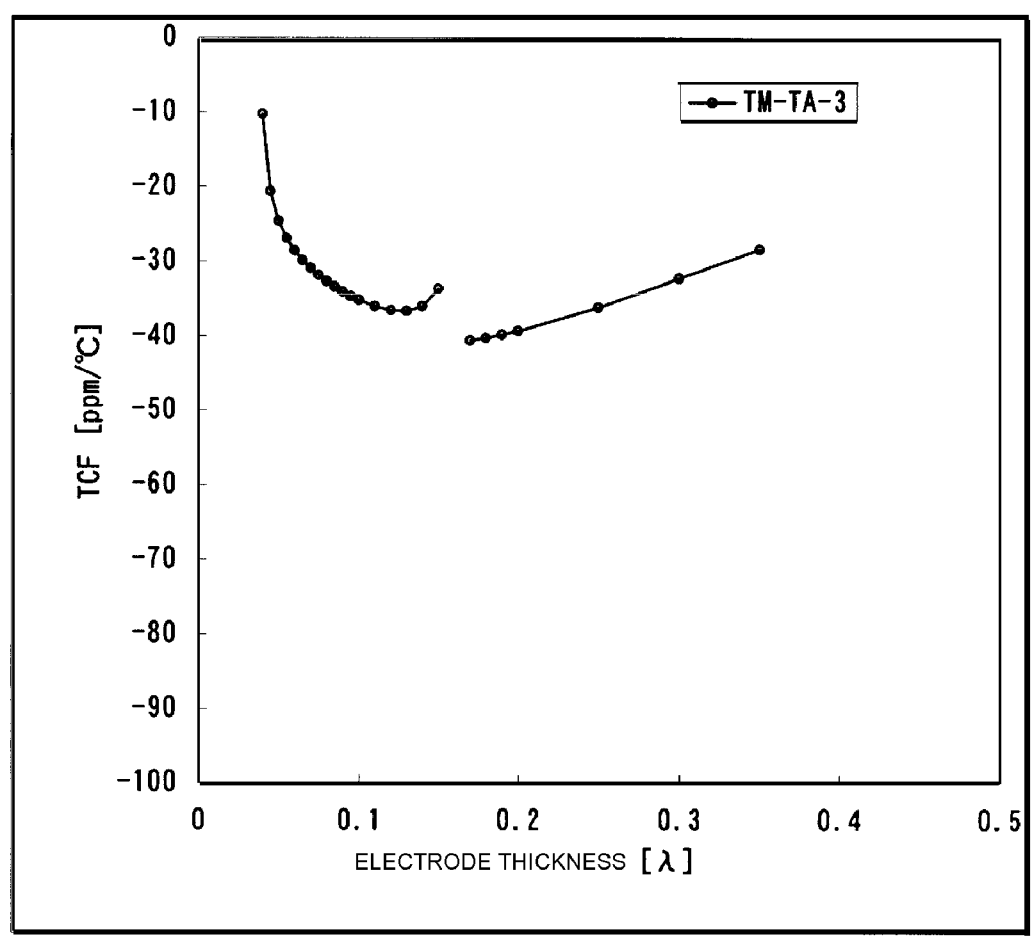
FIG. 104 is a graph showing the relationship between the electrode thickness and the temperature coefficient of frequency TCF of a Stoneley wave in a boundary acoustic wave device formed in Example 3 in which the electrodes are formed from Ta.
Figure 105:
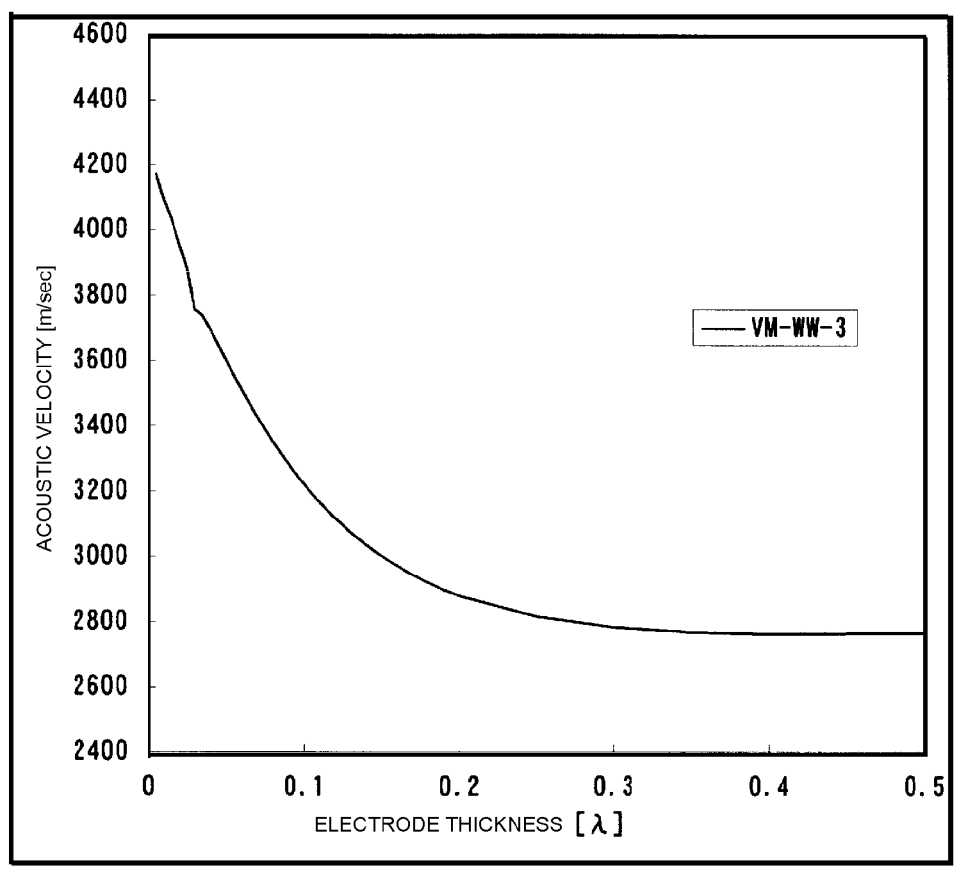
FIG. 105 is a graph showing the relationship between the electrode thickness and the acoustic velocity of a Stoneley wave in a boundary acoustic wave device formed in Example 3 in which the electrodes are formed from W.
Figure 106:
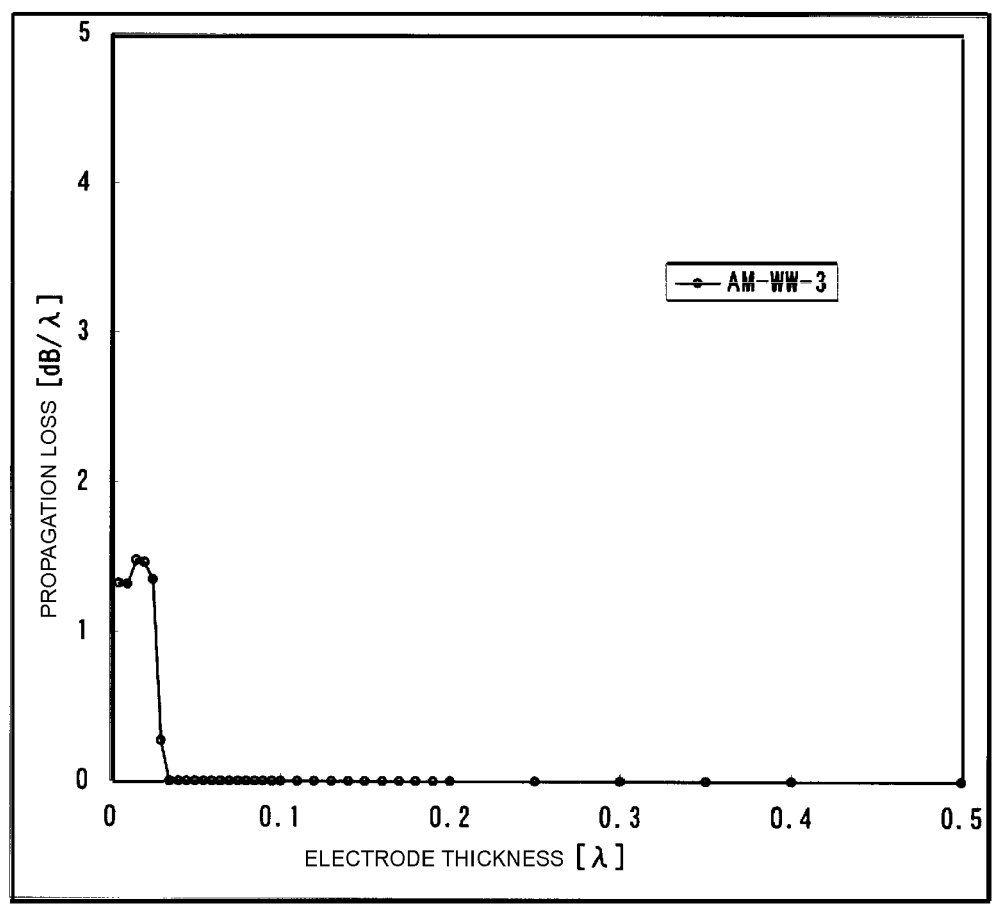
FIG. 106 is a graph showing the relationship between the electrode thickness and the propagation loss α of a Stoneley wave in a boundary acoustic wave device formed in Example 3 in which the electrodes are formed from W.
Figure 107:
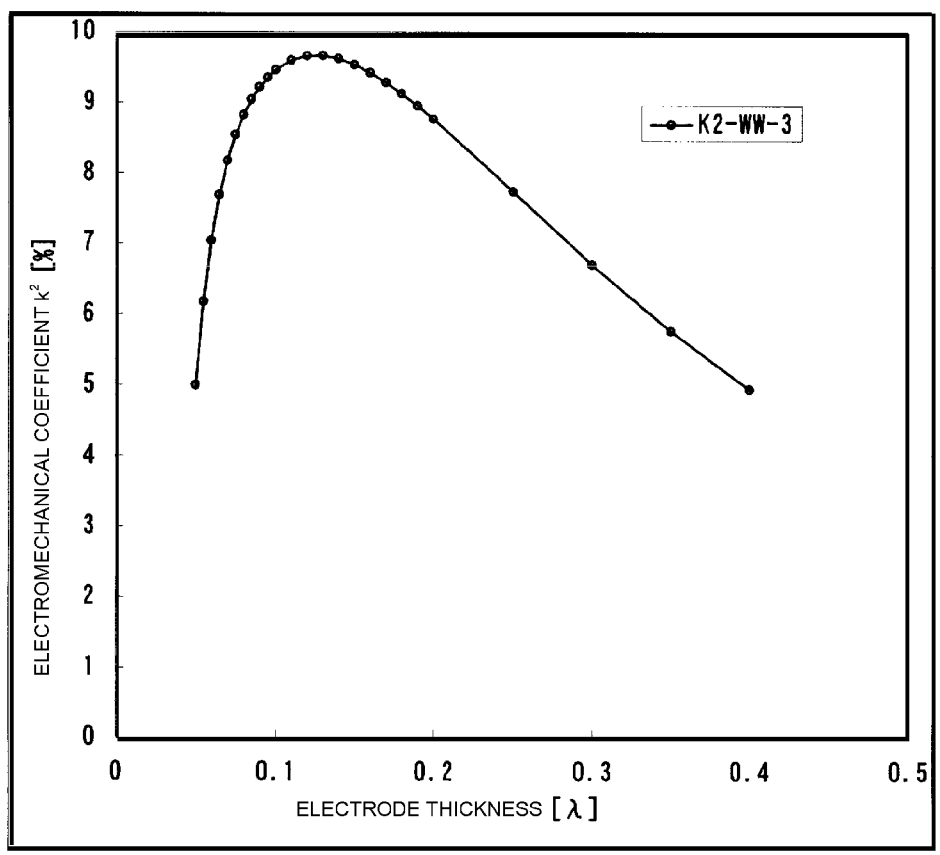
FIG. 107 is a graph showing the relationship between the electrode thickness and the electromechanical coefficient $k^2$ of a Stoneley wave in a boundary acoustic wave device formed in Example 3 in which the electrodes are formed from W.
Figure 108:
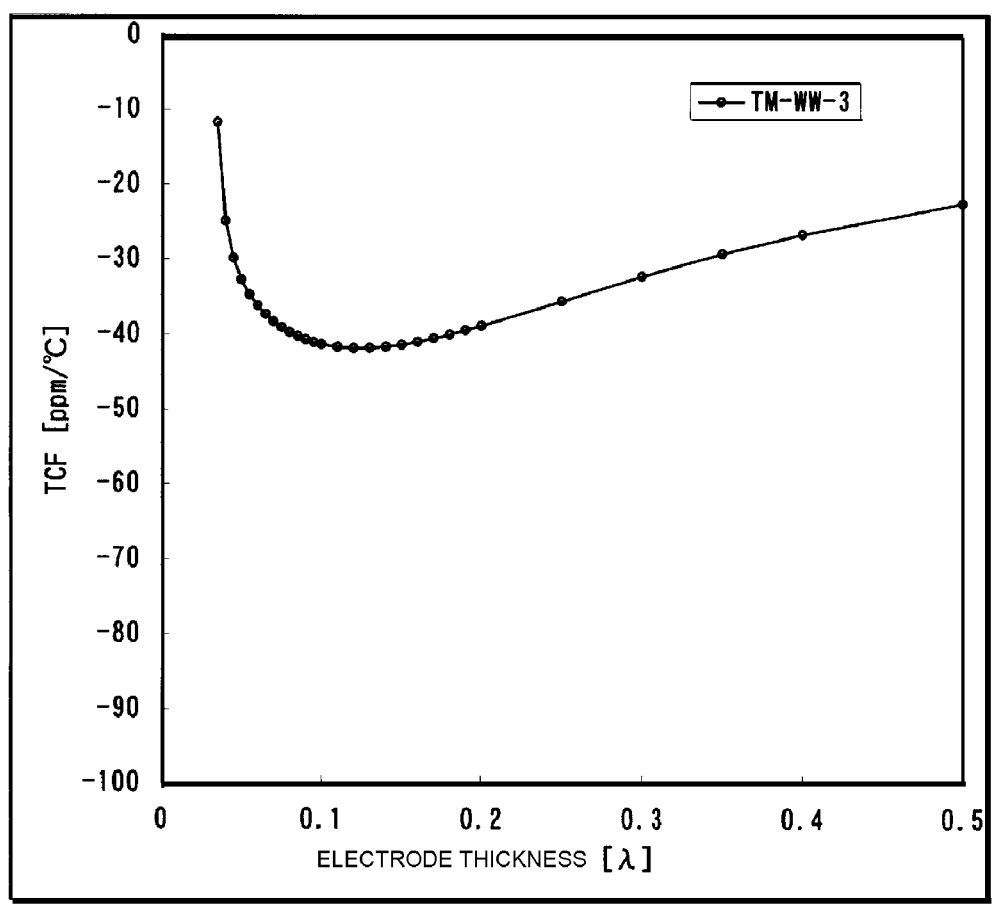
FIG. 108 is a graph showing the relationship between the electrode thickness and the temperature coefficient of frequency TCF of a Stoneley wave in a boundary acoustic wave device formed in Example 3 in which the electrodes are formed from W.
Figure 109:
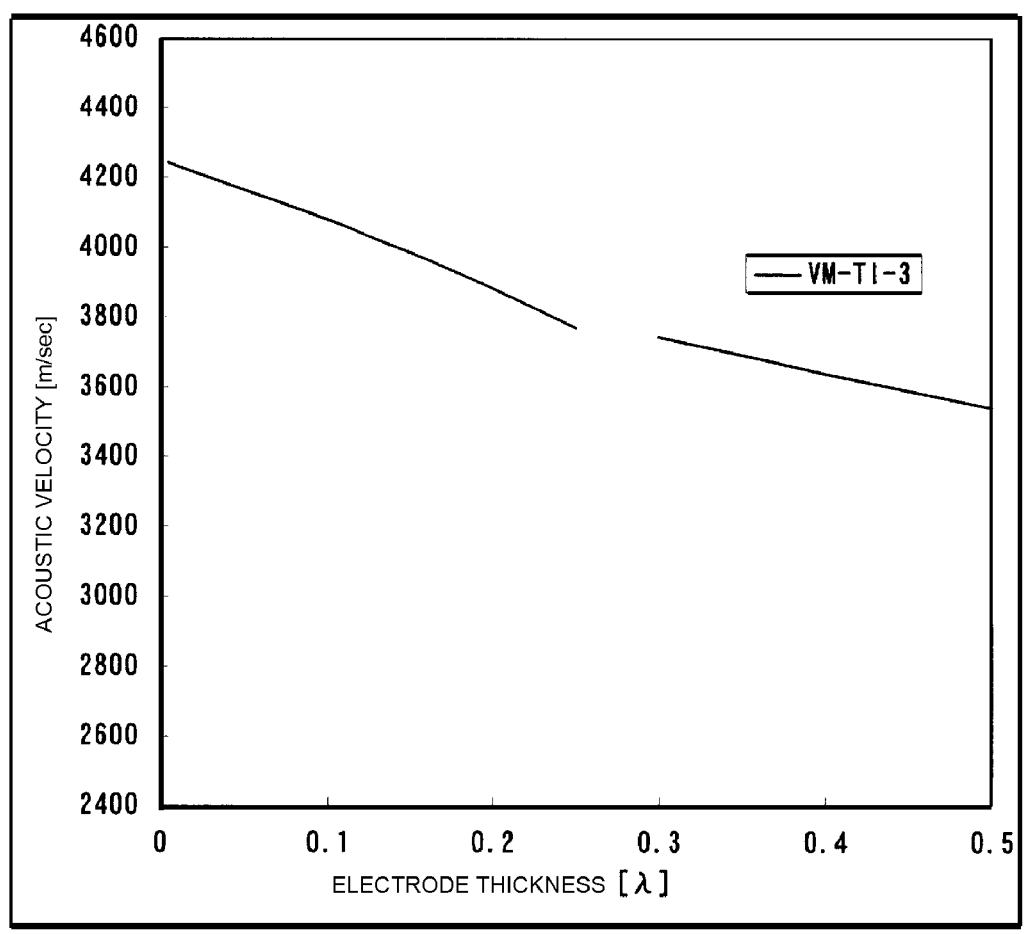
FIG. 109 is a graph showing the relationship between the electrode thickness and the acoustic velocity of a Stoneley wave in a boundary acoustic wave device formed in Example 3 in which the electrodes are formed from Ti.
Figure 110:
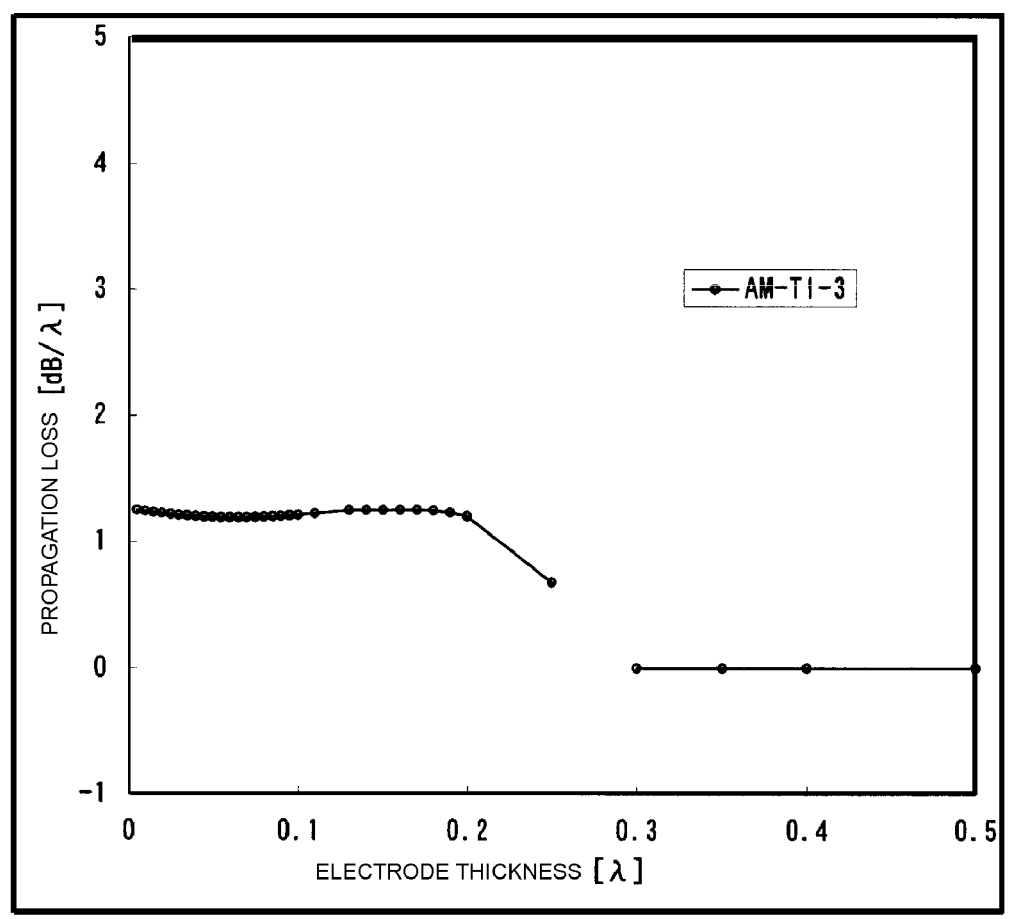
FIG. 110 is a graph showing the relationship between the electrode thickness and the propagation loss α of a Stoneley wave in a boundary acoustic wave device formed in Example 3 in which the electrodes are formed from Ti.
Figure 111:
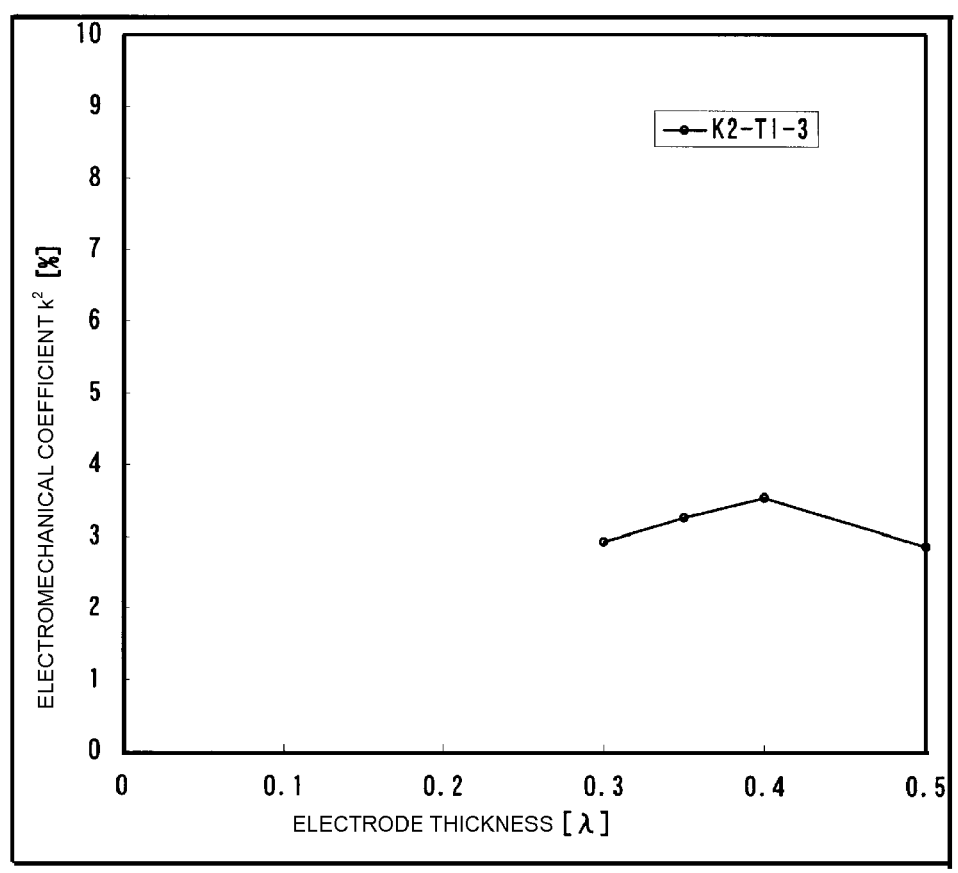
FIG. 111 is a graph showing the relationship between the electrode thickness and the electromechanical coefficient $k^2$ of a Stoneley wave in a boundary acoustic wave device formed in Example 3 in which the electrodes are formed from Ti.
Figure 112:
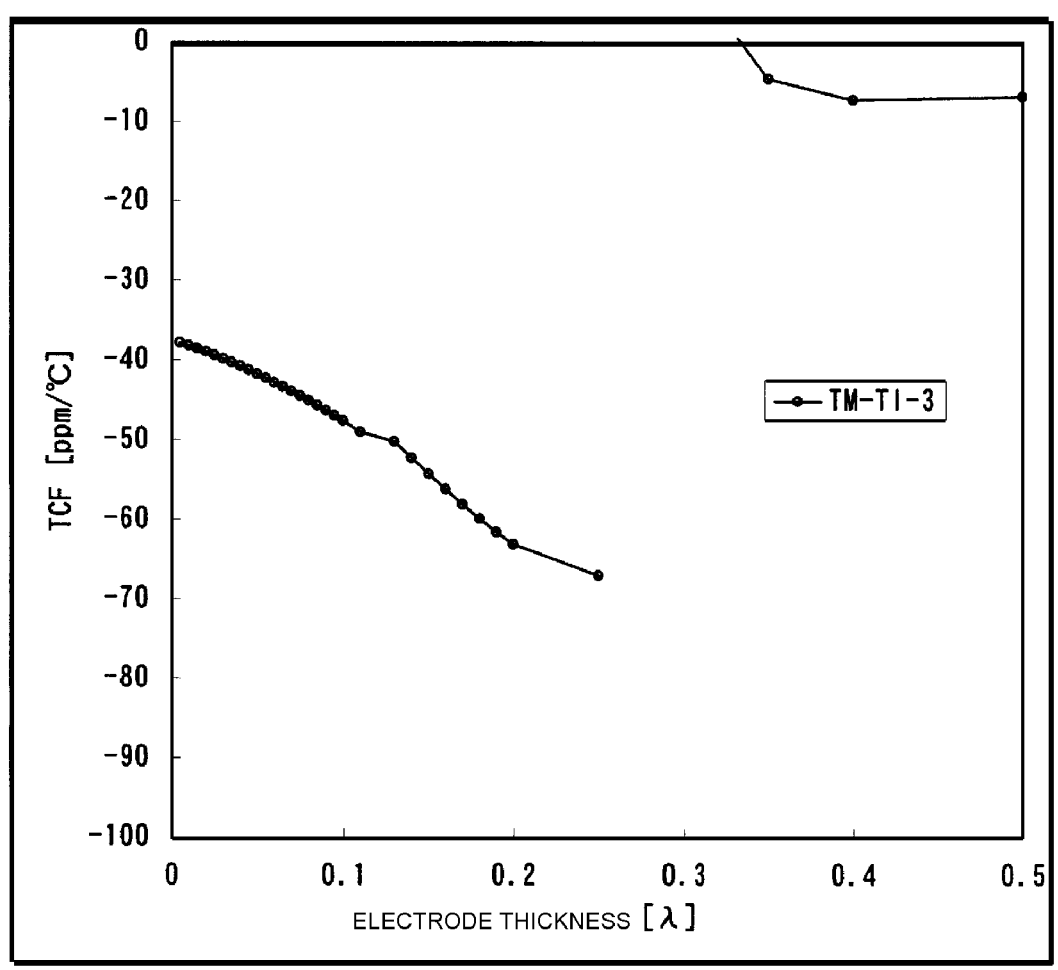
FIG. 112 is a graph showing the relationship between the electrode thickness and the temperature coefficient of frequency TCF of a Stoneley wave in a boundary acoustic wave device formed in Example 3 in which the electrodes are formed from Ti.
Figure 113:
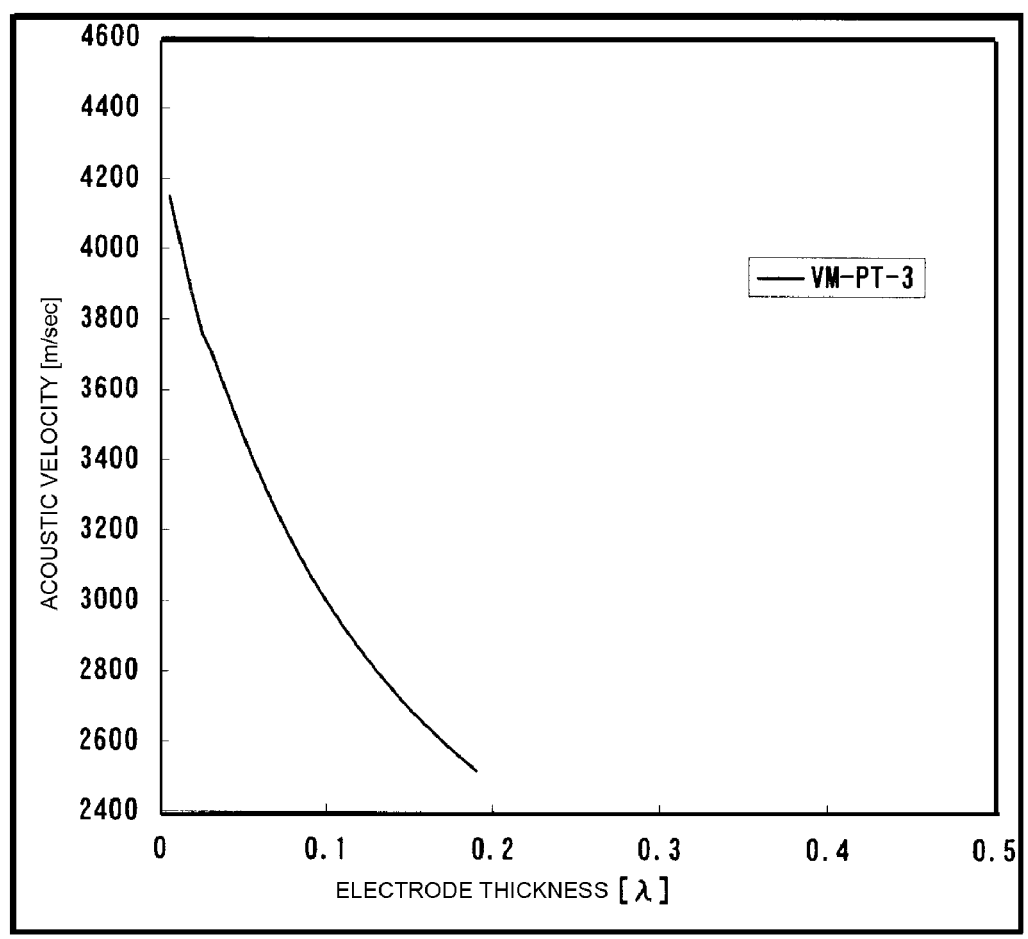
FIG. 113 is a graph showing the relationship between the electrode thickness and the acoustic velocity of a Stoneley wave in a boundary acoustic wave device formed in Example 3 in which the electrodes are formed from Pt.
Figure 114:
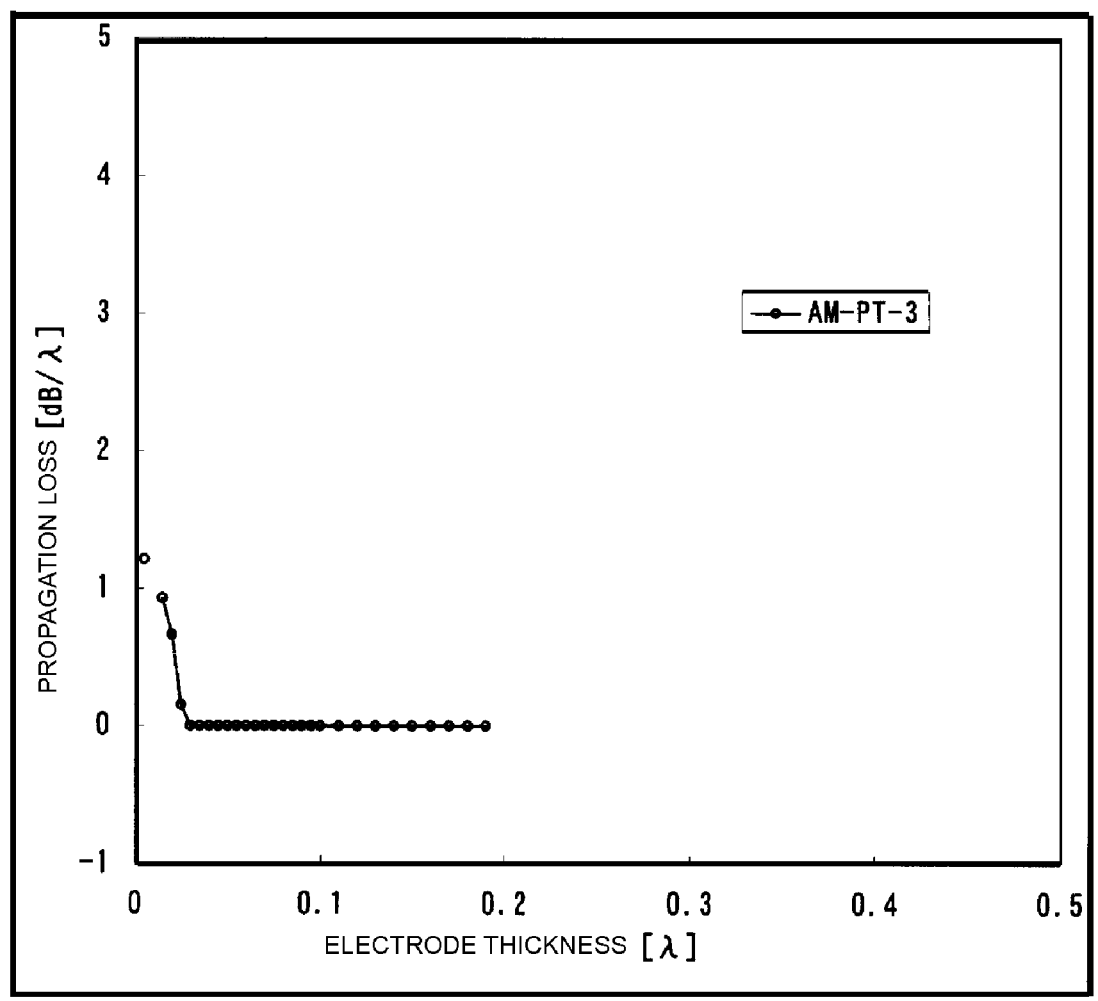
FIG. 114 is a graph showing the relationship between the electrode thickness and the propagation loss α of a Stoneley wave in a boundary acoustic wave device formed in Example 3 in which the electrodes are formed from Pt.
Figure 115:
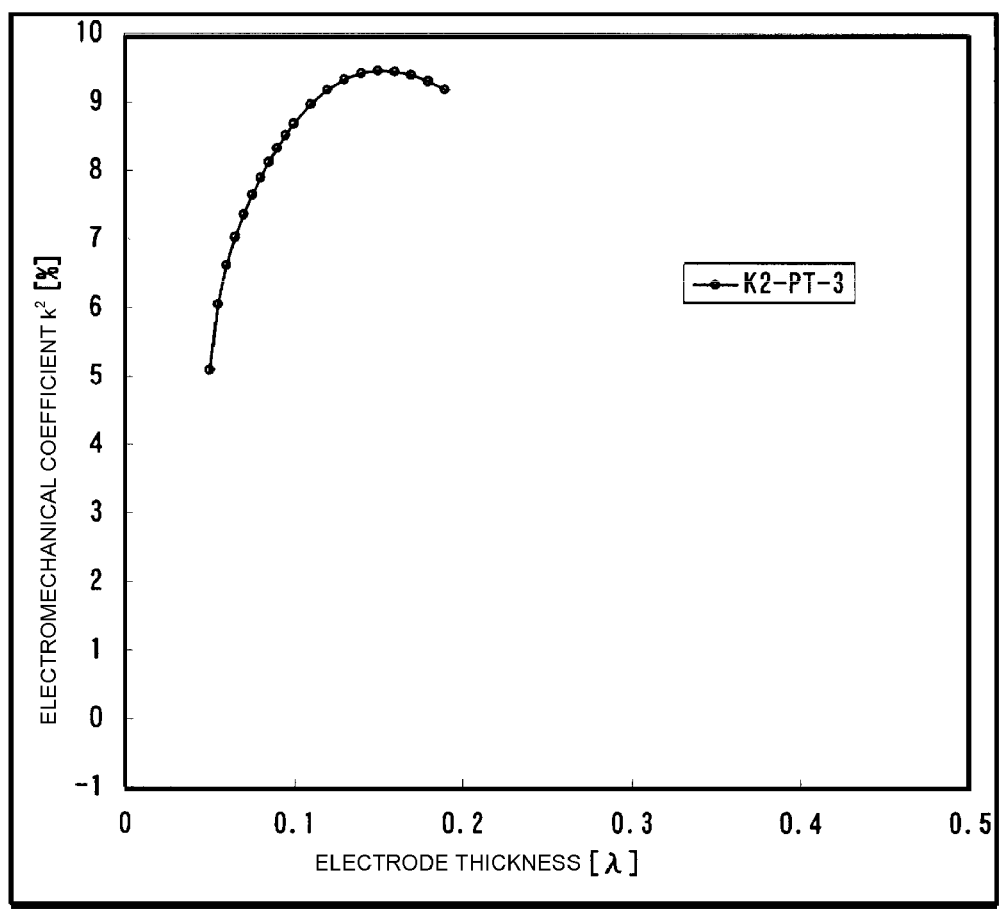
FIG. 115 is a graph showing the relationship between the electrode thickness and the electromechanical coefficient $k^2$ of a Stoneley wave in a boundary acoustic wave device formed in Example 3 in which the electrodes are formed from Pt.
Figure 116:
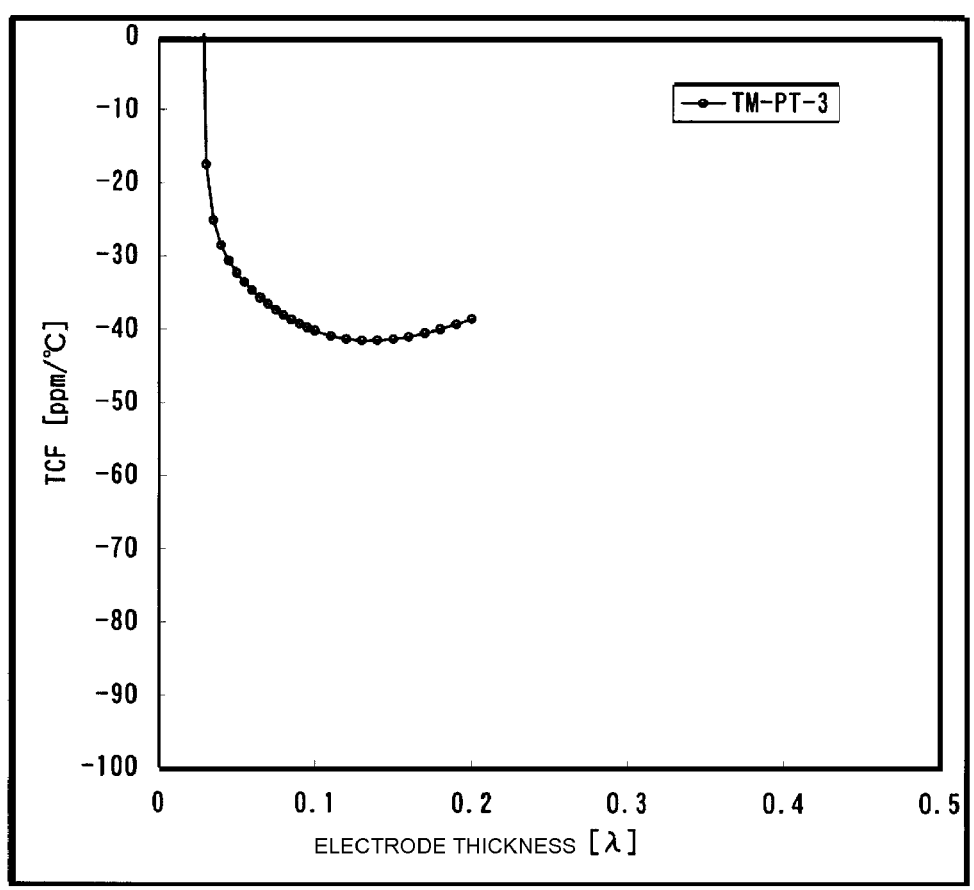
FIG. 116 is a graph showing the relationship between the electrode thickness and the temperature coefficient of frequency TCF of a Stoneley wave in a boundary acoustic wave device formed in Example 3 in which the electrodes are formed from Pt.

The results are shown in FIGS. 10 to 69.

In FIGS. 10 to 69, a value with a small letter m as a subscript indicates a calculated value at the short-circuit boundary at which the metal film is disposed between the SiO$_2$ film and the LiNbO$_3$ substrate, and a value with a small letter f as a subscript indicates a calculated value at the free boundary obtained based on the assumption that the relative dielectric constant of the metal film is 1. A value with U2 as a prefix is a calculated value of the SH boundary acoustic wave, and a value with U3 is a calculated value of the Stoneley wave.

When the Stoneley wave is used, the SH boundary acoustic wave causes a spurious response, and ripples are generated in a pass band, or the amount of out-of-band attenuation is degraded. When the electromechanical coefficient k$^2$ of the SH boundary acoustic wave is about 2% or less, the degradation in properties caused by spurious responses of the SH boundary acoustic wave is reduced, and the boundary acoustic wave device using a Stoneley wave can be used in a relatively wide application. In addition, when the electromechanical coefficient k$^2$ of the SH boundary acoustic wave is about 1% or less, the boundary acoustic wave device using a Stoneley wave can be provided which can be used in a wider application. More preferably, when the electromechanical coefficient k$^2$ of the SH boundary acoustic wave is about 0.1% or less, since the influence of spurious responses of the SH boundary acoustic wave is not substantially observed, the boundary acoustic wave device using a Stoneley wave according to a preferred embodiment of the present invention can be used for a filter which is required to have a large attenuation amount and for a highly precise resonator in which even a slight resonant spurious response is not allowed.

In FIGS. 10 to 69, Euler angles at which the electromechanical coefficient k$^2$ of the SH boundary acoustic wave is about 2% or less are preferably in the ranges of (0°, 0°, 0°) to (0°, 0°, 180°), (0°, 90°, 49°) to (0°, 90°, 131°), (90°, 0°, 0°) to (90°, 0°, 180°), (90°, 90°, 48°) to (0°, 90°, 131°), (0°, −32°, 0°) to (0°, 47°, 0°), (0°, 0°, 90°) to (0°, 180°, 90°), (90°, −39°, 0°) to (90°, 39°, 0°), (90°, 0°, 90°) to (90°, 180°, 90°), (0°, 0°, 0°) to (180°, 0°, 0°), (0°, 0°, 90°) to (180°, 0°, 90°), and (0°, 90°, 90°) to (180°, 90°, 90°). Euler angles at which the electromechanical coefficient k$^2$ of the SH boundary acoustic wave is about 1% or less are preferably in the ranges of (0°, 0°, 12.5°) to (0°, 0°, 47.5°), (0°, 0°, 62.5°) to (0°, 0°, 107.5°), (0°, 0°, 132.5°) to (0°, 0°, 167.5°), (0°, 90°, 56°) to (0°, 90°, 125°), (90°, 0°, −18°) to (90°, 0°, 18°), (90°, 0°, 42°) to (90°, 0°, 78°), (90°, 0°, 102°) to (90°, 0°, 138°), (90°, 0°, 162°) to (90°, 0°, 180°), (90°, 90°, 57°) to (90°, 90°, 127°), (0°, 13°, 0°) to (0°, 42°, 0°), (0°, 0°, 90°) to (0°, 180°, 90°), (90°, −32°, 0°) to (90°, 32°, 0°), (90°, 70°, 90°) to (90°, 110°, 90°), (12°, 0°, 0°) to (48°, 0°, 0°), (72°, 0°, 0°) to (107°, 0°, 0°), (132°, 0°, 0°) to (167°, 0°, 0°), (−18°, 0°, 90°) to (18°, 0°, 90°), (42°, 0°, 90°) to (78°, 0°, 90°), (102°, 0°, 90°) to (138°, 0°, 90°), and (0°, 90°, 90°) to (180°, 90°, 90°). Euler angles at which the electromechanical coefficient k$^2$ of the SH boundary acoustic wave is about 0.1% or less are preferably in the ranges of (0°, 0°, 26°) to (0°, 0°, 36°), (0°, 0°, 86°) to (0°, 0°, 96°), (0°, 0°, 146°) to (0°, 0°, 156°), (0°, 90°, 80°) to (0°, 90°, 111°), (90°, 90°, 110°) to (90°, 0°, 119°) (0°, 26°, 0°) to (0°, 34°, 0°), (0°, 0°, 90°) to (0°, 180°, 90°) (90°, −14°, 0°) to (90°, 14°, 0°), (26°, 0°, 0°) to (34°, 0°, 0°) (86°, 0°, 0°) to (94°, 0°, 0°), (146°, 0°, 0°) to (154°, 0°, 0°), (−6°, 0°, 90°) to (6°, 0°, 90°), (54°, 0°, 90°) to (66°, 0°, 90°) (114°, 0°, 90°) to (126°, 0°, 90°), (−7°, 90°, 90°) to (7°, 90°, 90°), (53°, 90°, 90°) to (67°, 90°, 90°), and (113°, 90°, 90°) to (127°, 90°, 90°).

When LiNbO$_3$ substrates in the above-noted Euler angle ranges are used, a boundary acoustic wave device using a Stoneley wave can also be provided which has a small spurious response or which will generate no spurious response.

Under all the conditions of the calculation results shown in FIGS. 10 to 69, propagation losses U3-αm and U3-αf of the Stoneley wave were zero, and hence superior propagation properties are obtained.

In addition, the acoustic velocity U3-Vm of the Stoneley wave concentrates at approximately 3,000 m/sec to approximately 3,400 m/sec, and thus, the change caused by the cut angle is small.

Accordingly, even when the cut angle is changed, an electrode thickness H at a propagation loss of zero can be obtained by equation (4) which will be described later.

In addition, the temperature coefficient of frequency U3-TCFm of the Stoneley wave is concentrated at approximately −30 to −40 ppm/° C., and the change caused by the cut angle is insignificant. Accordingly, even when the cut angle is changed, an electrode thickness H at which the temperature coefficient of frequency TCF is decreased can be determined by the equation (4).

EXAMPLE 3

A 120° rotated Y plate X-propagation LiNbO$_3$ substrate, that is, having Euler angles (0°, 30°, 0°), was prepared as the piezoelectric substance 2 using the calculation method described in Example 2, and taking into account easy thin film formation and a function of counteracting the TCF of LiNbO$_3$, a SiO$_2$ film was selected as the dielectric substance 3. By forming electrodes using electrode materials having various densities, boundary acoustic wave devices were formed. Subsequently, the relationships of the electrode thickness of each of the boundary acoustic wave devices thus formed with the acoustic velocity, the propagation loss α (dB/λ), the electromechanical coefficient k$^2$ (%), and the temperature coefficient of frequency TCF of the Stoneley wave were obtained. The results are shown in FIGS. 70 to 116. It is noted that the power flow angle PFA was zero under all the conditions.

In the 120° rotated Y plate X-propagation LiNbO$_3$ substrate, the acoustic velocity of a longitudinal wave, that of a slow transverse wave, and that of a fast transverse wave are approximately 6,547, 4,752, and 4,031 m/sec, respectively. In addition, the acoustic velocities of a longitudinal wave and a slow transverse wave of SiO$_2$ are approximately 5,960 and 3,757 m/sec, respectively. According to FIGS. 70 to 116, at an electrode thickness at which the acoustic velocity of the Stoneley wave is less than 3,757 m/sec, which is the lowest acoustic velocity mentioned above, the propagation loss α of the Stoneley wave is zero. That is, by merely using an electrode material having a large density, the propagation loss α of the Stoneley wave cannot be decreased to zero, and when the electrode thickness is increased so that the velocity of the Stoneley wave is decreased to less than approximately 3,757 m/sec, the propagation loss α is decreased to zero.

Thus, in various preferred embodiments of the present invention, the electrode thickness is preferably set so that the acoustic velocity of the Stoneley wave is decreased to less than the lowest acoustic velocity of those mentioned above, and accordingly, the propagation loss α of the Stoneley wave is decreased to zero.

Furthermore, in various preferred embodiments of the present invention, by using an electrode made of a material having a large density, the acoustic velocity of a transverse wave in the electrode is decreased, and as a result, the energy of the Stoneley wave is concentrated on the electrode. Thus, electric energy applied to the electrode and electric energy of the Stoneley wave are efficiently coupled to each other, and as a result, a large electromechanical coefficient $k^2$ is obtained. In addition, since the energy is concentrated on the electrode, the reflection coefficient of the Stoneley wave reflected by electrode fingers forming the electrode is also increased. When the reflection coefficient of the Stoneley wave by the electrode fingers is increased, the number of electrode fingers forming a grating reflector can be decreased. As a result, the size of the boundary acoustic wave device can be reduced. Furthermore, the reflection band of the reflector can also be increased.

When the reflection of electrode fingers of the IDT 4 is not present, the frequency characteristics of the conductance of the IDT 4 are represented by the symmetric sinc function. On the other hand, when the reflection of the electrode fingers is present, the frequency characteristics of the conductance become asymmetric, and the conductance at a low frequency side of the band or at a high frequency side thereof increases. As the reflection of the electrode fingers is increased, the asymmetry of the above-described frequency characteristics is increased.

By using an IDT having internal reflection as described above, for example, when an input side IDT and an output IDT are disposed in the propagation direction of a boundary acoustic wave, and when reflectors are disposed at two sides of the region in which the above-described IDTs are arranged so as to form a longitudinally coupled filter, a filter pass band is formed which reflects the asymmetry of the conductance characteristics. In this case, as the reflection coefficient of the electrode fingers is increased, a steep band region can be designed. As described above, when the reflection coefficient of the finger electrodes of the IDT is increased, steeper filter characteristics are easily obtained.

Figure 117:
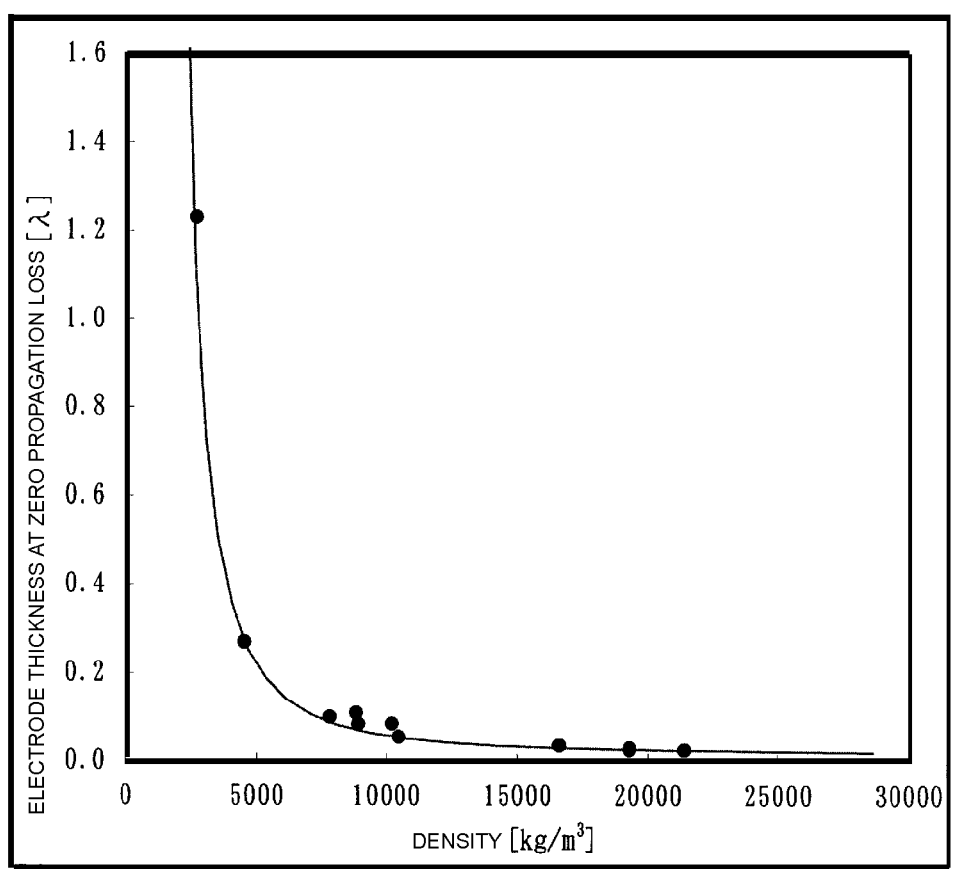
FIG. 117 is a graph showing the relationship between the density of electrodes and the thickness thereof at which the propagation loss α of a Stoneley wave is 0, the relationship being obtained when boundary acoustic wave devices are formed by variously changing the density of the electrodes in Example 3.
Figure 118:
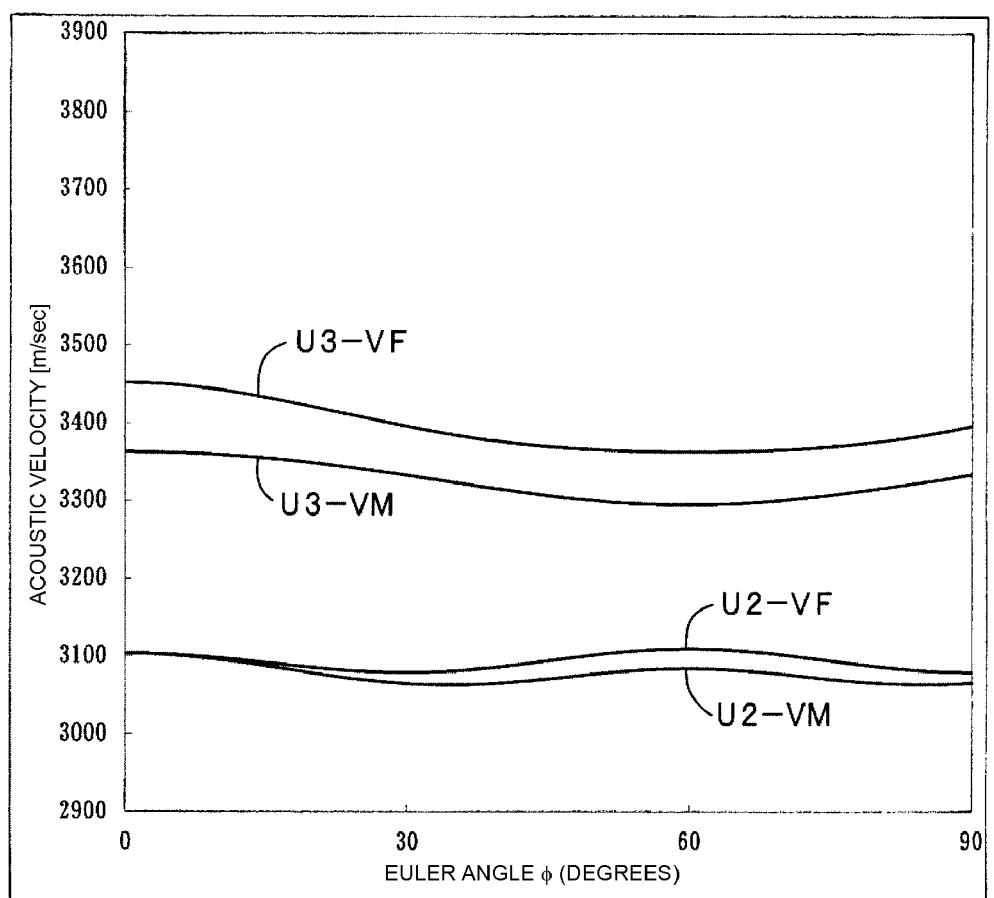
FIG. 118 is a graph showing the relationship between the acoustic velocity and an Euler angle φ in a boundary acoustic wave device formed in Example 4 in which Au electrodes and a $SiO_2$ film are formed on a $LiNbO_3$ substrate of Euler angles (φ, 30°, 0°).
Figure 119:
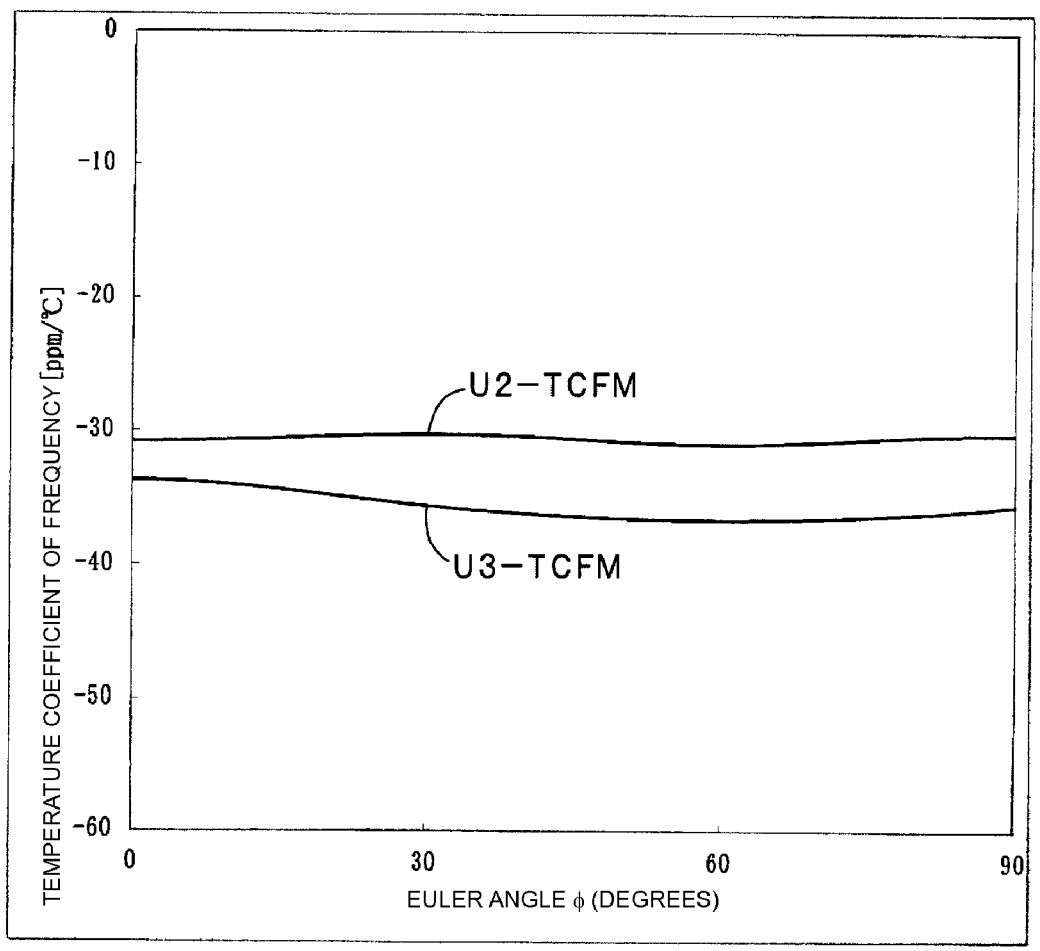
FIG. 119 is a graph showing the relationship between the temperature coefficient of frequency TCF and an Euler angle φ in a boundary acoustic wave device formed in Example 4 in which Au electrodes and a $SiO_2$ film are formed on a $LiNbO_3$ substrate of Euler angles (φ, 30°, 0°).
Figure 120:
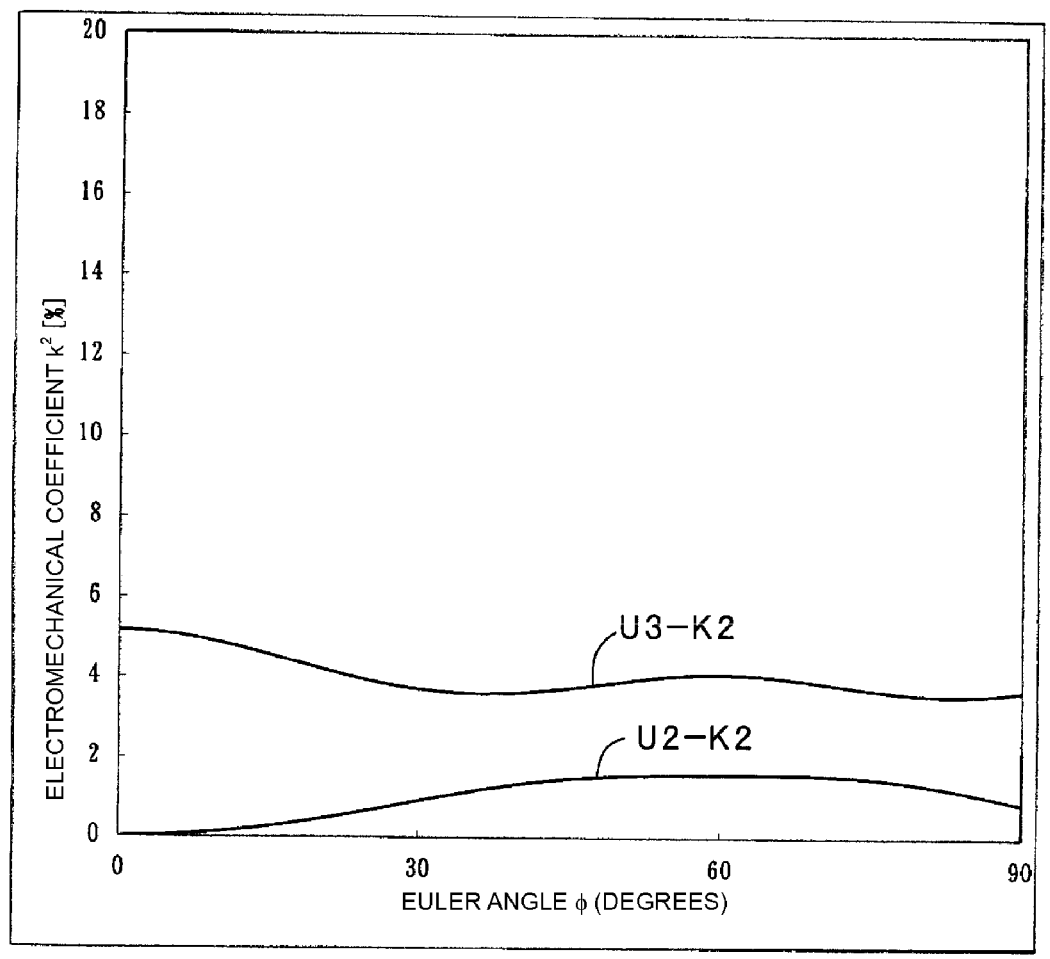
Figure 121:
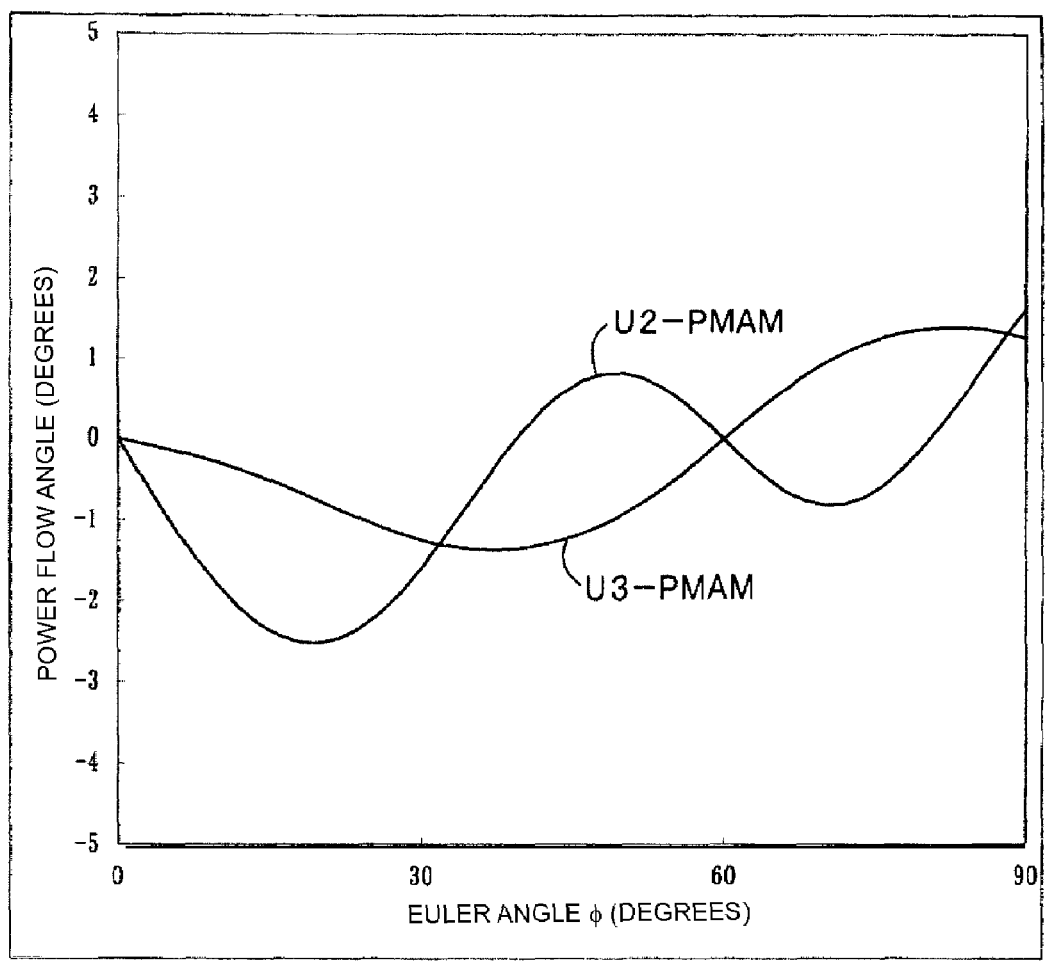
Figure 122:
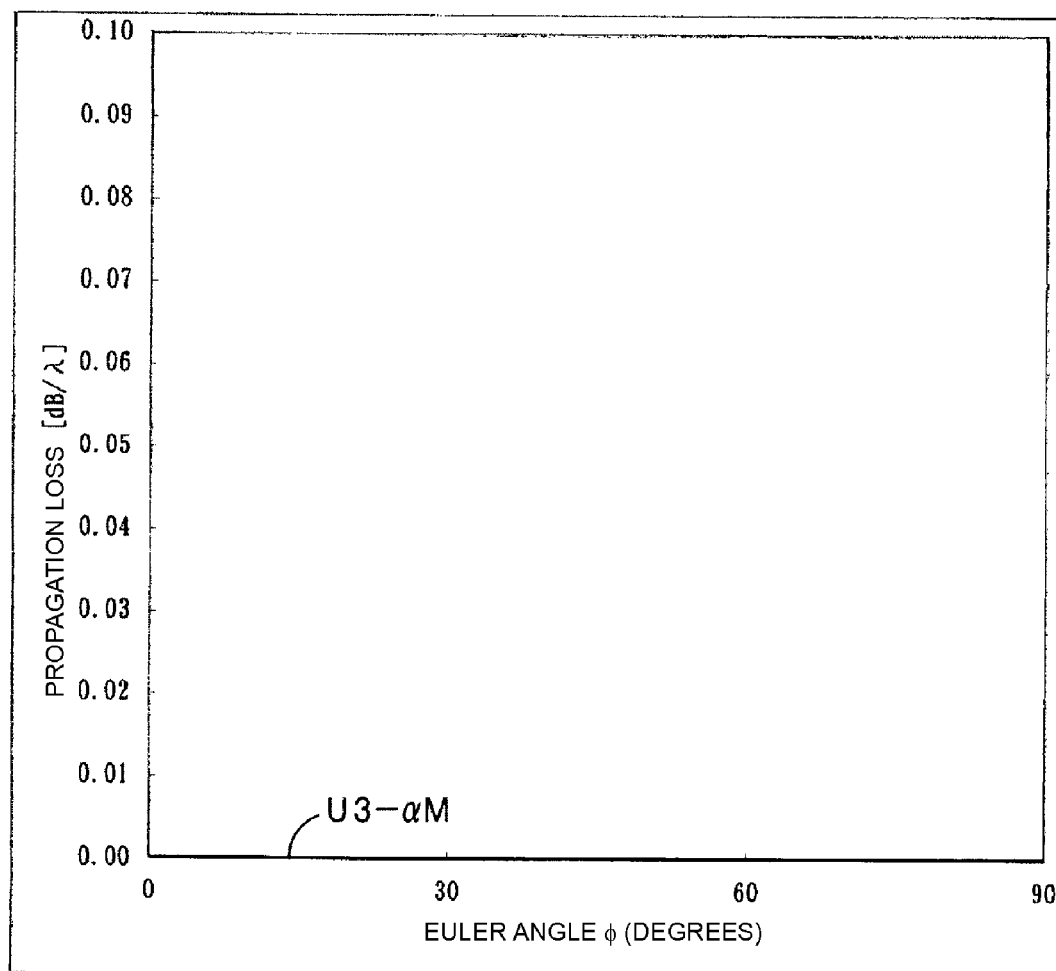
Figure 123:
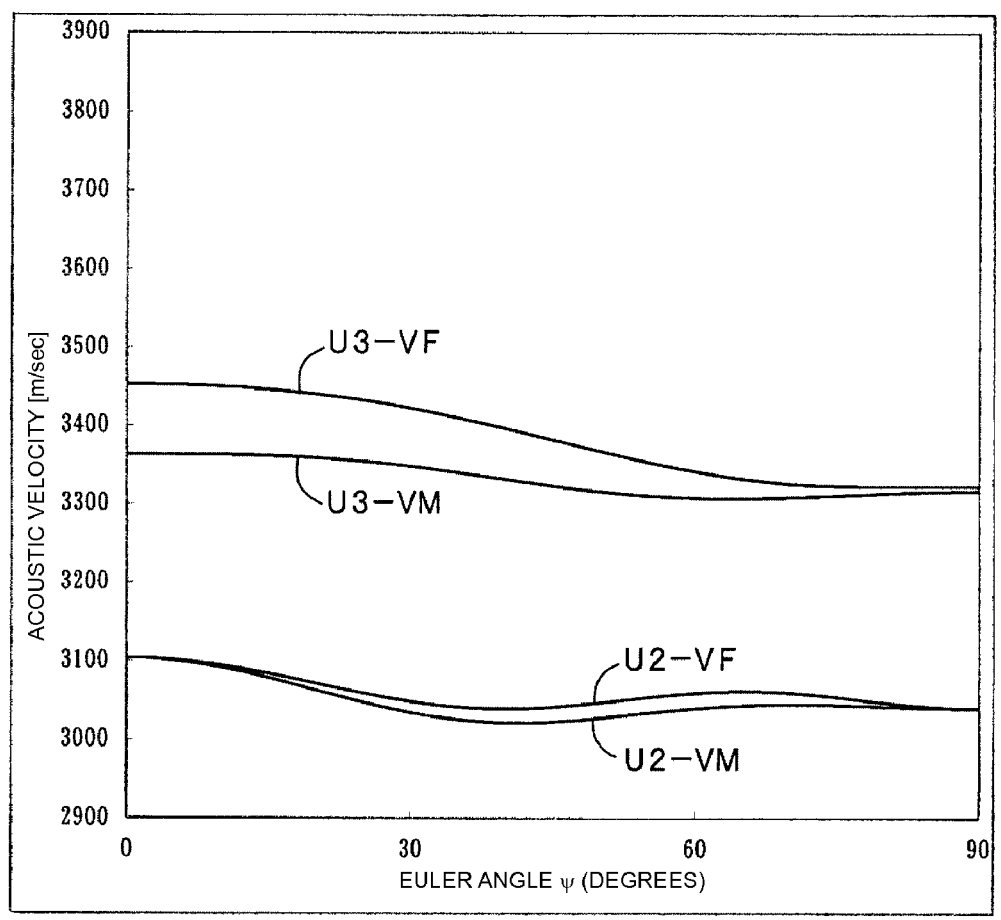
Figure 124:
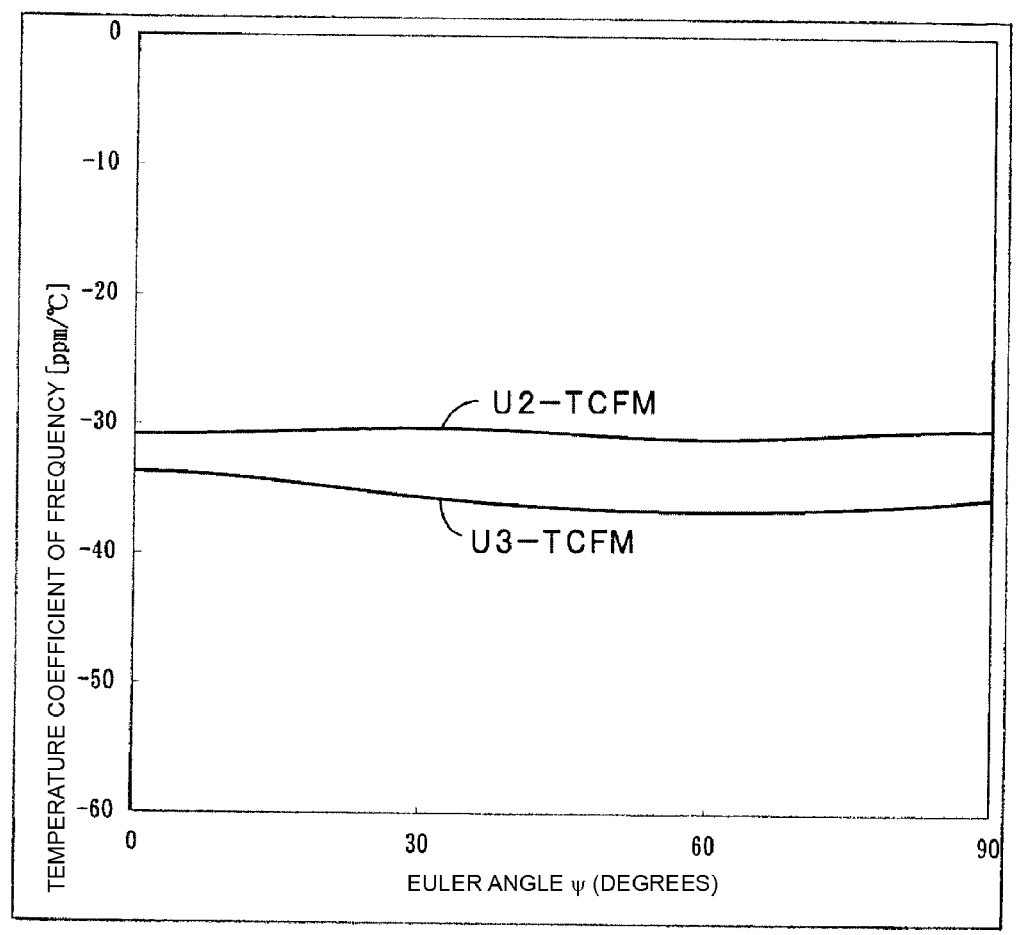
Figure 125:
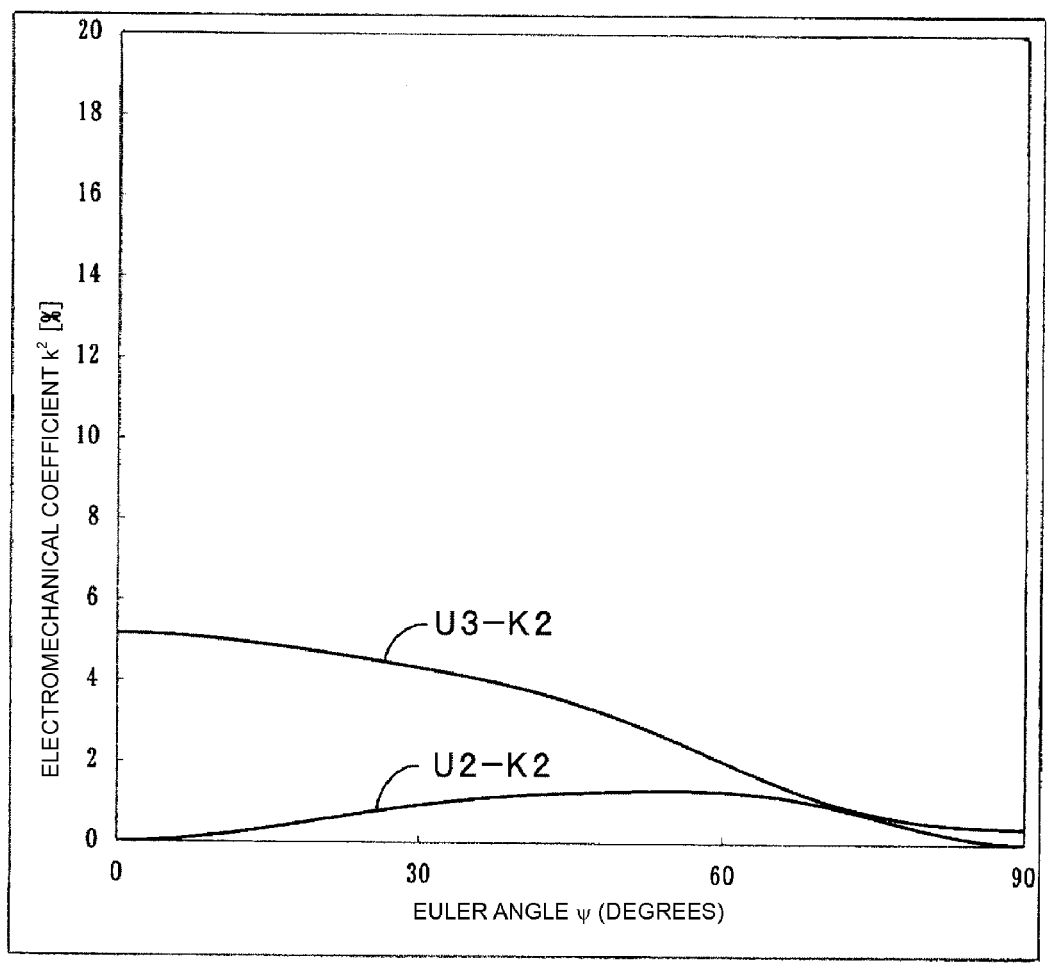
Figure 126:
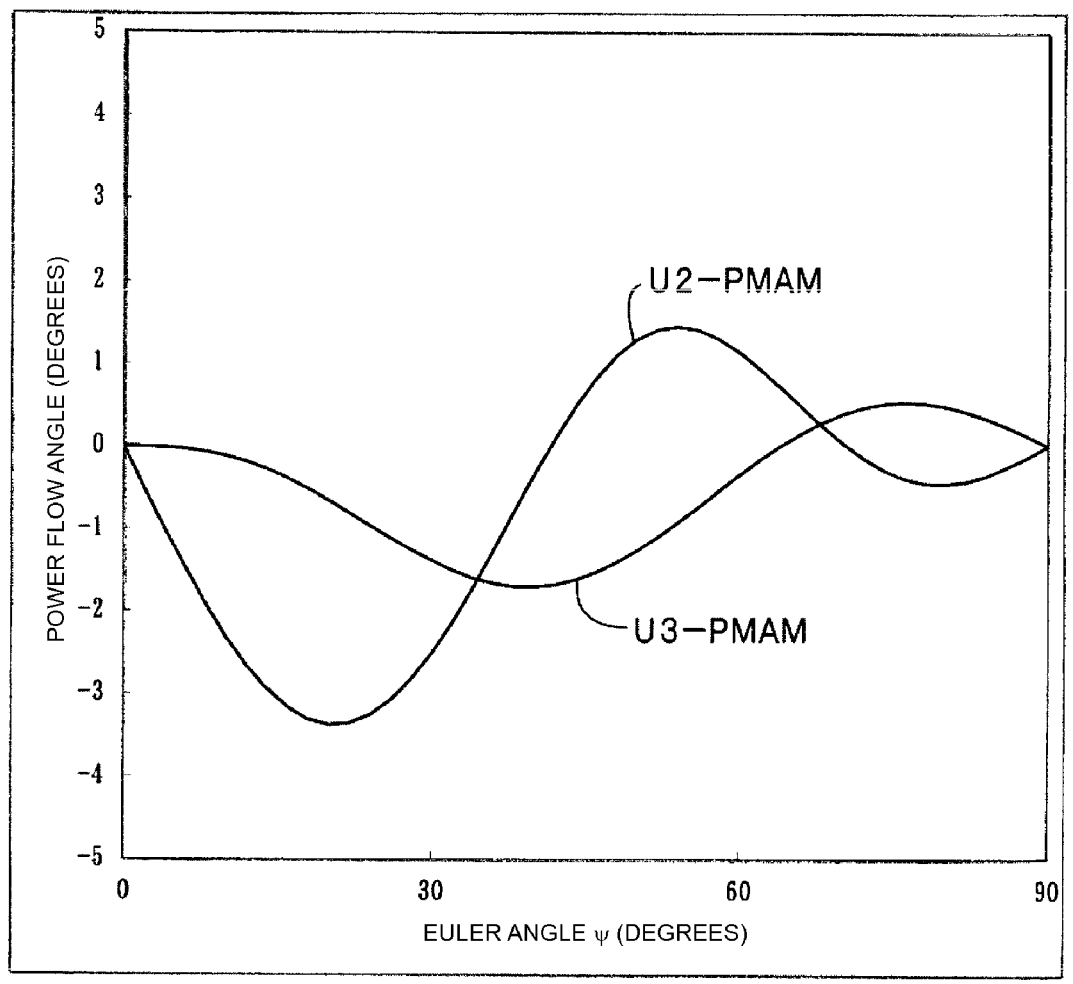
Figure 127:
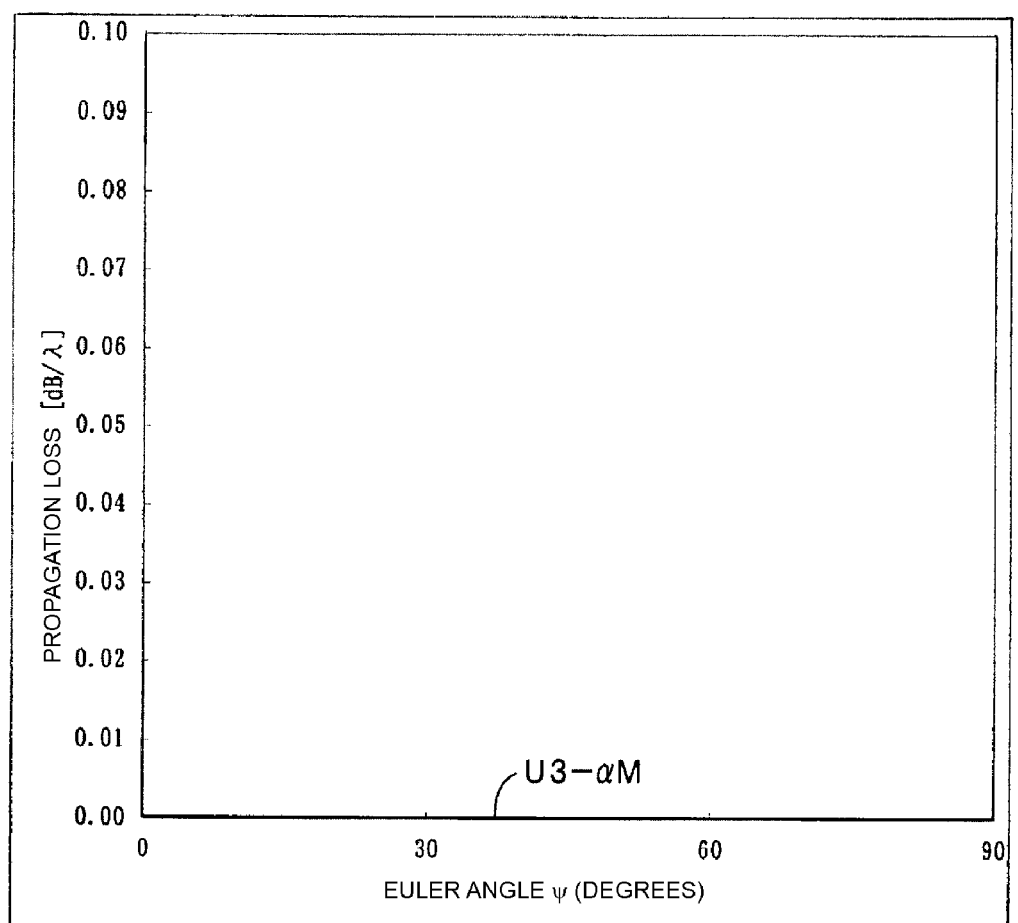

FIG. 117 is a graph showing the relationship between the density ρ of the electrode material and the electrode thickness H at which the propagation loss of the Stoneley wave is zero. In addition, in the following Table 3, the densities of various metals used as the electrode materials are shown.

TABLE 3

| Material | Density (kg/m³) |
|---|---|
| Al | 2699 |
| Ti | 4540 |
| Fe | 7830 |
| Ni | 8845 |
| Cu | 8930 |
| Mo | 10219 |
| Ag | 10500 |
| Ta | 16600 |
| Au | 19300 |
| W | 19300 |
| Pt | 21400 |

As shown in FIG. 117, when the thickness and the electrode material are determined so as to satisfy the following equation (4), the propagation loss of the Stoneley wave is decreased to zero.

$$H[\lambda] > 1/\{1/(3\times 19^7 \times \rho^{-2.22}+0.017)-0.4\} \qquad \text{Equation (4)}$$

In addition, when this type of boundary acoustic wave device is manufactured, electrodes, such as an IDT, are formed on a piezoelectric substrate, such as a LiNbO$_3$ substrate, by a photolithographic technique including lift-off or dry etching, and on the electrodes, a dielectric film made of SiO$_2$ or other suitable material is formed by a thin-film forming method including sputtering, evaporation, or CVD. Thus, irregularities are generated on the upper surface of the dielectric film due to the thickness of the IDT. In addition, the dielectric film may be obliquely grown or the film quality may become non-uniform in some cases. When the irregularities, the film growth in an oblique direction, or the non-uniformity of the film quality occurs, the properties of the boundary acoustic wave device are degraded.

In order to avoid the degradation of the properties described above, the thickness of the electrode is preferably small. According to research performed by the inventors of the present invention, when the thickness H of the electrode is at least about 0.1 λ, it becomes difficult to form a dielectric thin film having superior quality. In particular, when the electrode thickness is at least about 0.25 λ, the aspect ratio of the electrode becomes at least 1, and it also becomes difficult to form the electrode by using an inexpensive dry etching step or lift-off step. Furthermore, the methods and apparatuses used for dielectric thin-film formation are limited, and as a result, it is difficult to form a dielectric thin film by general RF magnetron sputtering. Therefore, the electrode thickness is preferably about 0.25λ or less, and more preferably about 0.1 λ or less.

As shown in FIG. 117, when an electrode material having a density ρ of about 4,711 kg/m or more is used, the electrode thickness H at which the propagation loss of the Stoneley wave becomes zero is decreased to about 0.25λ or less, and when an electrode material having a density ρ of about 7,316 kg/m or more is used, the electrode thickness H at which the propagation loss of the Stoneley wave becomes zero is decreased to about 0.10 λ or less. Hence, in the present invention, the density ρ of the electrode material is preferably about 4,711 kg/m or more, and more preferably about 7,316 kg/m or more.

In addition, as shown in FIGS. 72, 76, 80, 84, 88, 92, 96, 103, 107, 111, and 115, at the electrode thickness H at which the condition shown by the above equation (4) is satisfied, the electromechanical coefficient $k^2$ is sufficiently large, such as about 3% to about 9.4%. Thus, at the electrode thickness H at which the above equation (4) holds, a boundary acoustic wave device having a sufficient band width is provided.

In addition, as shown in FIGS. 73, 77, 81, 85, 89, 93, 97, 100, 104, 108, 112 and 116, at the electrode thickness H at which the above equation (4) is satisfied, the absolute values of TCFs of Ag, Au, Cu, Fe, Ta, W, Ti, and Pt is about 40 ppm or less. Thus, the electrode material is preferably at least one material selected from the group consisting of Ag, Au, Cu, Fe, Ta, W, Ti, and Pt since the temperature coefficient of frequency characteristics is improved.

EXAMPLE 4

Next, electrodes of Au having a thickness of about 0.06 λ were formed on respective LiNbO$_3$ substrates with Euler angles (φ, 30°, 0°) and Euler angles (0°, 30°, ψ), and SiO$_2$ films were formed over the respective electrodes. The relationships of the Euler angles θ and ψ with the acoustic velocities V, the electromechanical coefficients k$^2$, the propagation losses α, the temperature coefficients of frequency TCF, and the power flow angles (PFA) of the SH type boundary acoustic wave and the Stoneley wave were measured. The results are shown in FIGS. 118 to 122 and FIGS. 119 to 127. In FIGS. 118 to 127, U2 shows the results of the SH boundary acoustic wave, and U3 show the results of the Stoneley wave. In the entire ranges of Euler angles (0° to 90°, 30°, 0°) and (0°, 30°, 0° to 90°), the propagation loss α was 0 dB/λ.

As shown in FIGS. 118 to 122, the electromechanical coefficient k$^2$ of the SH boundary acoustic wave is small, such as about 0.3% or less, in the range of φ of about 0° to about 15°, and the electromechanical coefficient k$^2$ of the SH boundary acoustic wave is approximately 0% at φ of approximately 0°. Thus, the spurious response caused by the SH boundary acoustic wave is very small. In addition, in the range of φ of about 0° to about 90°, TCF is superior, such as in the range of about −37 ppm/° C. to about −33 ppm/° C., and the electromechanical coefficient k$^2$ of the Stoneley wave is sufficiently large, such as about 3.5% to about 5%. Thus, a boundary acoustic wave filter is provided which is preferably used as an RF filter in the narrow to the medium bands. In addition, in the range of φ of about 0° to about 90°, the power flow angle PFA of the Stoneley wave was small, such as about ±1.5° or less.

As shown in FIGS. 123 to 127, the electromechanical coefficient k$^2$ of the SH boundary acoustic wave is small, such as about 0.3% or less, in the range of ψ of about 0° to about 14°, and the electromechanical coefficient k$^2$ of the SH boundary acoustic wave becomes approximately 0% at ψ of 0°. Thus, the spurious response caused by the SH boundary acoustic wave is very small. In addition, in the range of ψ of 0° to 90°, TCF is superior, such as in the range of about −36 ppm/° C. to about −33 ppm/° C. In addition, in the range of ψ of about 0° to about 45°, the electromechanical coefficient k$^2$ of the Stoneley wave is sufficiently large, such as about 3.5% to about 5%, and thus, a boundary acoustic wave filter is provided which is preferably used as an RF filter in the narrow to the medium bands. In addition, in the range of ψ of about 0° to about 90°, the power flow angle of the Stoneley wave was small, such as about ±1.7° or less.

In preferred embodiments of the present invention, the thicknesses of the dielectric substance and the piezoelectric substance are not necessarily infinite as that of the model which was used for the calculation and may be enough when energy of a boundary acoustic wave is confined to near the electrodes provided at the boundary, that is, for example, a thickness of about 1 λ or more may be enough.

In addition, according to preferred embodiments of the present invention, the piezoelectric substance described above may be a piezoelectric film formed on a dielectric substance.

Furthermore, in the boundary acoustic wave device according to preferred embodiments of the present invention, in order to increase the strength or to prevent entry of corrosive gases, a protective layer may be formed outside of the boundary acoustic wave device in the lamination direction of the dielectric substance-electrodes-piezoelectric substance laminate structure. In this case, the boundary acoustic wave device of various preferred embodiments of the present invention may be sealed with a packaging material in some cases.

In addition, the protective layer described above may be formed from an insulating material such as titanium oxide, aluminum nitride, or aluminum oxide, a metal film such as Au, Al, or W, or a resin such as a urethane, epoxy, or silicone resin.

Besides Au, Ag, Cu, and Al, the electrodes may be formed from a conductive film made of a metal, such as Fe, Ni, W, Ta, Pt, Mo, Cr, Ti, ZnO, or ITO. In addition, in order to enhance the adhesion and electric power resistance, on an electrode layer formed from Au, Ag, Cu, Al, or an alloy thereof, a second electrode layer formed from another metal material, such as Ti, Cr, or a NiCr alloy may be laminated. In this case, the second electrode layer may be provided between the first electrode layer and the piezoelectric substance, between the first electrode layer and dielectric substance, or at both locations mentioned above.

Furthermore, in preferred embodiments of the present invention, the electrode may include a sheet-shaped electrode film which defines a waveguide or a bus bar, an IDT or comb-shaped electrode exciting a boundary acoustic wave, or a reflector reflecting a boundary acoustic wave.

In addition, in the specification of the present invention, as the Euler angles (φ, θ, ψ) representing the cut surface of a substrate and the propagation direction of a boundary acoustic wave, the right-hand Euler angle system is used which is disclosed in "Acoustic Wave Device Technology Handbook" (edited by Acoustic Wave Device Technology 150th Committee of the Japan Society for the Promotion of Science, first print/first edition issued on Nov. 30, 1991, p. 549). That is, with respect to crystal axes X, Y, and Z of LN, an Xa axis is obtained by φ rotation of the X axis about the Z axis in an anticlockwise direction. Next, a Z' axis is obtained by θ rotation of the Z axis about the Xa axis in an anticlockwise direction. A plane including the Xa axis and having the Z' axis as the normal line is set as the cut surface of a substrate. In addition, the direction of an X' axis obtained by ψ rotation of the Xa axis about the Z' axis in an anticlockwise direction is set as the propagation direction of a boundary acoustic wave.

In addition, as for the crystal axes X, Y, and Z of LiNbO$_3$ represented as the initial values of Euler angles, the Z axis is set parallel to the c-axis, the X axis is set parallel to any one of the three equivalent a-axes in three different directions, and the Y axis is set parallel to the normal line of a plane including the X axis and the Z axis.

In addition, Euler angles equivalent to the Euler angles (φ, θ, ψ) of LiNbO$_3$ of the present invention in terms of crystallography may be used. For example, according to "SAW Propagation Characteristics on LiTaO3 With Arbitrary Cut", Vol. 36, No. 3, 1980, pp. 140 to 145, since LiNbO$_3$ is a crystal belonging to the trigonal 3 m point group, the following equation (A) is satisfied.

$$F(\phi, \theta, \psi) = F(60° - \phi, -\theta, \psi) \qquad \text{Equation (A)}$$
$$= F(60° + \phi, -\theta, 180° - \psi)$$
$$= F(\phi, 180° + \theta, 180° - \psi)$$
$$= F(\phi, \theta, 180° + \psi)$$

In the above equation, F is an optional boundary acoustic-wave property such as the electromechanical coefficient k$^2$, propagation loss, TCF, PFA, or a natural unidirectional property. As for PFA and natural unidirectional property, for example, when the propagation direction is reversed, although a plus or a minus sign indicating the direction is changed, the absolute value of the property is not changed, and thus, it is assumed that they are substantially equivalent to each other. In addition, although the above-described document relates to the surface acoustic wave, even when the boundary acoustic wave is discussed, the symmetry of the crystal may also be dealt with in the same manner as disclosed in the above-described document. For example, propagation properties of a boundary acoustic wave at Euler angles (30°, θ, ψ) are equivalent to those at Euler angles (90°, 180°−θ, 180°−ψ). In addition, for example, propagation properties of a boundary acoustic wave at Euler angles (30°, 90°, 45°) are equivalent to those at Euler angles shown in Table 4 below.

In addition, the material constant of the electrode used for calculation in preferred embodiments of the present invention is the value of a polycrystalline substance. However, even in a crystal substance such as an epitaxial film, since the crystal orientation dependence of a substrate dominantly influences the boundary acoustic wave properties as compared to that of the film itself, in the case of the equivalent Euler angles represented by the equation (A), equivalent boundary acoustic wave propagation properties which may not cause any practical problems can be obtained.

TABLE 4

| φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |
| 330 | 90 | 315 |
| 330 | 270 | 45 |
| 330 | 270 | 225 |

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A boundary acoustic wave device using a Stoneley wave, comprising:
    a piezoelectric substance primarily composed of LiNbO$_3$;
    a dielectric substance disposed on one surface of the piezoelectric substance; and
    electrodes provided at a boundary between the piezoelectric substance and the dielectric substance; wherein
    Euler angles (φ, θ, ψ) of the piezoelectric substance primarily composed of LiNbO$_3$ are within ranges shown in the following table, and a Stoneley wave having an acoustic velocity of about 3,757 m/sec or less is used:

| φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |
| 330 | 90 | 315 |
| 330 | 270 | 45 |
| 330 | 270 | 225. |

2. The boundary acoustic wave device according to claim 1, wherein thicknesses of the electrodes are such that the acoustic velocity of the Stoneley wave is less than that of the slow transverse wave propagating through the dielectric substance and that of the slow transverse wave propagating through the piezoelectric substance.

3. The boundary acoustic wave device according to claim 1, wherein a duty ratio of strips defining the electrodes is such that the acoustic velocity of the Stoneley wave is less than that of a slow transverse wave propagating through the dielectric substance and that of a slow transverse wave propagating through the piezoelectric substance.

4. The boundary acoustic wave device according to claim 1, wherein the electrodes are each primarily composed of an electrode layer including at least one material selected from the group consisting of Ag, Au, Cu, Fe, Mo, Ni, Ta, W, Ti, and Pt.

* * * * *